United States Patent
Chen et al.

(10) Patent No.: US 10,553,599 B1
(45) Date of Patent: Feb. 4, 2020

(54) THREE-DIMENSIONAL MEMORY DEVICE CONTAINING DRAIN SELECT ISOLATION STRUCTURES AND ON-PITCH CHANNELS AND METHODS OF MAKING THE SAME WITHOUT AN ETCH STOP LAYER

(71) Applicant: SANDISK TECHNOLOGIES LLC, Addison, TX (US)

(72) Inventors: Zhen Chen, Yokkaichi (JP); Michiaki Sano, Ichinomiya (JP); Mitsuteru Mushiga, Kuwana (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/142,875

(22) Filed: Sep. 26, 2018

(51) Int. Cl.
| | |
|---|---|
| H01L 27/11556 | (2017.01) |
| H01L 27/11524 | (2017.01) |
| H01L 27/11519 | (2017.01) |
| H01L 27/1157 | (2017.01) |
| H01L 27/11582 | (2017.01) |
| H01L 21/768 | (2006.01) |
| H01L 27/11565 | (2017.01) |
| H01L 21/311 | (2006.01) |

(52) U.S. Cl.
CPC .. *H01L 27/11556* (2013.01); *H01L 21/76804* (2013.01); *H01L 27/1157* (2013.01); *H01L 27/11519* (2013.01); *H01L 27/11524* (2013.01); *H01L 27/11565* (2013.01); *H01L 27/11582* (2013.01); *H01L 21/31111* (2013.01)

(58) Field of Classification Search
CPC ......... H01L 27/11556; H01L 27/11519; H01L 27/11524; H01L 27/1157; H01L 27/11565; H01L 21/76804; H01L 27/11582; H01L 21/31111
See application file for complete search history.

(56) References Cited

U.S. PATENT DOCUMENTS

| | | | |
|---|---|---|---|
| 5,915,167 | A | 6/1999 | Leedy |
| 9,922,987 | B1 | 3/2018 | Mizutani et al. |
| (Continued) | | | |

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Anthony Ho
(74) *Attorney, Agent, or Firm* — The Marbury Law Group PLLC

(57) ABSTRACT

A three-dimensional memory device includes an alternating stack of insulating layers and electrically conductive layers located over a substrate, memory openings vertically extending through the alternating stack, and memory opening fill structures located in the memory openings and including a respective memory-level semiconductor channel and a respective memory film. Drain-select-level gate electrodes overlie the alternating stack. Drain-select-level pillar structures extend through a respective one of the drain-select-level gate electrodes. Each drain-select-level semiconductor channel is electrically connected to an underlying one of the memory-level semiconductor channels. A planar insulating spacer layer having a homogeneous composition throughout directly contacts top surfaces of the memory films and bottom surfaces of the drain-select-level gate electrodes.

12 Claims, 54 Drawing Sheets

(56) References Cited

U.S. PATENT DOCUMENTS

| | | |
|---|---|---|
| 9,972,640 B1 | 5/2018 | Kai et al. |
| 9,972,641 B1 | 5/2018 | Zhang et al. |
| 2018/0097009 A1 | 4/2018 | Zhang et al. |
| 2018/0138194 A1 | 5/2018 | Shigemura et al. |

OTHER PUBLICATIONS

U.S. Appl. No. 15/628,495, filed Jun. 20, 2017, SanDisk Technologies LLC.
U.S. Appl. No. 15/685,254, filed Aug. 24, 2017, SanDisk Technologies LLC.
U.S. Appl. No. 15/704,286, filed Sep. 14, 2017, SanDisk Technologies LLC.
U.S. Appl. No. 15/784,549, filed Oct. 16, 2017, SanDisk Technologies LLC.
U.S. Appl. No. 15/818,061, filed Nov. 20, 2017, SanDisk Technologies LLC.
U.S. Appl. No. 15/818,146, filed Nov. 20, 2017, SanDisk Technologies LLC.
U.S. Appl. No. 15/850,073, filed Dec. 21, 2017, SanDisk Technologies LLC.
U.S. Appl. No. 15/865,892, filed Jan. 9, 2018, SanDisk Technologies LLC.
U.S. Appl. No. 15/888,714, filed Feb. 5, 2018, SanDisk Technologies LLC.
U.S. Appl. No. 15/906,109, filed Feb. 27, 2018, SanDisk Technologies LLC.
U.S. Appl. No. 16/019,821, filed Jun. 27, 2018, SanDisk Technologies LLC.
U.S. Appl. No. 16/019,856, filed Jun. 27, 2018, SanDisk Technologies LLC.
U.S. Appl. No. 16/023,289, filed Jun. 29, 2018, SanDisk Technologies LLC.
U.S. Appl. No. 16/023,866, filed Jun. 29, 2018, SanDisk Technologies LLC.
U.S. Appl. No. 16/024,048, filed Jun. 29, 2018, SanDisk Technologies LLC.

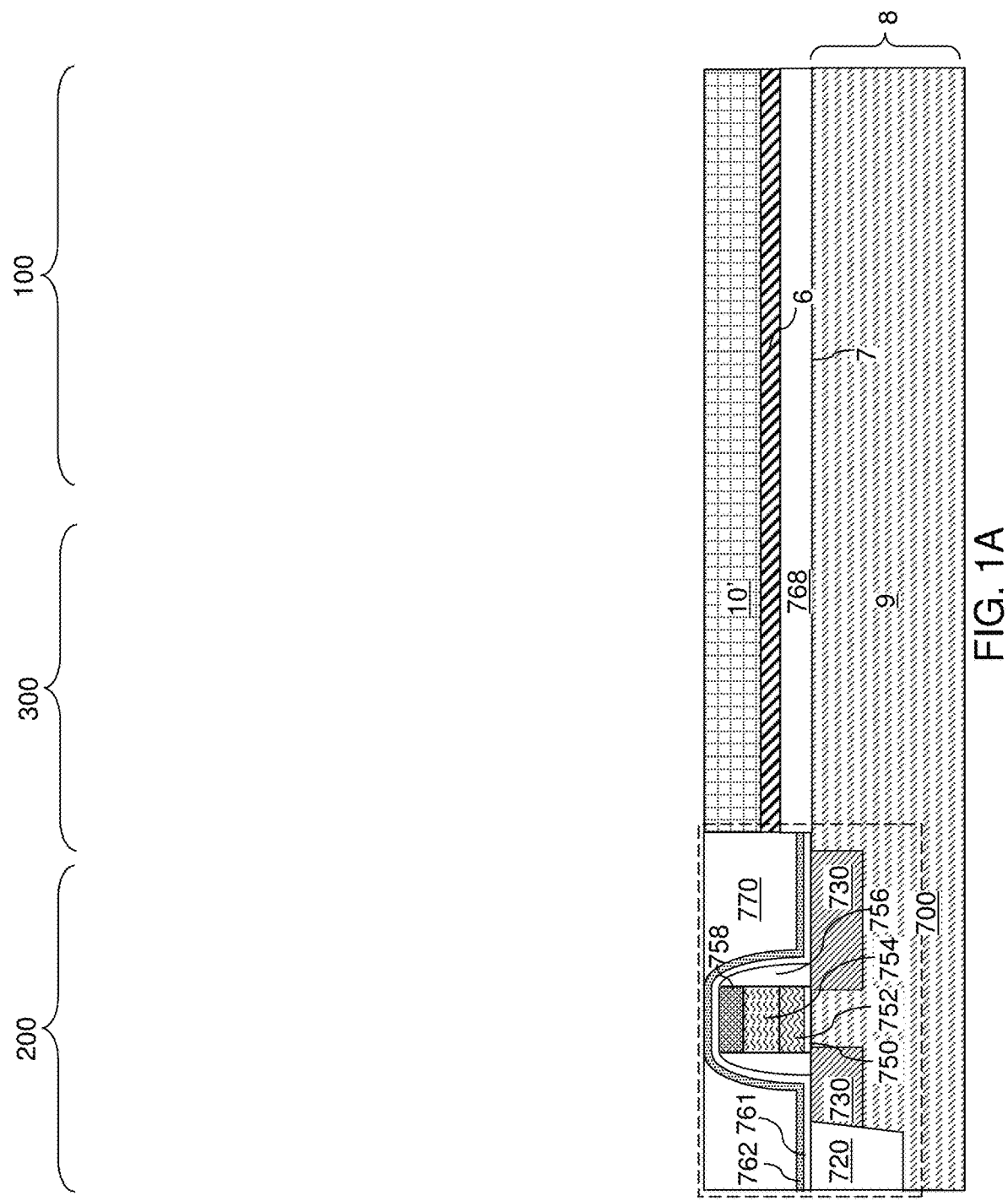

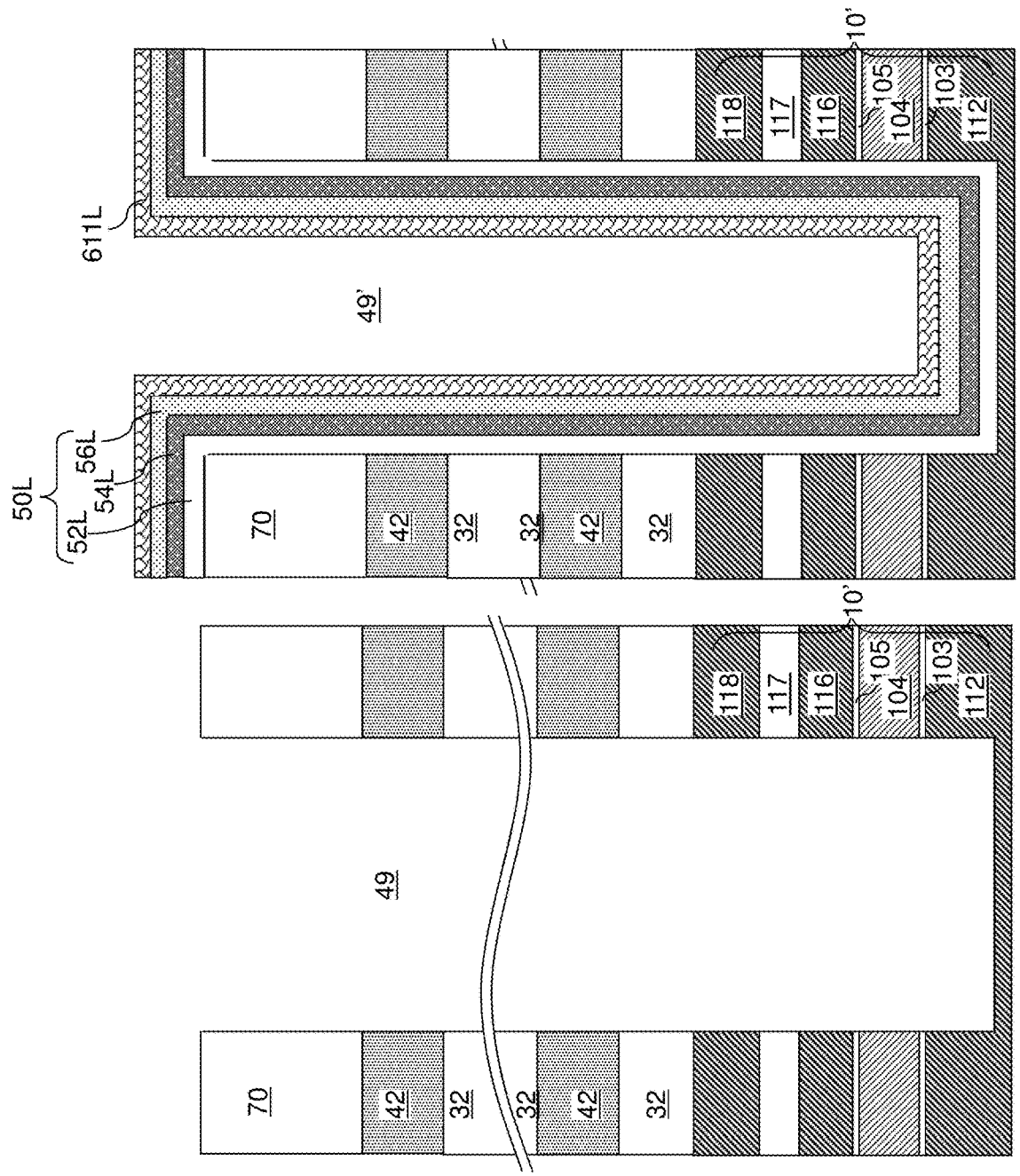

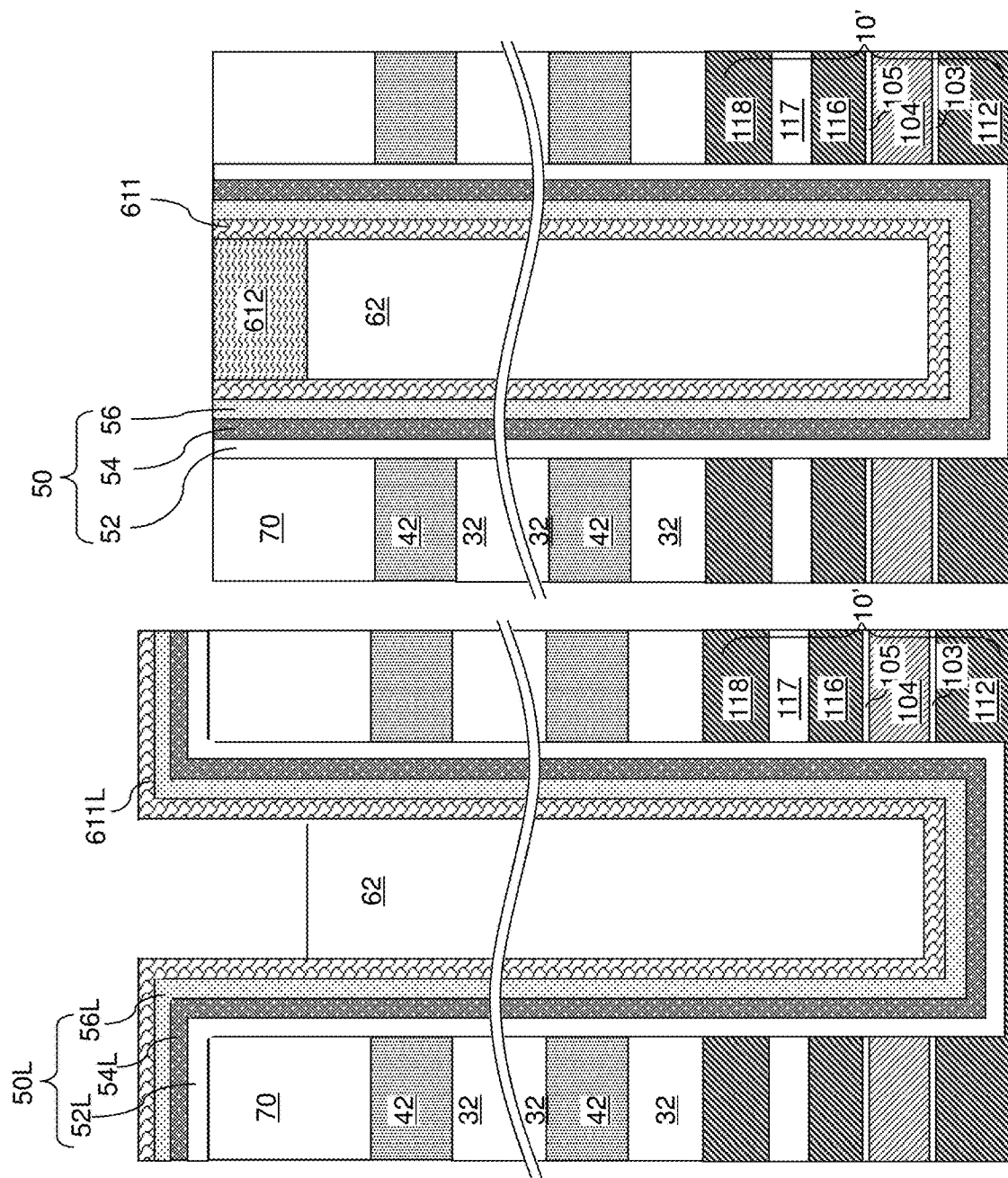

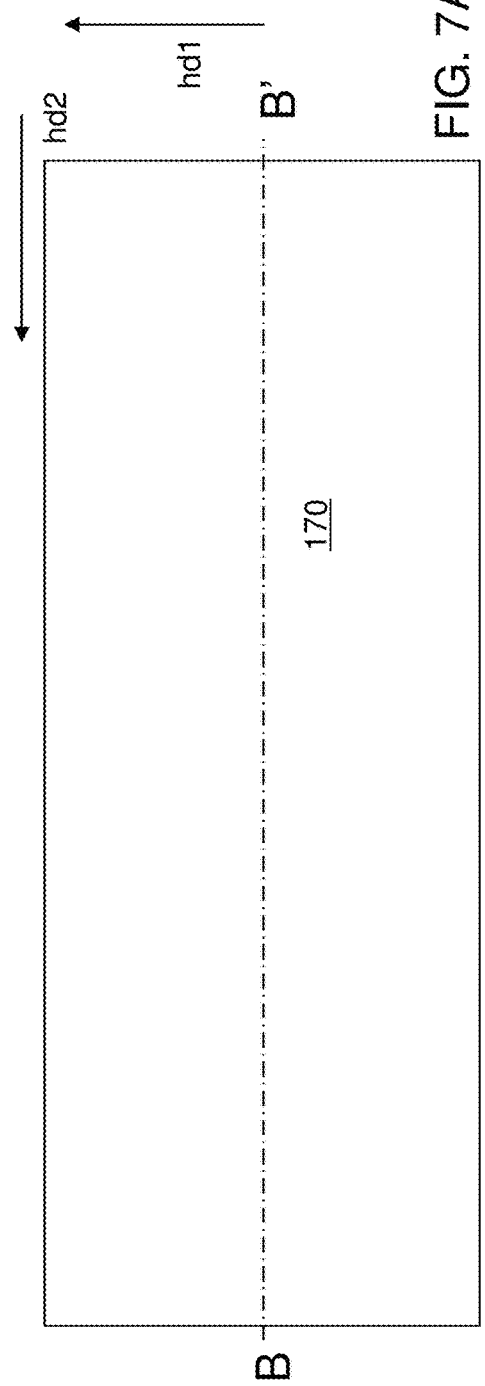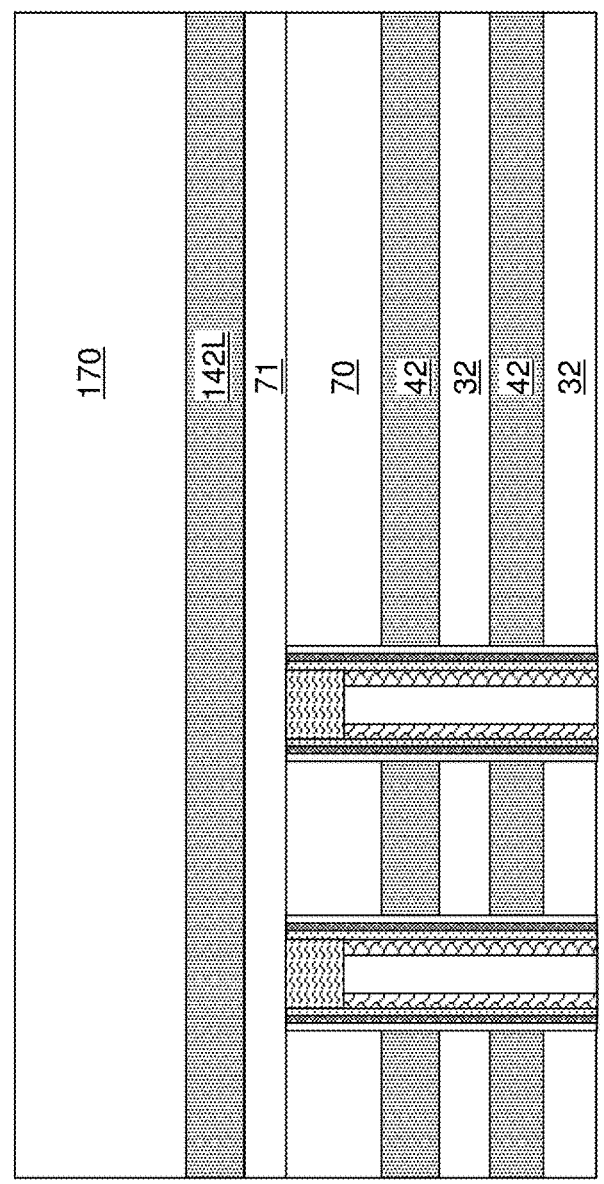

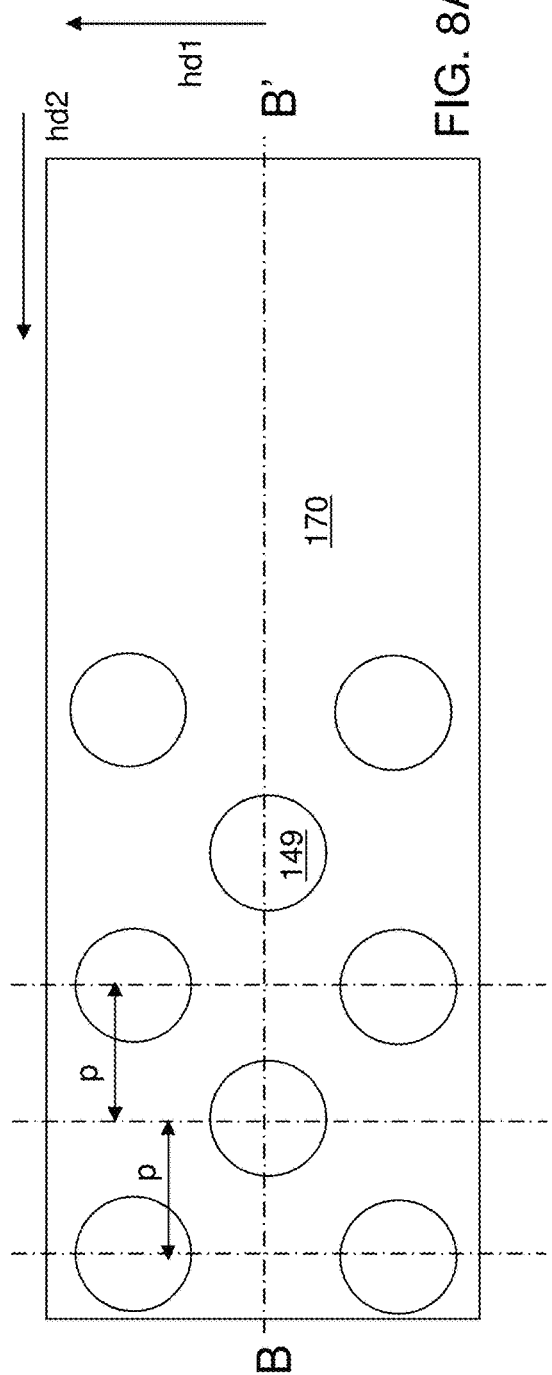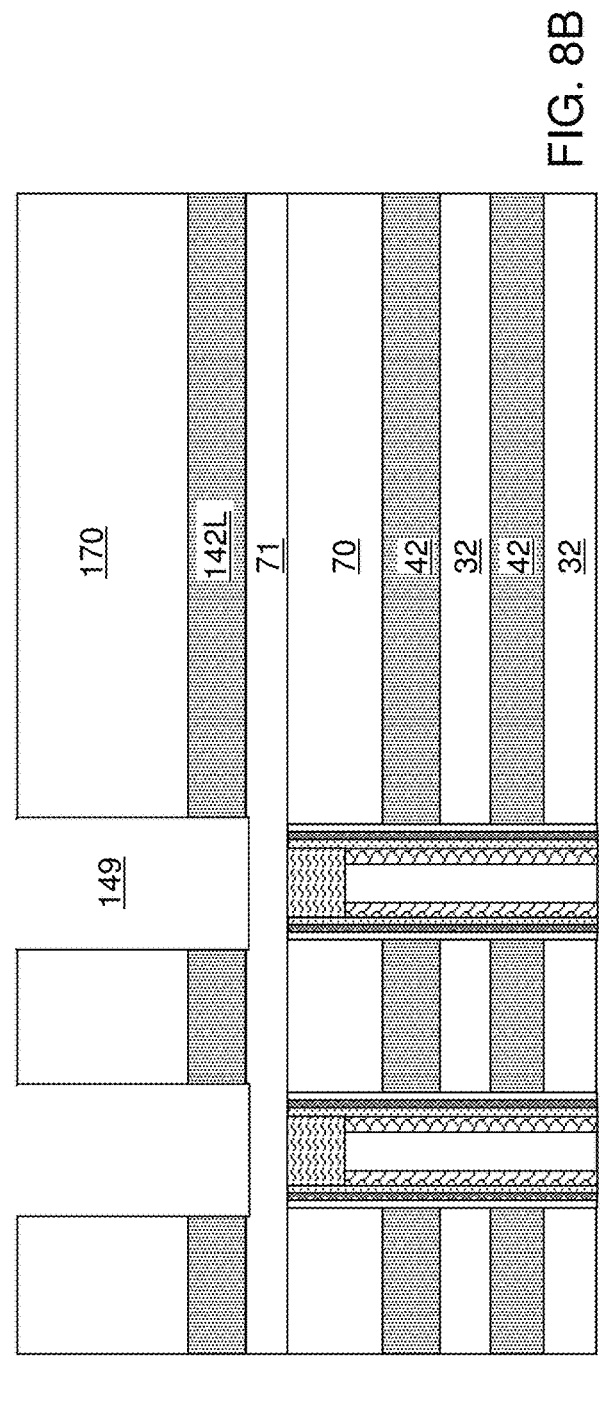

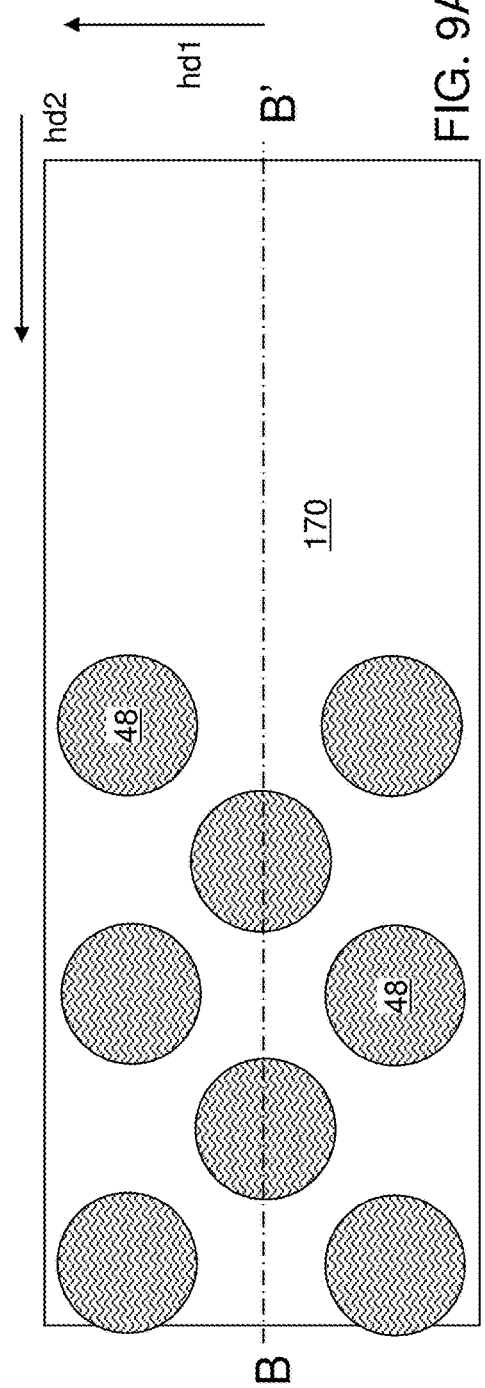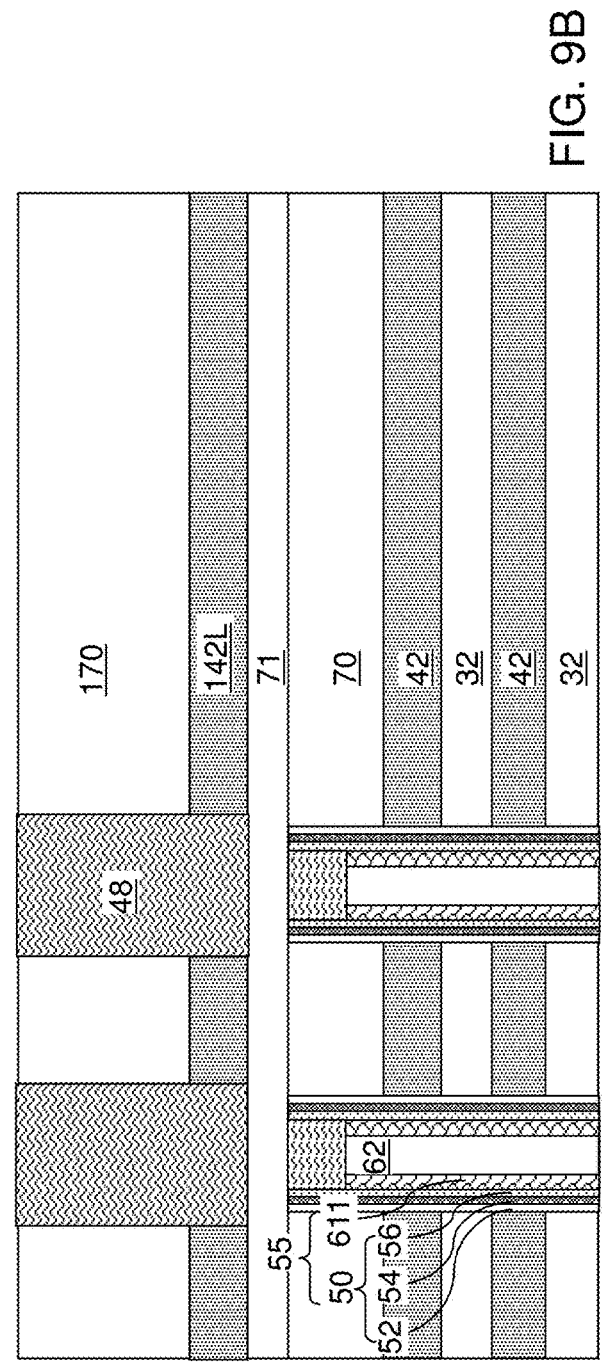

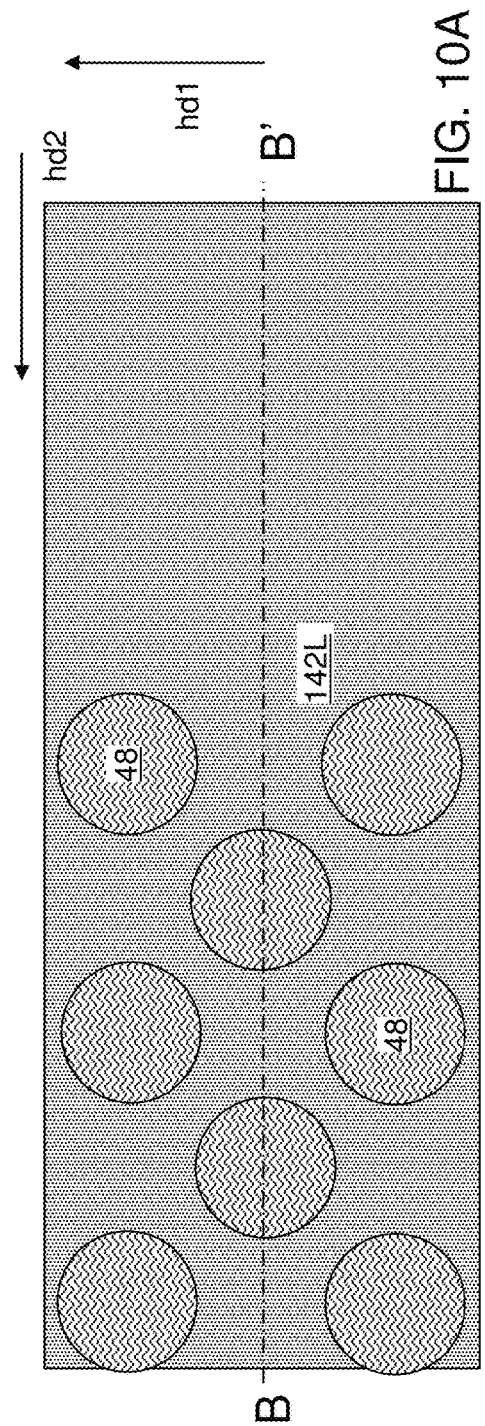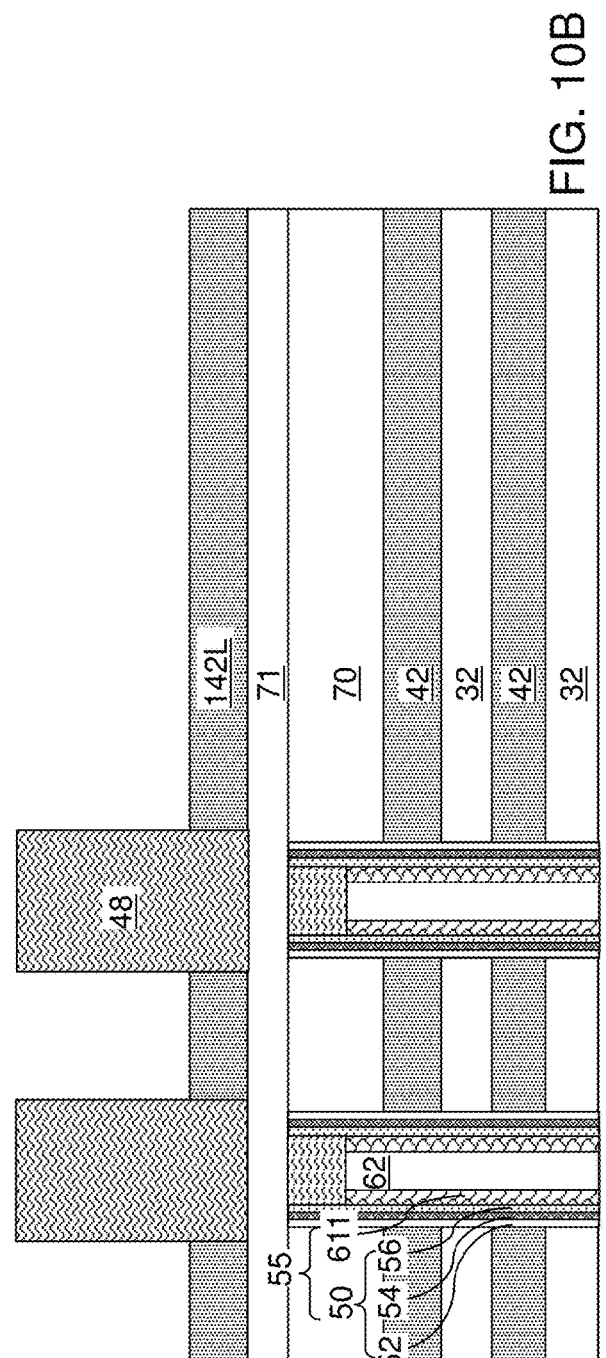

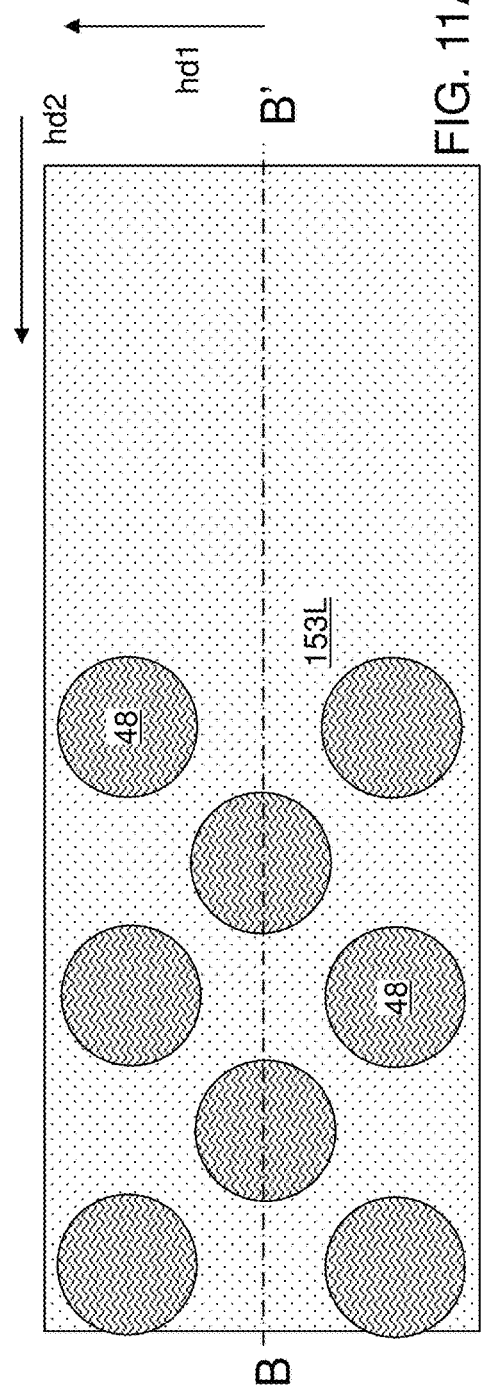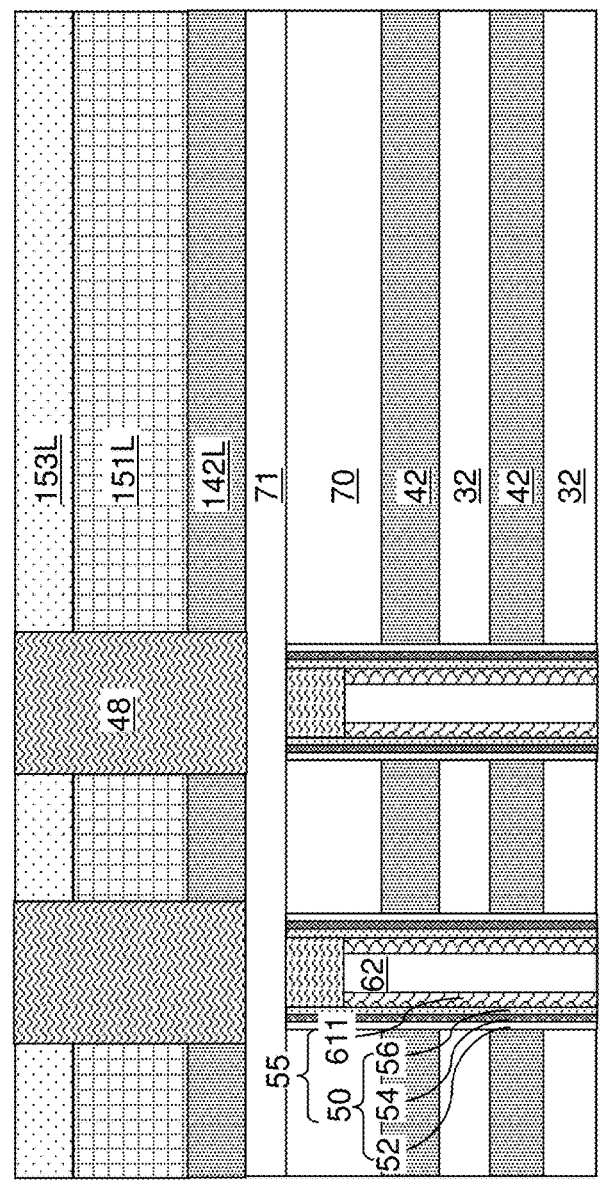

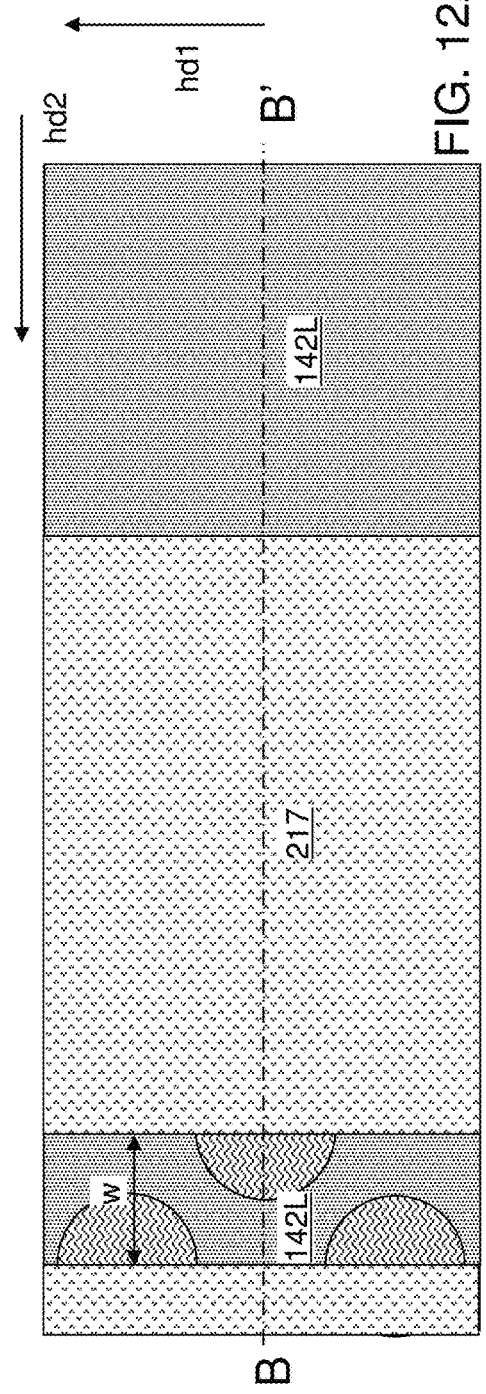
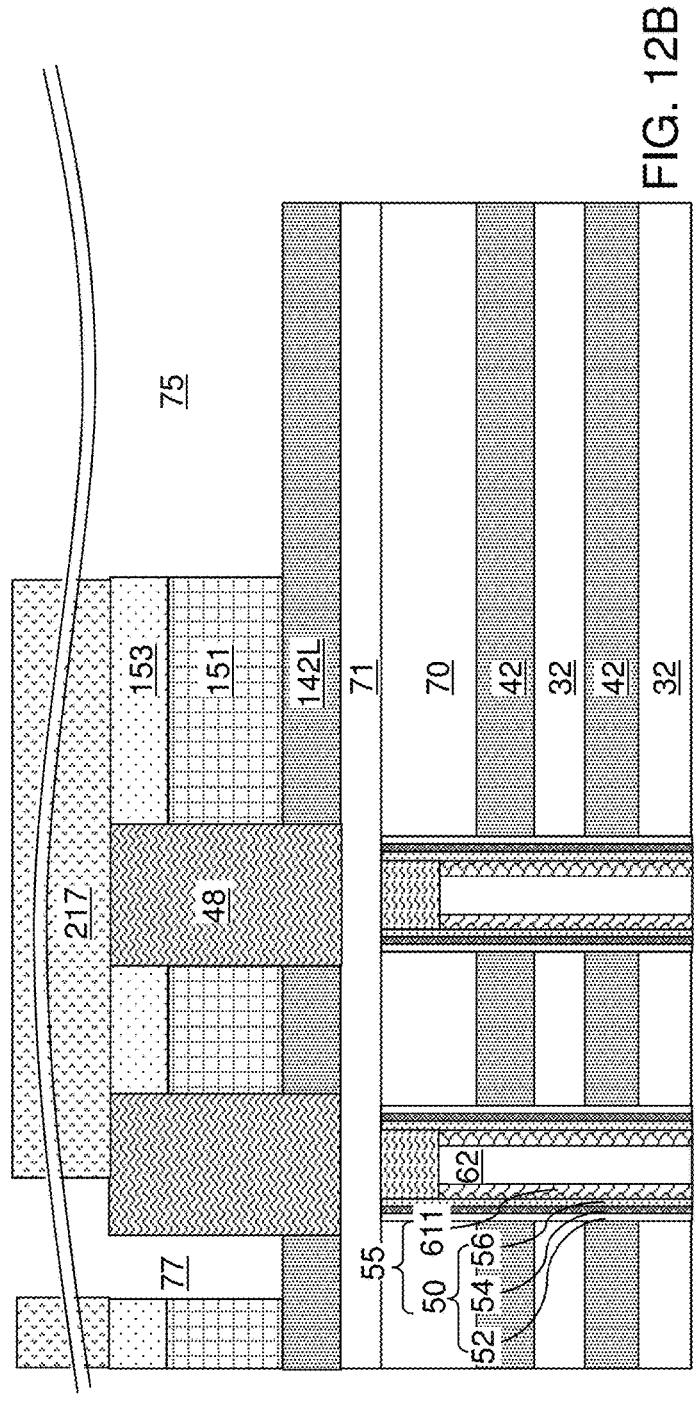

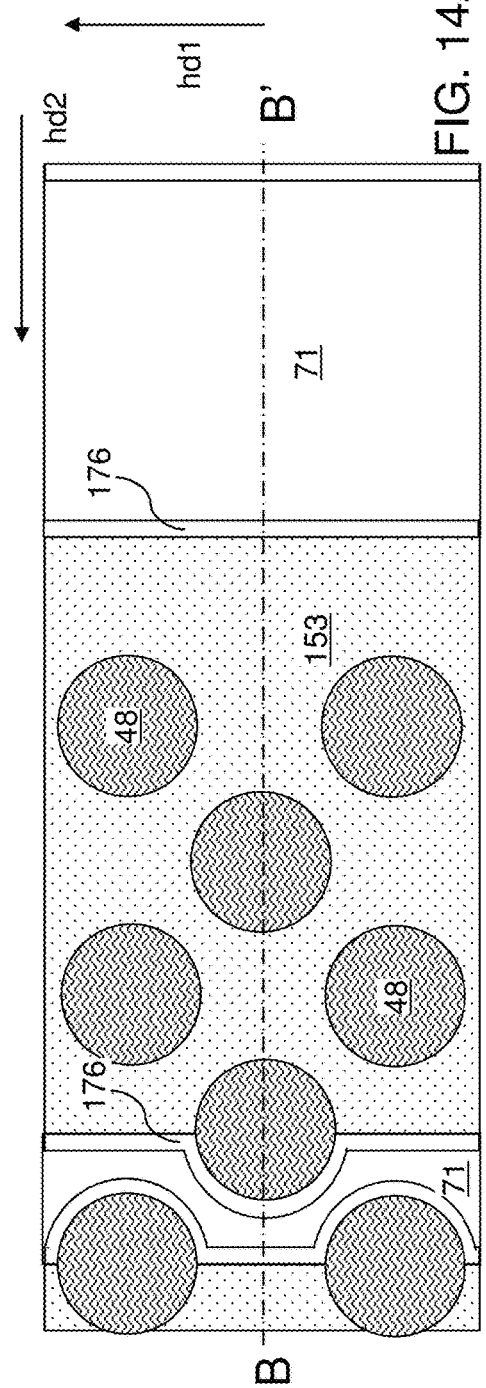
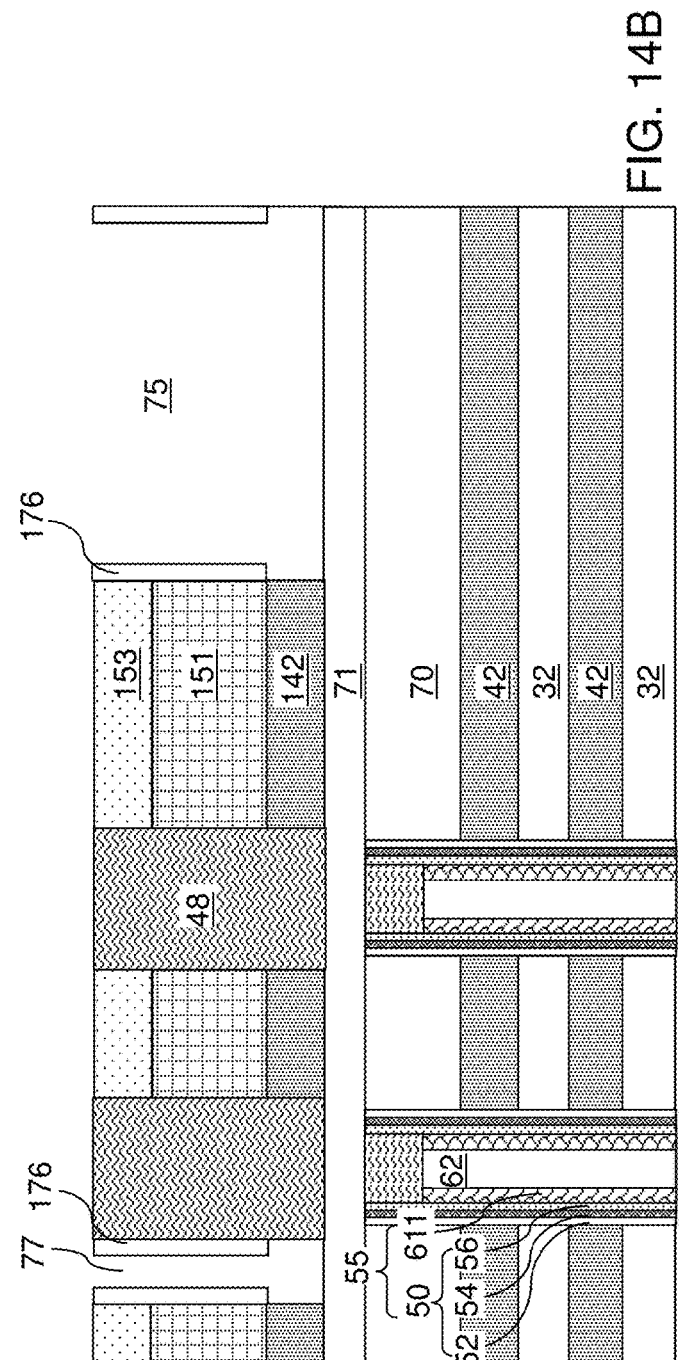

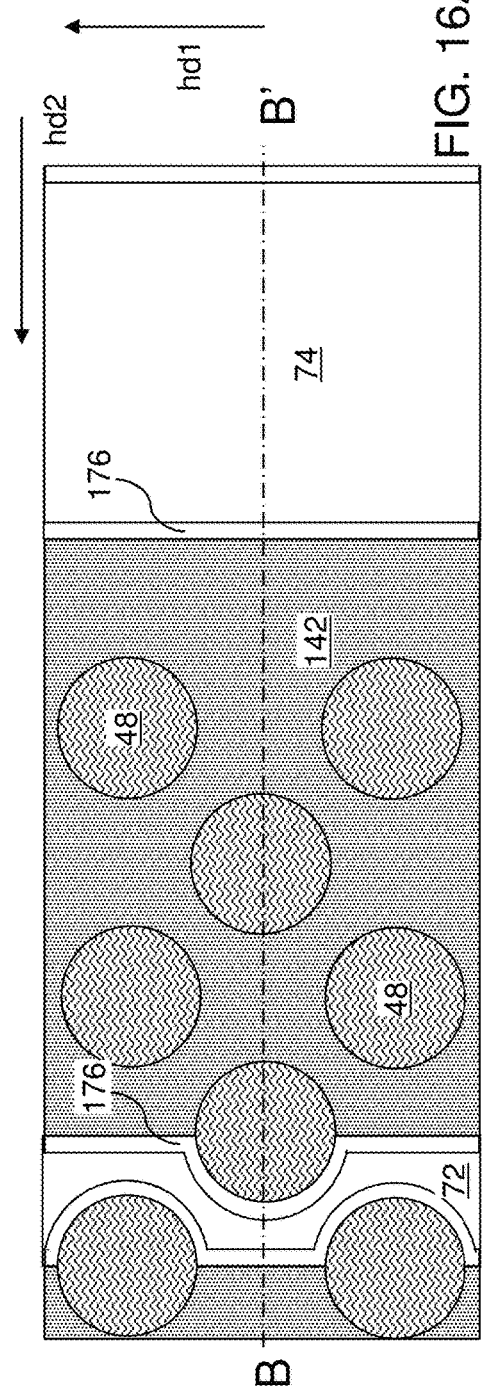
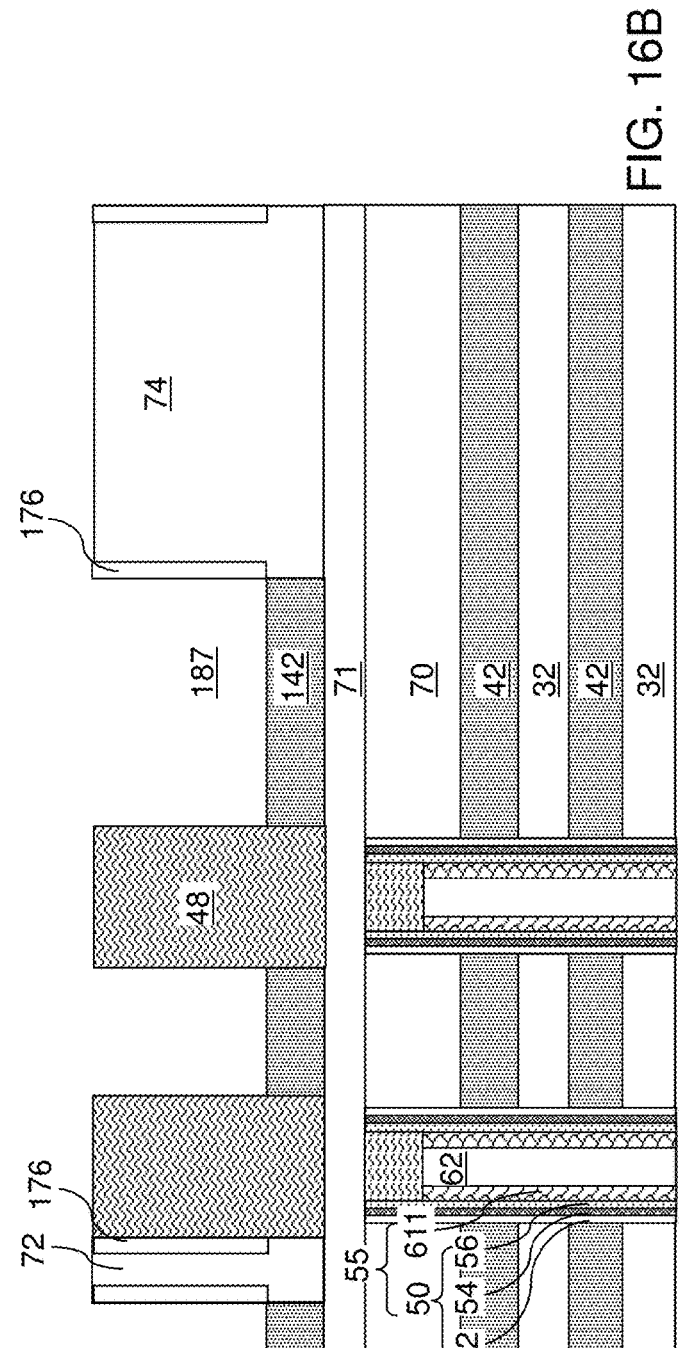

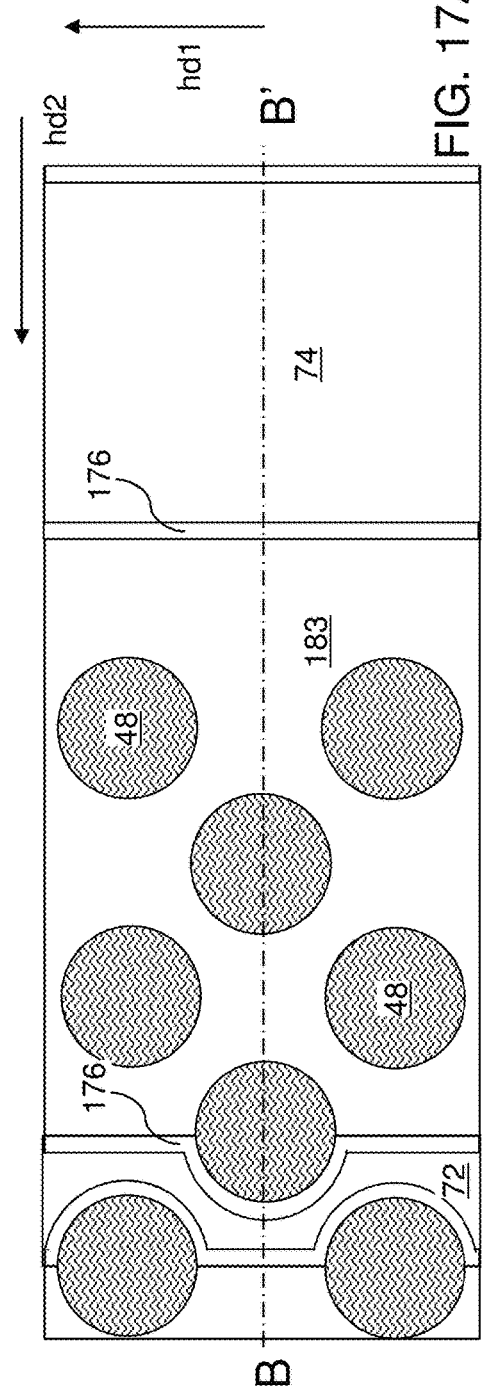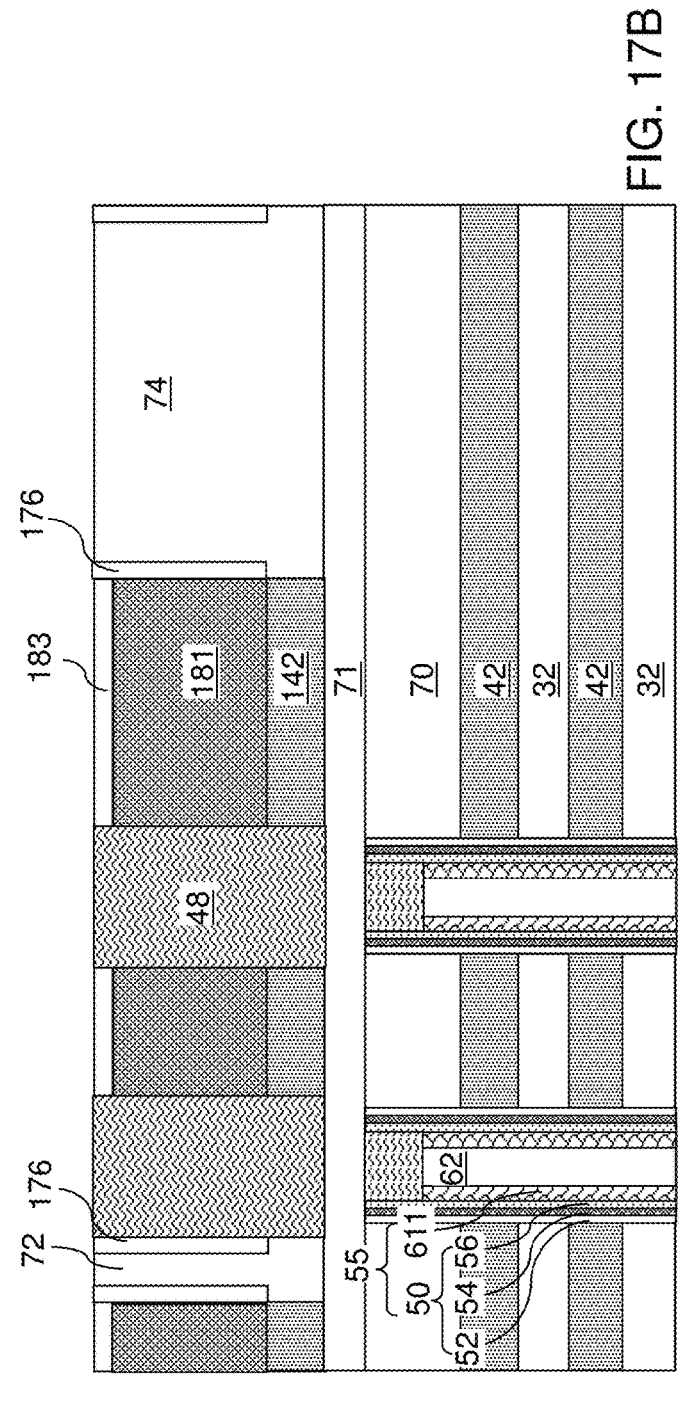

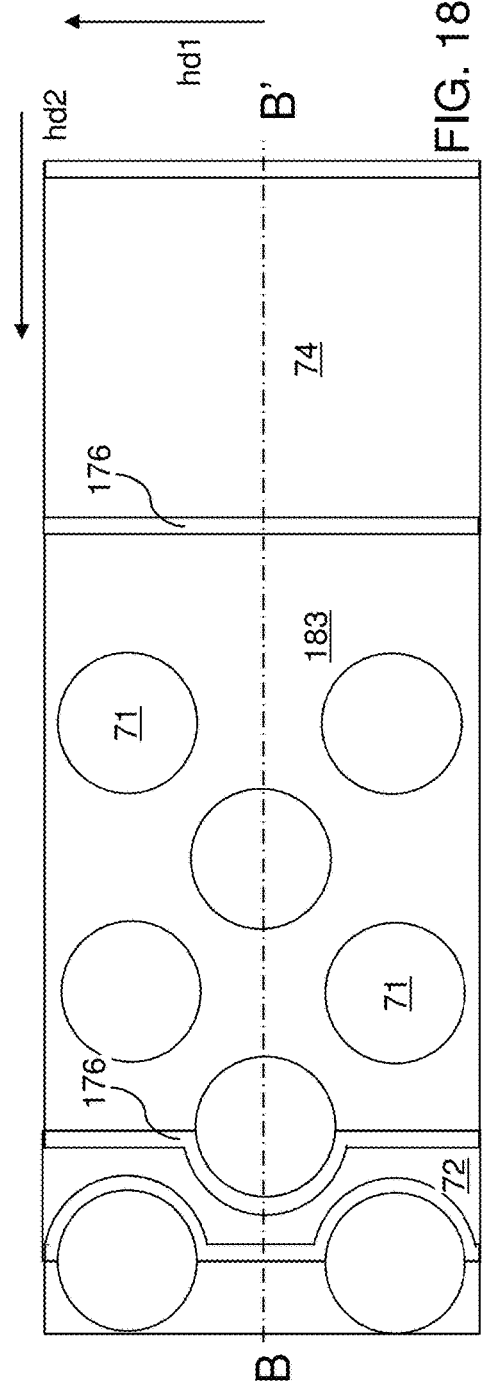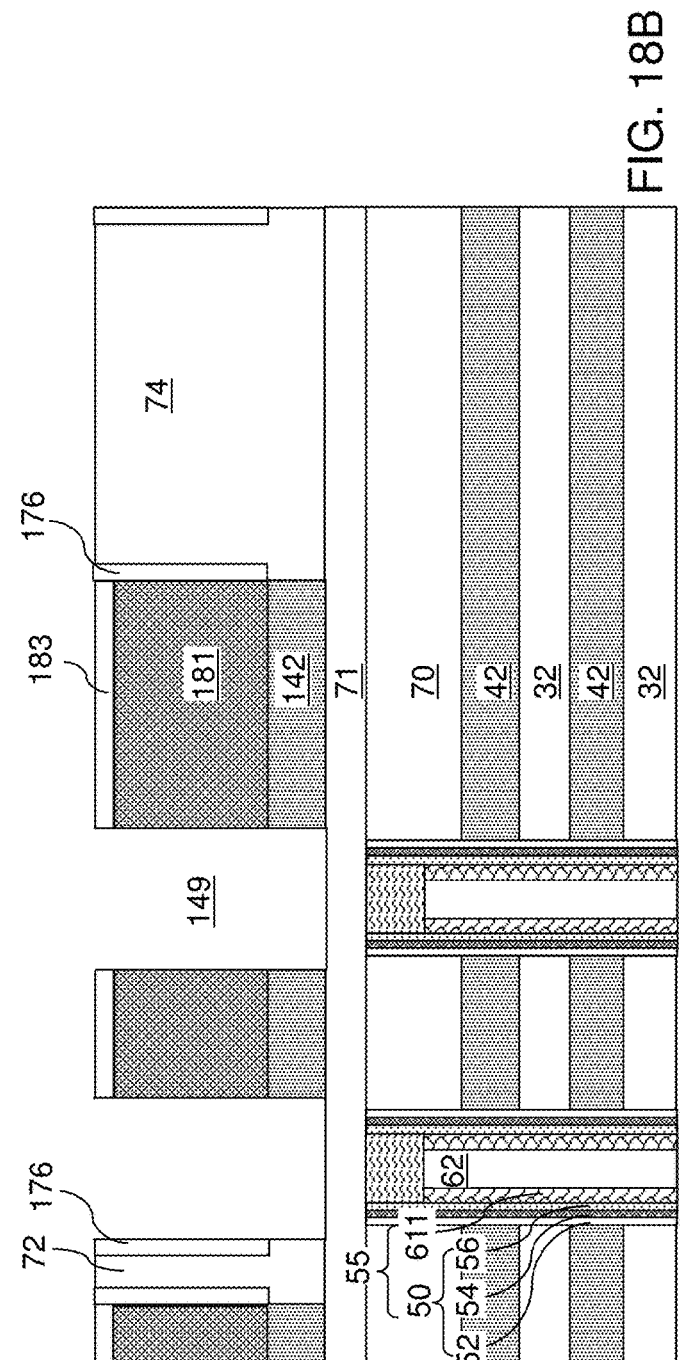

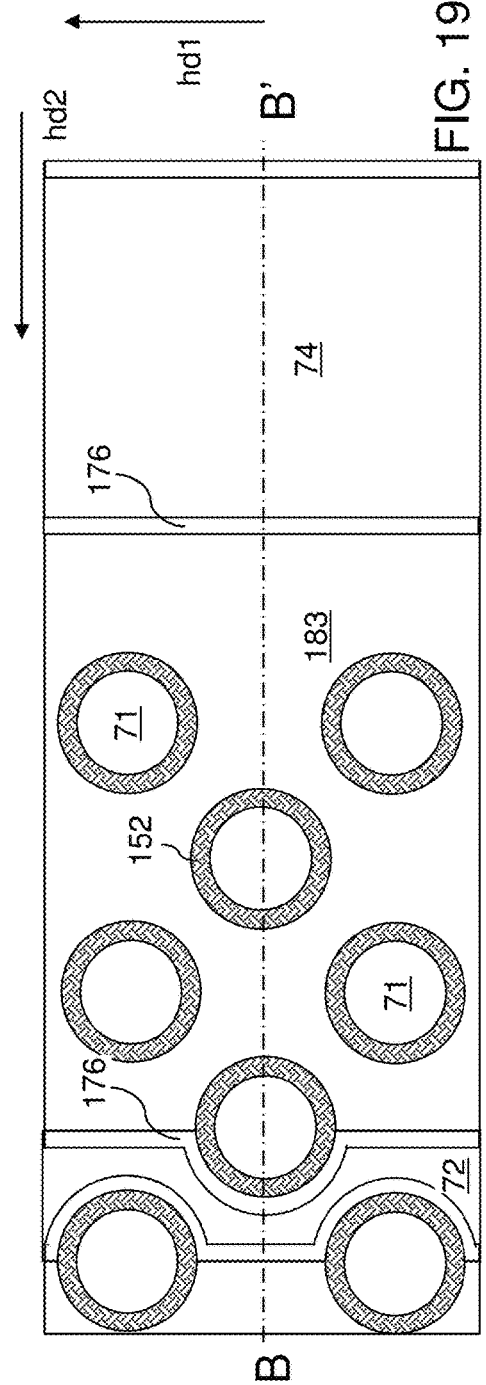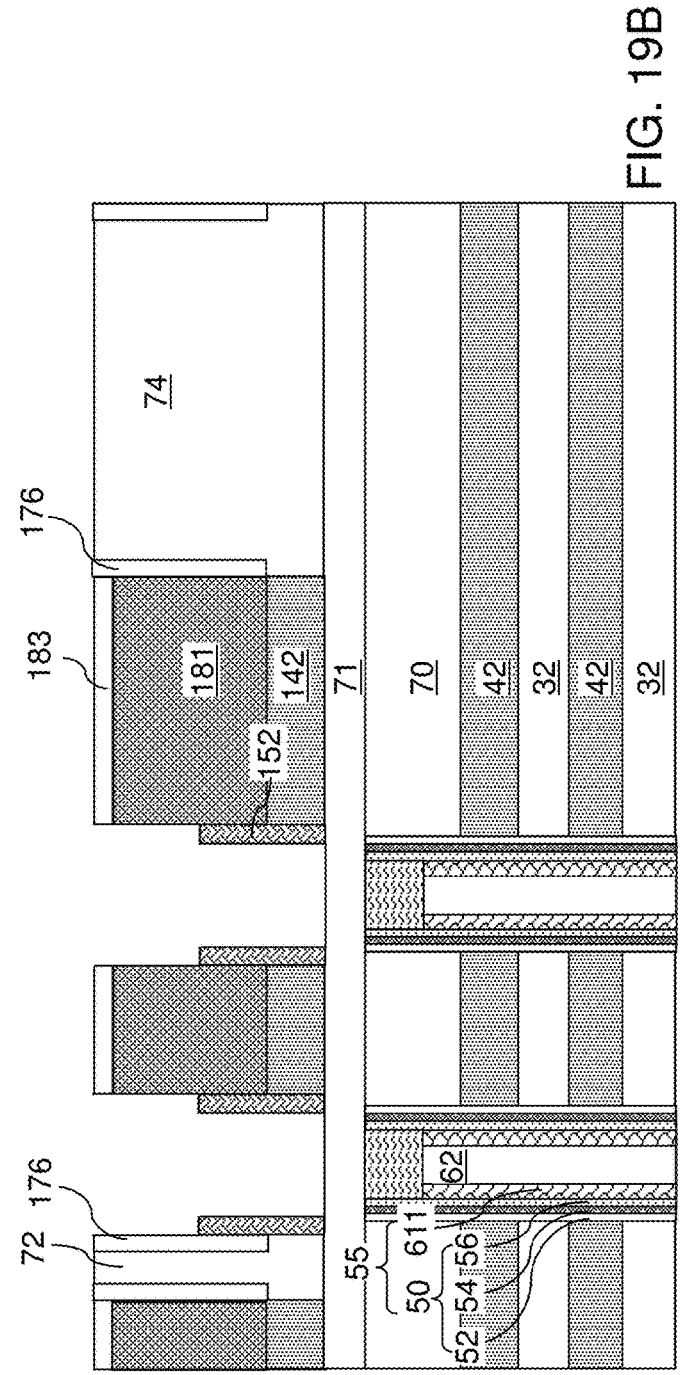

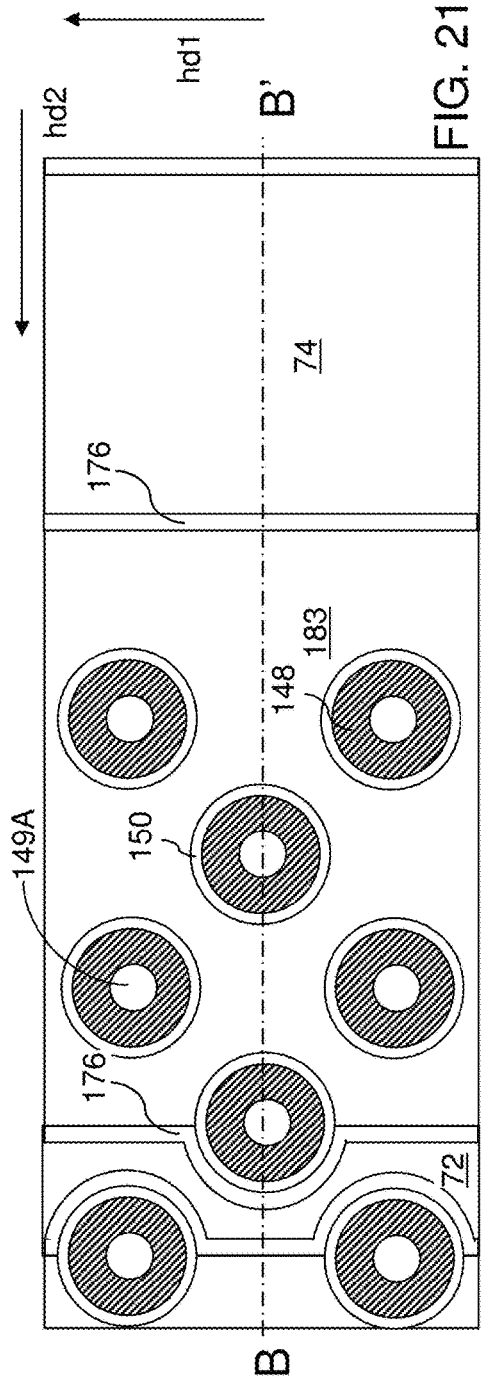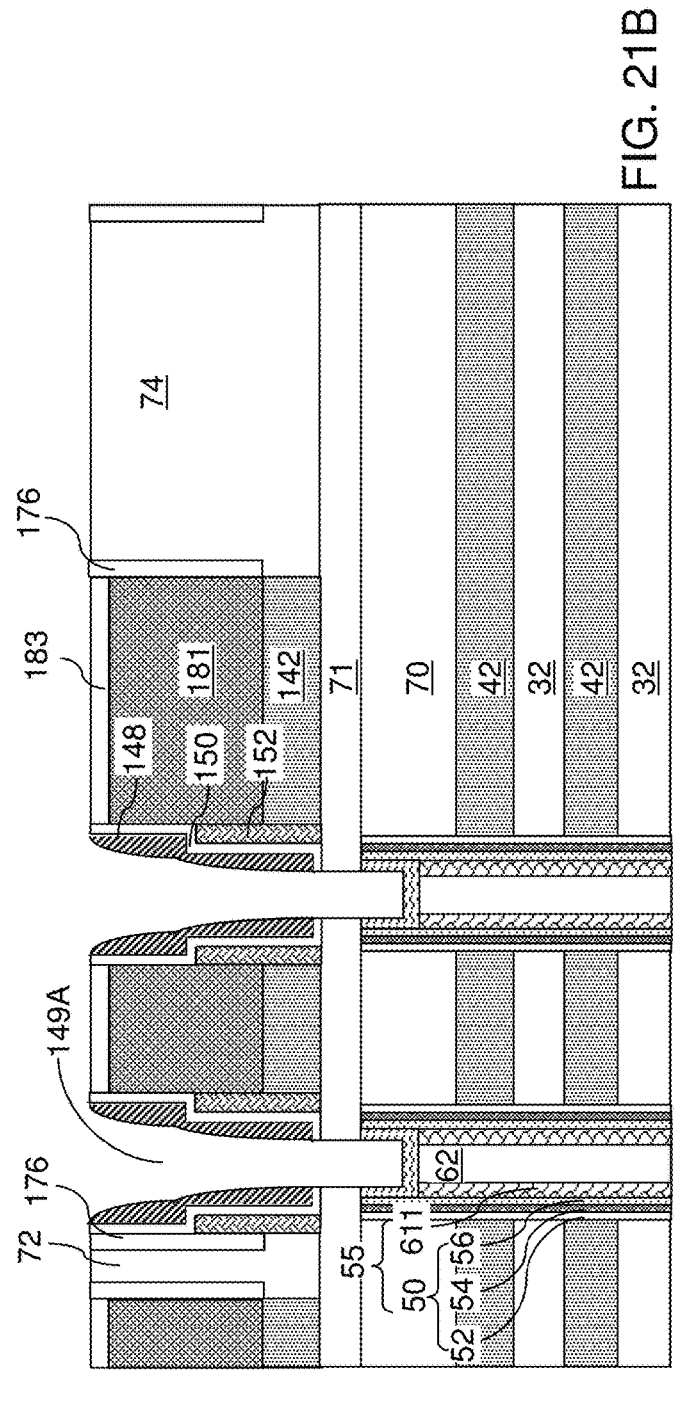

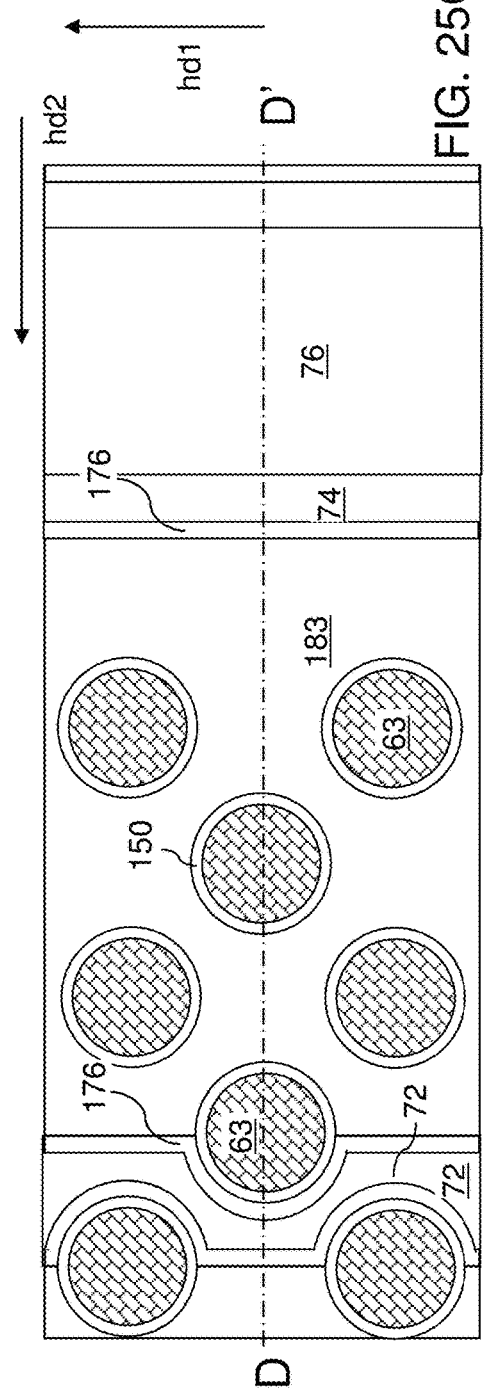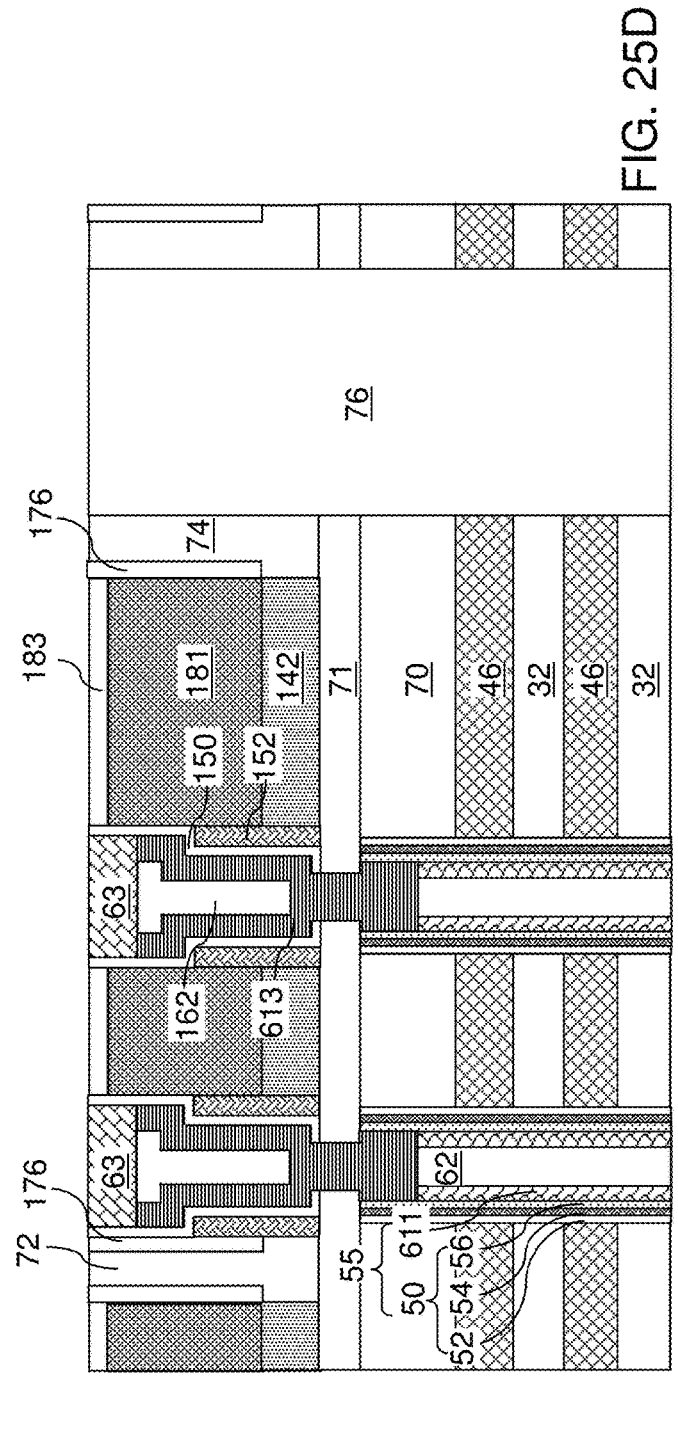

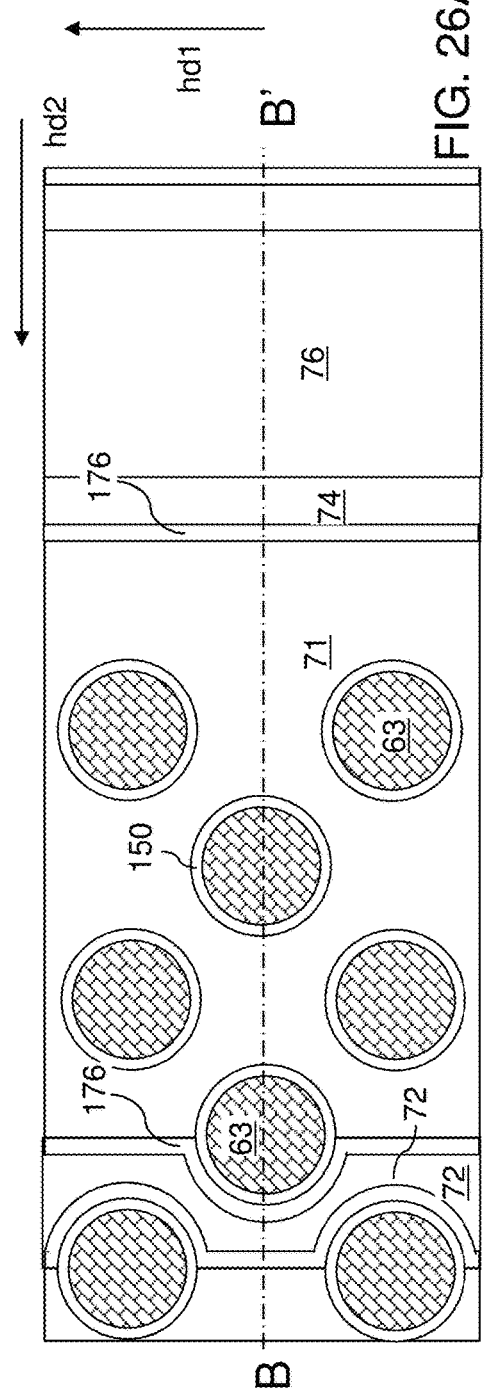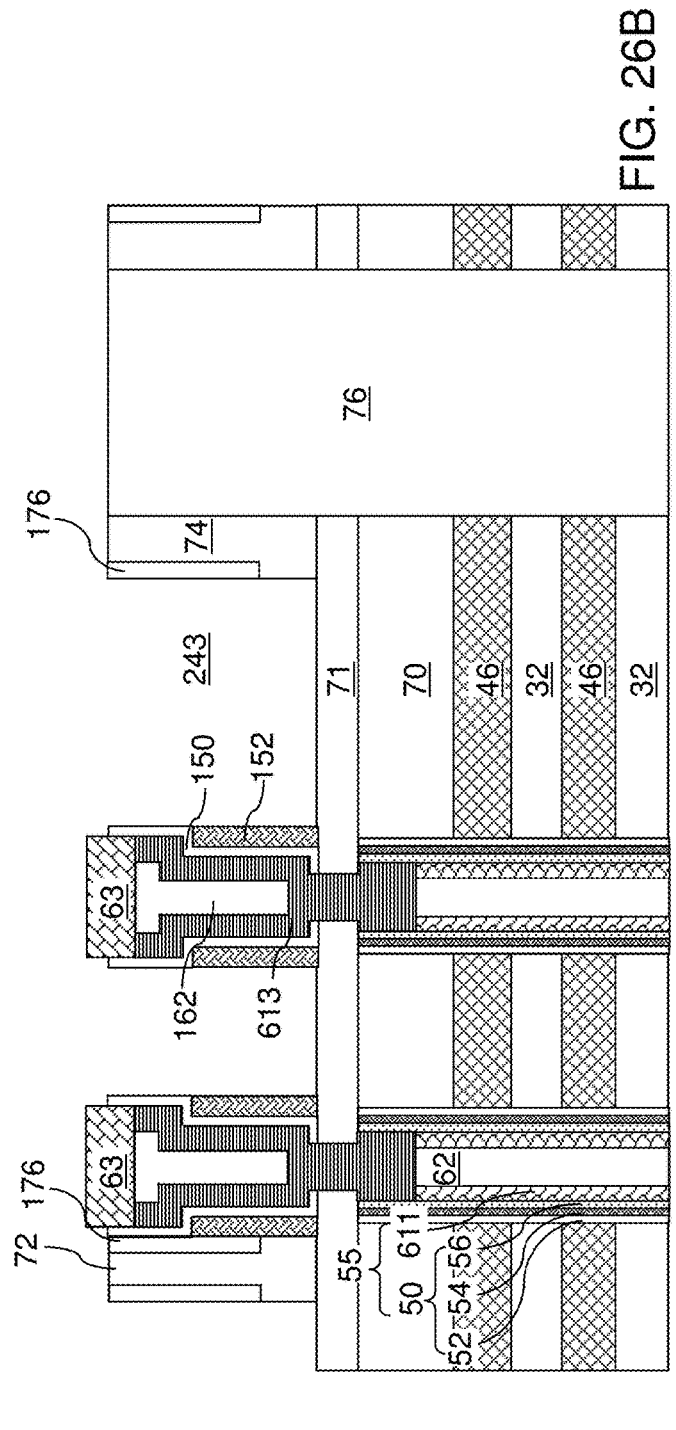

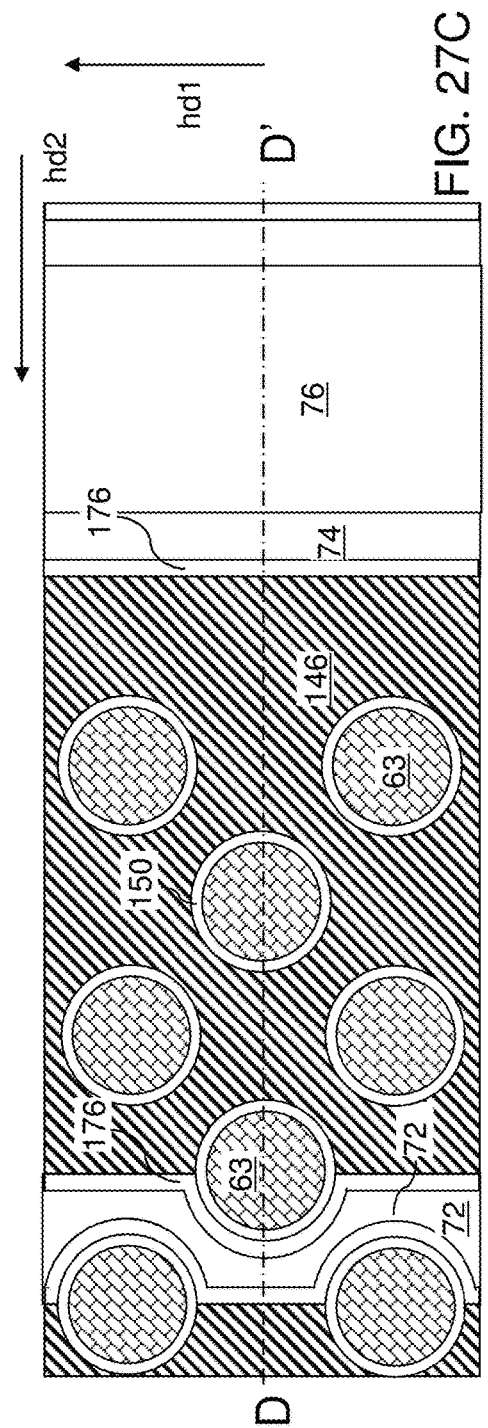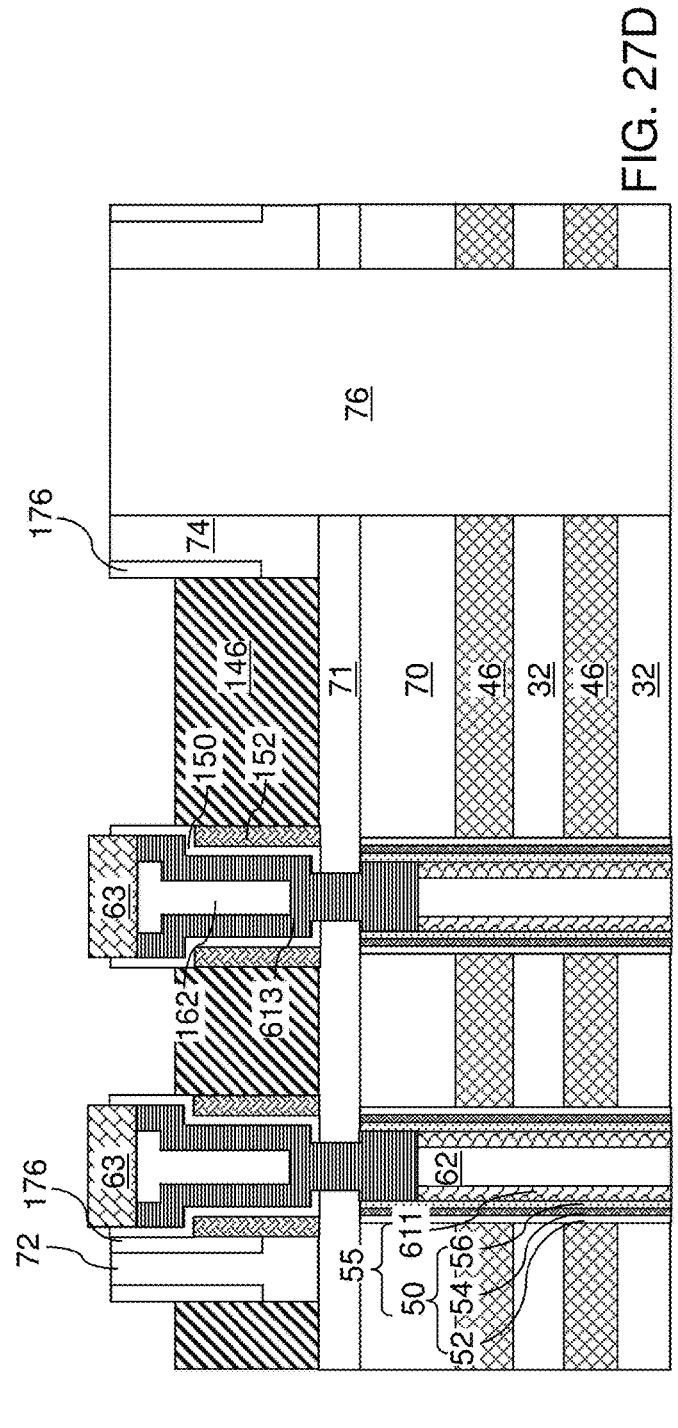

US 10,553,599 B1

THREE-DIMENSIONAL MEMORY DEVICE CONTAINING DRAIN SELECT ISOLATION STRUCTURES AND ON-PITCH CHANNELS AND METHODS OF MAKING THE SAME WITHOUT AN ETCH STOP LAYER

FIELD

The present disclosure relates generally to the field of semiconductor devices, and particular to a three-dimensional memory device including drain select electrodes and methods of manufacturing the same that do not employ a metal oxide etch stop layer.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell," IEDM Proc. (2001) 33-36. Drain select gate electrodes are employed to select a string of memory stack structures while deactivating other strings that share word line electrically conductive layers.

SUMMARY

According to an aspect of the present disclosure, a three-dimensional memory device is provided, which comprises: an alternating stack of insulating layers and electrically conductive layers located over a substrate; memory openings vertically extending through the alternating stack; memory opening fill structures located in the memory openings and including a respective memory-level semiconductor channel and a respective memory film; drain-select-level gate electrodes overlying the alternating stack and laterally spaced apart from each other; drain-select-level pillar structures extending through a respective one of the drain-select-level gate electrodes and including a respective drain-select-level semiconductor channel that is electrically connected to an underlying one of the memory-level semiconductor channels; and a planar insulating spacer layer having a homogeneous composition throughout and directly contacting top surfaces of the memory films and bottom surfaces of the drain-select-level gate electrodes.

According to another aspect of the present disclosure, a method of forming a three-dimensional memory device is provided, which comprises: forming an alternating stack of insulating layers and spacer material layers over a substrate, wherein the spacer material layers are formed as, or are subsequently replaced with, electrically conductive layers; forming memory opening fill structures through the alternating stack, wherein each of the memory opening fill structures includes a respective memory-level semiconductor channel and a respective memory film; forming a planar insulating spacer layer over the memory opening fill structures; forming sacrificial pillar structures embedded in sacrificial template structures over the planar insulating spacer layer; forming drain-select-level cavities by removing the sacrificial pillar structures and etching the planar insulating spacer; forming drain-select-level pillar structures in the drain-select-level cavities, wherein each of the drain-select-level pillar structures includes a respective drain-select-level semiconductor channel that is electrically connected to an underlying one of the memory-level semiconductor channels; and replacing the sacrificial template structures with drain-select-level gate electrodes.

BRIEF DESCRIPTION OF THE DRAWINGS

FIG. 1A is a schematic vertical cross-sectional view of an exemplary structure after formation of at least one peripheral device, an insulating layer, a buried conductive layer, and in-process source-level material layers according to an embodiment of the present disclosure.

FIGS. 5A-5D are sequential vertical cross-sectional views of a memory opening of the exemplary structure during formation of a memory opening fill structure according to an embodiment of the present disclosure.

FIG. 7A is a top-down view of a region of the exemplary structure after formation of a planar insulating spacer layer, a drain-select-level sacrificial material layer, and a sacrificial matrix layer according to an embodiment of the present disclosure.

FIG. 7B is a vertical cross-sectional view along the vertical plane B-B' of FIG. 7A.

FIG. 8A is a top-down view of a region of the exemplary structure after formation of drain-select-level openings according to an embodiment of the present disclosure.

FIG. 8B is a vertical cross-sectional view along the vertical plane B-B' of FIG. 8A.

FIG. 9A is a top-down view of a region of the exemplary structure after formation of sacrificial pillar structures according to an embodiment of the present disclosure.

FIG. 9B is a vertical cross-sectional view along the vertical plane B-B' of FIG. 9A.

FIG. 10A is a top-down view of a region of the exemplary structure after removal of the sacrificial matrix layer according to an embodiment of the present disclosure.

FIG. 10B is a vertical cross-sectional view along the vertical plane B-B' of FIG. 10A.

FIG. 11A is a top-down view of a region of the exemplary structure after formation of a first sacrificial template material layer and a second sacrificial template material layer according to an embodiment of the present disclosure.

FIG. 11B is a vertical cross-sectional view along the vertical plane B-B' of FIG. 11A.

FIG. 12A is a top-down view of a region of the exemplary structure after formation of sacrificial template structures by patterning the upper and lower spin-on material layers according to an embodiment of the present disclosure.

FIG. 12B is a vertical cross-sectional view along the vertical plane B-B' of FIG. 12A.

FIG. 14A is a top-down view of a region of the exemplary structure after patterning the drain-select-level sacrificial material layer by an anisotropic etch process and formation of inter-block trenches and inter-string trenches according to an embodiment of the present disclosure.

FIG. 14B is a vertical cross-sectional view along the vertical plane B-B' of FIG. 14A.

FIG. 16A is a top-down view of a region of the exemplary structure after removal of the sacrificial template structures and formation of drain-select-level recesses according to an embodiment of the present disclosure.

FIG. 16B is a vertical cross-sectional view along the vertical plane B-B' of FIG. 16A.

FIG. 17A is a top-down view of a region of the exemplary structure after formation of sacrificial fill material portions and sacrificial cap material portions according to an embodiment of the present disclosure.

FIG. 17B is a vertical cross-sectional view along the vertical plane B-B' of FIG. 17A, FIG. 18A is a top-down view of a region of the exemplary structure after removal of the sacrificial pillar structures according to an embodiment of the present disclosure.

FIG. 18B is a vertical cross-sectional view along the vertical plane B-B' of FIG. 18A.

FIG. 19A is a top-down view of a region of the exemplary structure after formation of cylindrical gate electrodes according to an embodiment of the present disclosure.

FIG. 19B is a vertical cross-sectional view along the vertical plane B-B' of FIG. 19A.

FIG. 21A is a top-down view of a region of the exemplary structure after formation of cover material spacers and vertical extension of drain-select-level cavities according to an embodiment of the present disclosure.

FIG. 21B is a vertical cross-sectional view along the vertical plane B-B' of FIG. 21A.

FIG. 25C is a top-down view of a region of the exemplary structure of FIGS. 25A and 23B FIG. 25D is a vertical cross-sectional view along the vertical plane D-D' of FIG. 25C.

FIG. 26A is a top-down view of a region of the exemplary structure after removal of the sacrificial fill material portions and sacrificial cap material portions according to an embodiment of the present disclosure.

FIG. 26B is a vertical cross-sectional view along the vertical plane B-B' of FIG. 26A.

FIG. 27C is a top-down view of a region of the exemplary structure of FIGS. 27A and 27B FIG. 27D is a vertical cross-sectional view along the vertical plane D-D' of FIG. 27C.

DETAILED DESCRIPTION

Figure 1B:
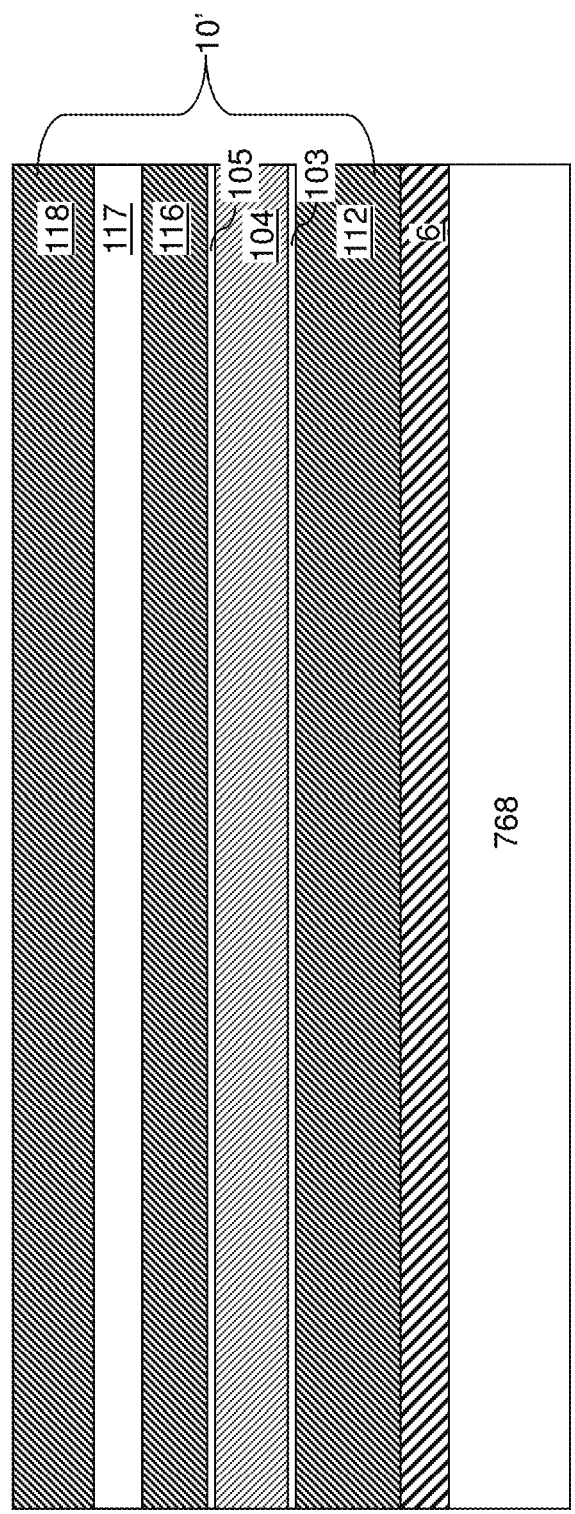
FIG. 1B is a vertical cross-sectional view of a layer stack of the insulating layer, the buried conductive layer, and the in-process source-level material layer of FIG. 1A.

Drain-select-level isolation structures having shapes of elongated dielectric rails are employed to provide electrical isolation among the drain select gate electrodes. Gapless lithographic pitch alignment (GLPA) refers to alignment of the drain-select-level isolation structures to an on-pitch array of memory stack structures (i.e., channels and memory films in a vertical NAND device). In other words, the pitch of the memory stack structures (e.g., channels and memory films) is not changed between NAND strings to accommodate the isolation structures located between the some but not all of the rows of the memory stack structures. GLPA structures are desirable because GLPA does not require additional area for formation of the drain-select-level isolation structures. Prior art GLPA structures are formed employing an aluminum oxide etch stop layer because simultaneous anisotropic etching of silicon oxide and silicon nitride is difficult. Unfortunately, implementation of prior art GLPA structures is difficult because patterning of aluminum oxide is challenging. Embodiments of the present disclosure provide methods for forming GLPA structures that do not require use of an aluminum oxide etch stop layer. As discussed above, the embodiments of the present disclosure are directed to a three-dimensional memory device including drain select electrodes that do not employ a metal oxide etch stop layer and methods of manufacturing the same, the various aspect of which are described herein in detail. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first", "second", and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIGS. 1A and 1B, an exemplary structure according to an embodiment of the present disclosure is illustrated, which can be employed, for example, to fabricate a device structure containing vertical NAND memory devices. The exemplary structure includes a substrate 8, such as a silicon wafer or a silicon-on-insulator substrate, for example. The substrate 8 can include a substrate semiconductor layer 9 in an upper portion thereof. The substrate semiconductor layer 9 may be an upper portion of the silicon wafer 8, a doped well in the upper portion of the silicon wafer 8, or a semiconductor (e.g., silicon) layer located over a top surface of the substrate. The substrate 8 can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline silicon surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device. A dielectric material such as silicon oxide can be deposited over the at least one semiconductor device, and can be subsequently planarized to form a planarization dielectric layer 770. The region including the at least one semiconductor device 700 is herein referred to as a peripheral device region 200.

A dielectric material layer 768 can be formed over the substrate semiconductor layer 9. The dielectric material layer 768 may include a single dielectric material layer or a plurality of dielectric material layers. The dielectric material layer 768 may include any one or more of doped silicate glass, undoped silicate glass, and organosilicate glass. In one embodiment, the at least one dielectric material layer 768 can comprise, or consist essentially of, dielectric material layers having dielectric constant that does not exceed the dielectric constant of undoped silicate glass (silicon oxide) of 3.9.

An optional layer of a metallic material and a layer of a semiconductor material can be deposited over, or within patterned recesses of, the dielectric material layer 768, and are lithographically patterned to provide an optional conductive plate layer 6 and in-process source-level material layers 10'. As used herein, an "in-process" element refers to an element that is modified during a subsequent processing step. The optional conductive plate layer 6, if present, provides a high conductivity conduction path for electrical current that flows into, or out of, the in-process source-level material layers 10'. The optional conductive plate layer 6 includes a conductive material such as a metal, metal silicide, or a heavily doped semiconductor material. The optional conductive plate layer 6, for example, may include a tungsten or tungsten silicide layer having a thickness in a range from 3 nm to 100 nm, although lesser and greater thicknesses can also be employed. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 can include a metallic compound material such as a conductive metallic silicide or nitride (e.g., TiN) and/or a metal (e.g., W). The thickness of the optional conductive plate layer 6 may be in a range from 5 nm to 100 nm, although lesser and greater thicknesses can also be employed.

The in-process source-level material layers 10' can include various layers that are subsequently modified to form source-level material layers. The source-level material layers, upon formation, include a source contact layer that functions as a common source region for vertical field effect transistors of a three-dimensional memory device. In one embodiment, the in-process source-level material layer 10' can include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source-select-level conductive layer 118.

The lower source-level material layer 112 and the upper source-level material layer 116 can include a doped semiconductor material such as doped polysilicon or doped amorphous silicon. The conductivity type of the lower source-level material layer 112 and the upper source-level material layer 116 can be the opposite of the conductivity of memory-level semiconductor channels to be subsequently formed. For example, if the memory-level semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be employed.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon, polysilicon, or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be employed. The optional source-select-level conductive layer 118 can include a conductive material that can be employed as a source-select-level gate electrode. For example, the optional source-select-level conductive layer 118 can include a heavily doped semiconductor material such as heavily doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be employed.

The in-process source-level material layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface 7 of the substrate 8).

The optional conductive plate layer 6 and the in-process source-level material layers 10' may be patterned to provide openings in areas in which through-memory-level contact via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed. Thus, regions in which the in-process source-level material layers 10' are present include a memory array region 100 in which memory devices are to be subsequently formed and a contact region 300 in which stepped surfaces and contact via structures contacting various electrically conductive layers are to be subsequently formed.

Figure 2:
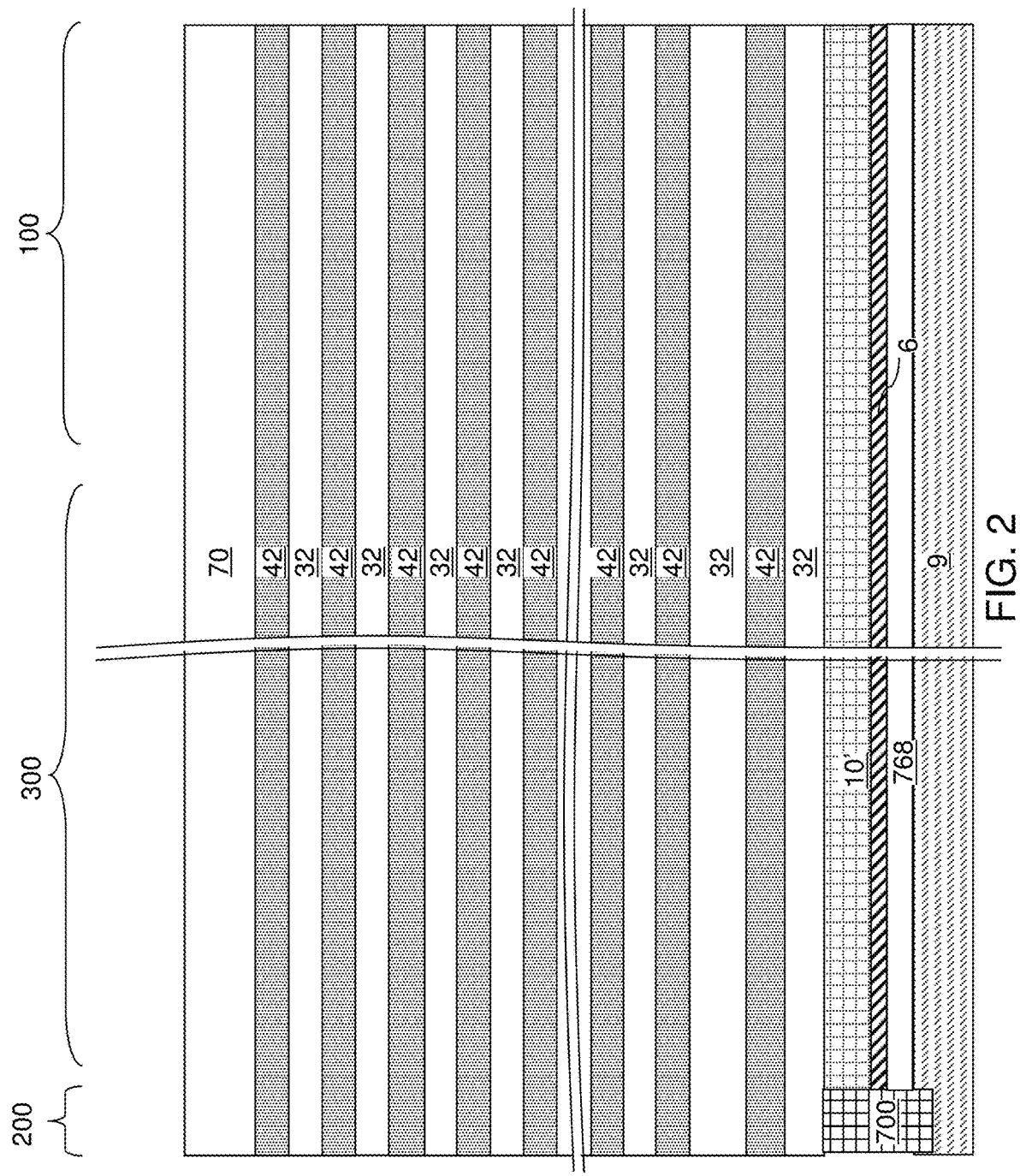
FIG. 2 is a vertical cross-sectional view of an upper region of the exemplary structure after formation of an alternating stack of insulating layers and sacrificial material layers and an insulating cap layer according to an embodiment of the present disclosure.

Referring to FIG. 2, a stack of an alternating plurality of first material layers (which can be insulating layers 32) and second material layers (which can be sacrificial material layer 42) is formed over the top surface of the substrate 8. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

An insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
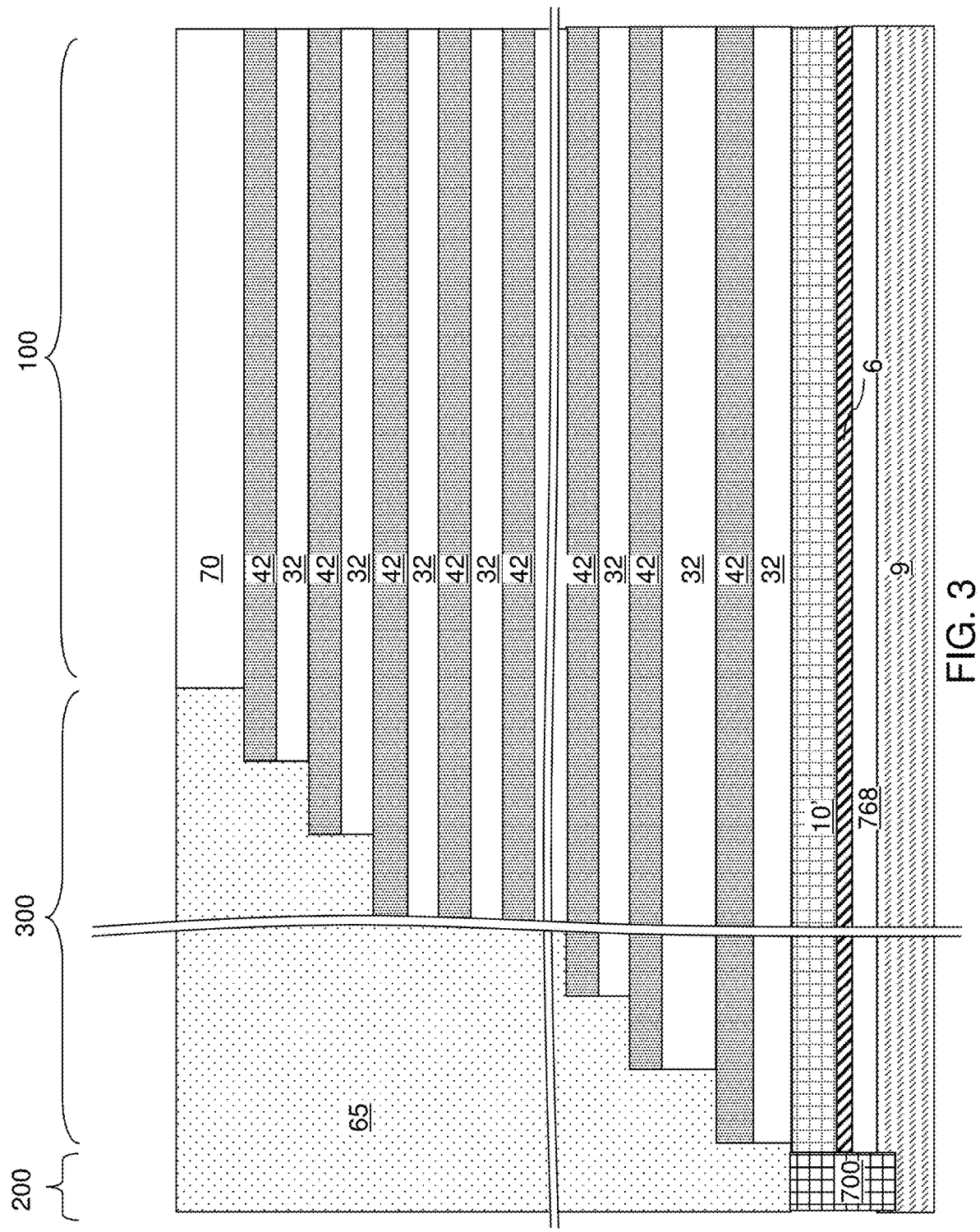
FIG. 3 is a vertical cross-sectional view of the exemplary structure after formation of stepped surfaces and a retro-stepped dielectric material portion according to an embodiment of the present disclosure.

Referring to FIG. 3, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 8. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the insulating cap layer 70 and the alternating stack (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the insulating cap layer 70 and the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the topmost surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
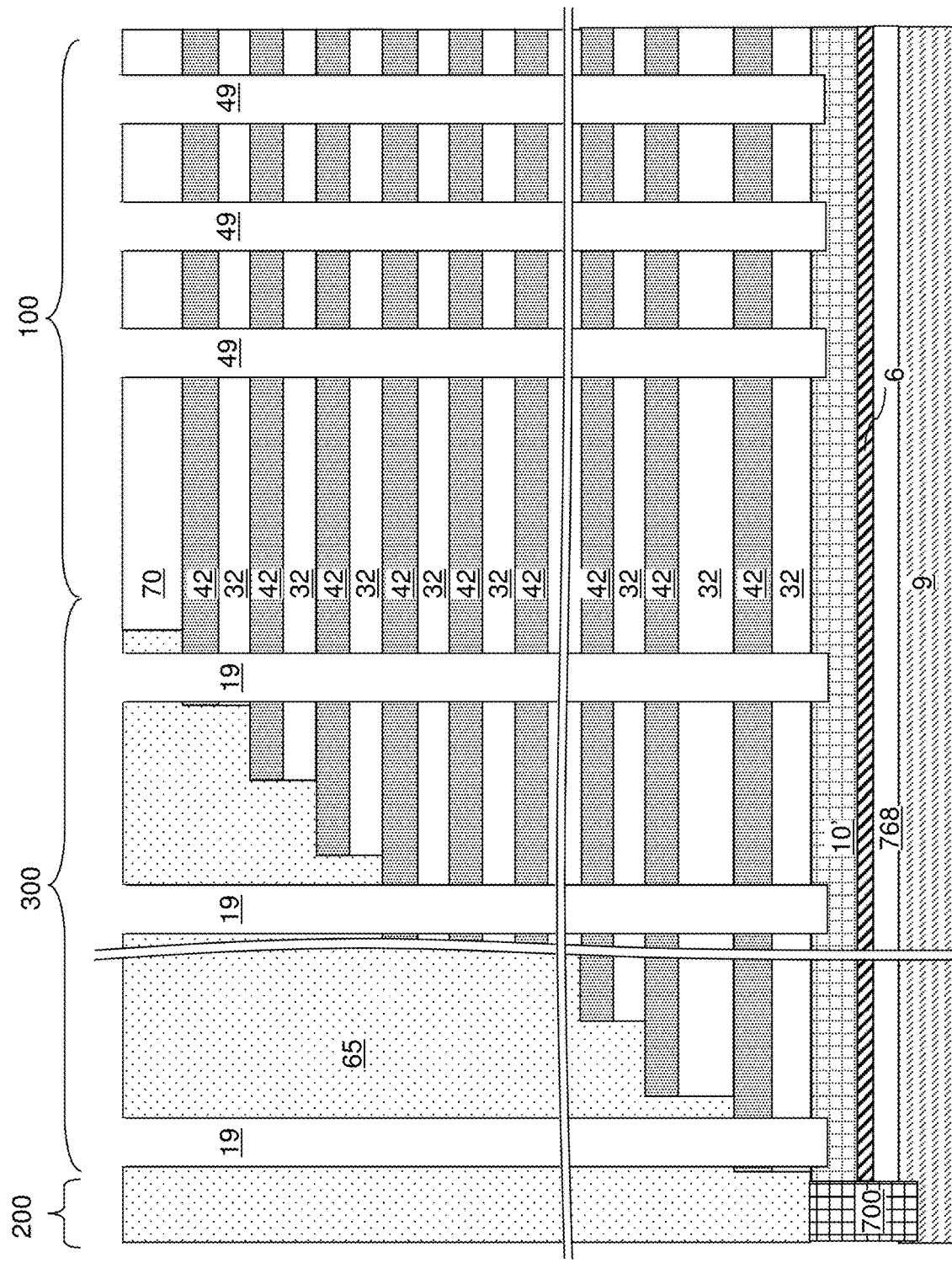
FIG. 4A is a vertical cross-sectional view of the exemplary structure after formation of memory openings and support openings according to an embodiment of the present disclosure.
Figure 4B:
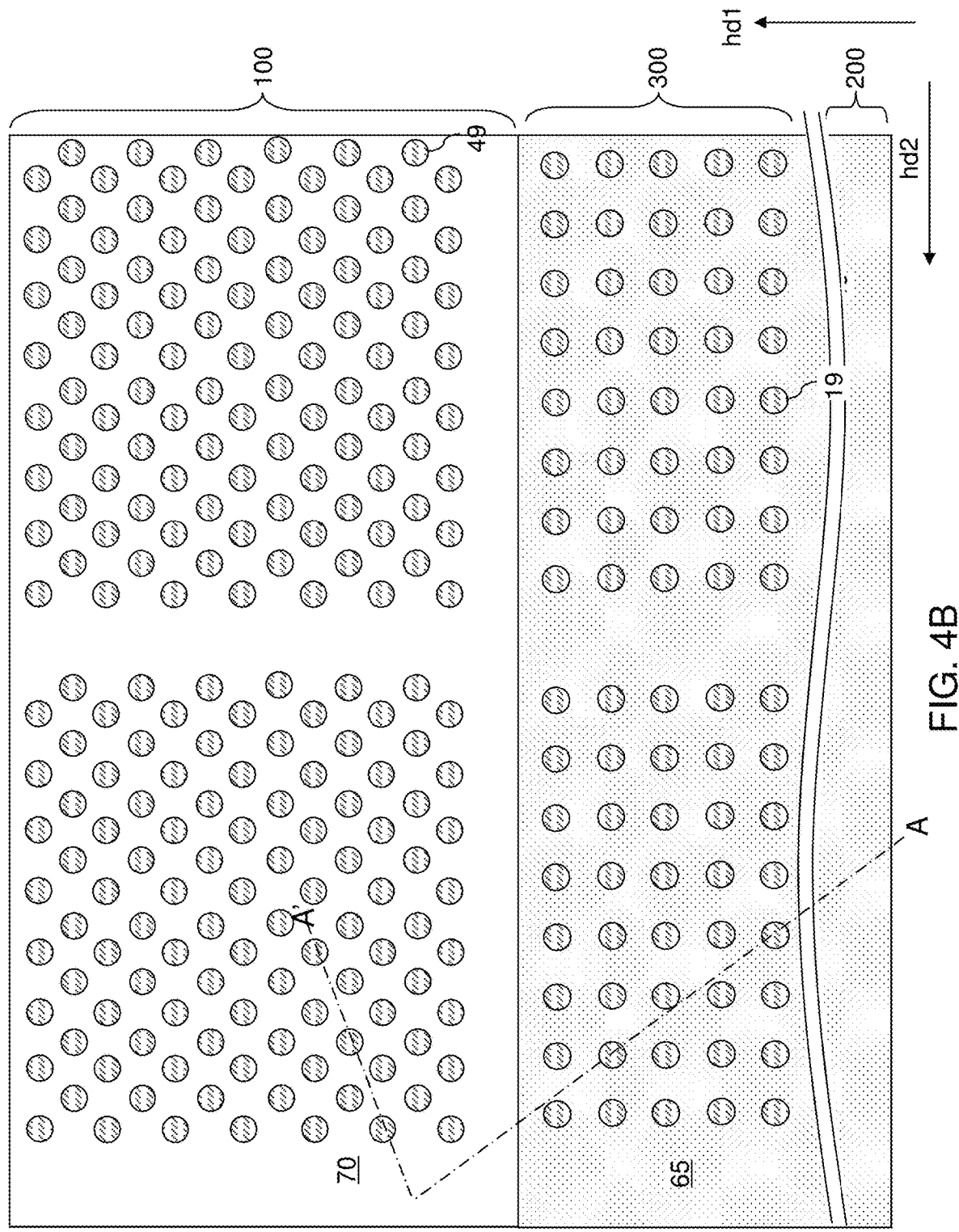
FIG. 4B is a top-down view of the exemplary structure of FIG. 4A.

Referring to FIGS. 4A, 4B, and 5A, a lithographic material stack (not shown) including at least a photoresist layer can be formed over the insulating cap layer 70, and can be lithographically patterned to form openings therein. The openings include a first set of openings formed over the memory array region 100 and a second set of openings formed over the contact region 300. The pattern in the lithographic material stack can be transferred through the insulating cap layer 70, the alternating stack (32, 42), and the retro-stepped dielectric material portion 65 by at least one anisotropic etch that employs the patterned lithographic material stack as an etch mask.

Portions of the insulating cap layer 70 and the alternating stack (32, 42) underlying the openings in the patterned lithographic material stack within the memory array region 100 are etched to form memory openings 49. Portions of the insulating cap layer 70, the alternating stack (32, 42), and the retro-stepped dielectric material portion 65 underlying the openings in the patterned lithographic material stack within the contact region 300 are etched to form support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surfaces of the insulating cap layer 70 to the lower source-level material layer 112 in the in-process source-level material layers 10. In one embodiment, an overetch into the lower source-level material layer 112 may be optionally performed after the top surface of the lower source-level material layer 112 is physically exposed at a bottom of each memory opening 49 and each support opening 19. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the lower source-level material layer 112.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300.

The memory openings 49 can be arranged in groups such that each group includes a plurality of rows of memory openings 49. Within each group of memory openings 49, the memory openings 49 can be arranged as rows that extend along the first horizontal direction hd1. The multiple rows can be spaced apart along the second horizontal direction hd2 that is perpendicular to the first horizontal direction hd1 with a uniform inter-row pitch for an entirety of the group of memory openings 49. In this case, the rows of memory openings 49 are "on-pitch," i.e., have a uniform pitch, along the second horizontal direction. In one embodiment, the memory openings can be arranged in clusters, i.e., groups, that include multiple rows of memory openings 49. In one embodiment, the memory openings 49 in a cluster can be arranged as a two-dimensional hexagonal array having a two-dimensional periodicity.

Referring to FIG. 5B, a continuous memory film 50L and a semiconductor channel material layer 611L can be sequentially deposited in the memory opening 49 and in the support openings 19. Each continuous memory film 50L can include a stack of layers including a continuous blocking dielectric layer 52L, a continuous charge storage layer 54L, and a continuous tunneling dielectric layer 56L. The continuous memory film 50L continuous extends into each memory opening 49 and into each support opening 19.

The continuous blocking dielectric layer 52L can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the continuous blocking dielectric layer 52L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the continuous blocking dielectric layer 52L includes aluminum oxide. In one embodiment, the continuous blocking dielectric layer 52L can include multiple dielectric metal oxide layers having different material compositions.

Alternatively or additionally, the continuous blocking dielectric layer 52L can include a dielectric semiconductor compound such as silicon oxide, silicon oxynitride, silicon nitride, or a combination thereof. In one embodiment, the continuous blocking dielectric layer 52L can include silicon oxide. In this case, the dielectric semiconductor compound of the continuous blocking dielectric layer 52L can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the continuous blocking dielectric layer 52L can be omitted, and a backside blocking dielectric layer can be formed after formation of backside recesses on surfaces of memory films to be subsequently formed.

Subsequently, the continuous charge storage layer 54L can be formed. In one embodiment, the continuous charge storage layer 54L can be a continuous layer or patterned discrete portions of a charge trapping material including a dielectric charge trapping material, which can be, for example, silicon nitride. Alternatively, the continuous charge storage layer 54L can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the continuous charge storage layer 54L includes a silicon nitride layer. In one embodiment, the sacrificial material layers 42 and the insulating layers 32 can have vertically coincident sidewalls, and the continuous charge storage layer 54L can be formed as a single continuous layer. As used herein, a first surface and a second surface are "vertically coincident" if the second surface overlies or underlies the first surface and if there exists a vertical plane including the first surface and the second surface.

In another embodiment, the sacrificial material layers 42 can be laterally recessed with respect to the sidewalls of the insulating layers 32, and a combination of a deposition process and an anisotropic etch process can be employed to form the continuous charge storage layer 54L as a plurality of memory material portions that are vertically spaced apart.

While the present disclosure is described employing an embodiment in which the continuous charge storage layer 54L is a single continuous layer, embodiments are expressly contemplated herein in which the continuous charge storage layer 54L is replaced with a plurality of memory material portions (which can be charge trapping material portions or electrically isolated conductive material portions) that are vertically spaced apart.

The continuous charge storage layer 54L can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the continuous charge storage layer 54L may comprise an insulating charge trapping material, such as one or more silicon nitride segments. Alternatively, the continuous charge storage layer 54L may comprise conductive nanoparticles such as metal nanoparticles, which can be, for example, ruthenium nanoparticles. The continuous charge storage layer 54L can be formed, for example, by chemical vapor deposition (CVD), atomic layer deposition (ALD), physical vapor deposition (PVD), or any suitable deposition technique for storing electrical charges therein. The thickness of the continuous charge storage layer 54L can be in a range from 2 nm to 20 nm, although lesser and greater thicknesses can also be employed.

The continuous tunneling dielectric layer 56L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The continuous tunneling dielectric layer 56L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the continuous tunneling dielectric layer 56L can include a stack of a first silicon oxide layer, a silicon oxynitride layer, and a second silicon oxide layer, which is commonly known as an ONO stack. In one embodiment, the continuous tunneling dielectric layer 56L can include a silicon oxide layer that is substantially free of carbon or a silicon oxynitride layer that is substantially free of carbon. The thickness of the continuous tunneling dielectric layer 56L can be in a range from 2 nm to 20 nm, although lesser and greater thicknesses can also be employed.

The semiconductor channel material layer 611L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 611L includes amorphous silicon or polysilicon. The semiconductor channel material layer 611L can be formed by a conformal deposition method such as low pressure chemical vapor deposition (LPCVD). The thickness of the semiconductor channel material layer 611L can be in a range from 2 nm to 20 nm, although lesser and greater thicknesses can also be employed. The semiconductor channel material layer 611L can have a doping of a first conductivity type at a dopant concentration in a range from $1.0 \times 10^{14}/cm^3$ to $3.0 \times 10^{17}/cm^3$. A memory cavity 49' is formed in the volume of each memory opening 49 that is not filled with the deposited material layers (50L, 611L).

Referring to FIG. 5C, a dielectric material such as undoped silicate glass, a doped silicate glass, or organosilicate glass can be deposited in the memory cavities 49' and unfilled volumes of the support openings 19 by a conformal or non-conformal deposition method. The dielectric material can be vertically recessed by a recess etch process such that remaining portions of the dielectric material have top surfaces between the horizontal plane including the top surface of the insulating cap layer 70 and the horizontal plane including the bottom surface of the insulating cap layer 70. Each remaining portion of the dielectric material constitutes a dielectric core 62. A recess cavity is present above each dielectric core 62.

Figure 6A:
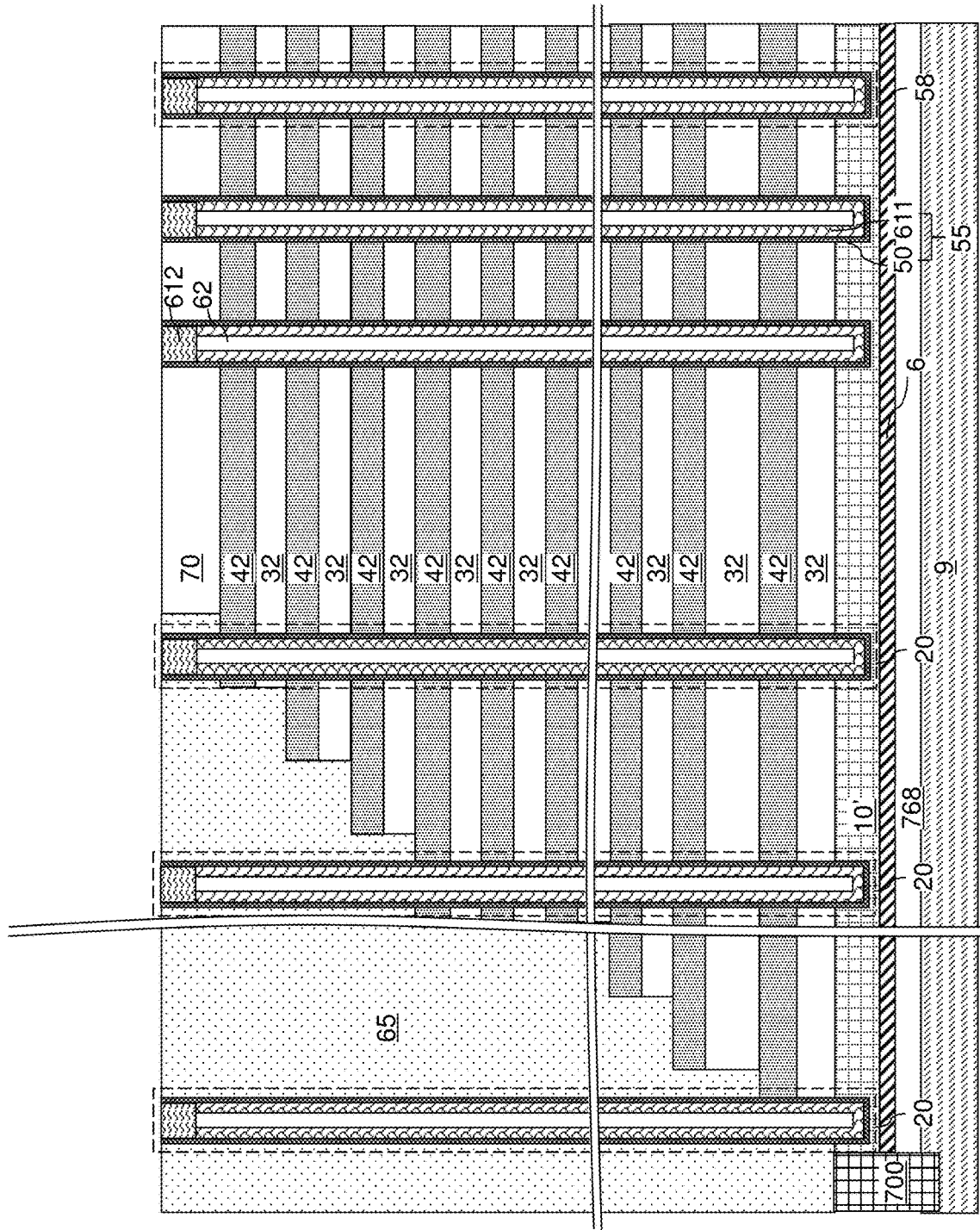
FIG. 6A is a vertical cross-sectional view of the exemplary structure after formation of memory opening fill structures according to an embodiment of the present disclosure.
Figure 6B:
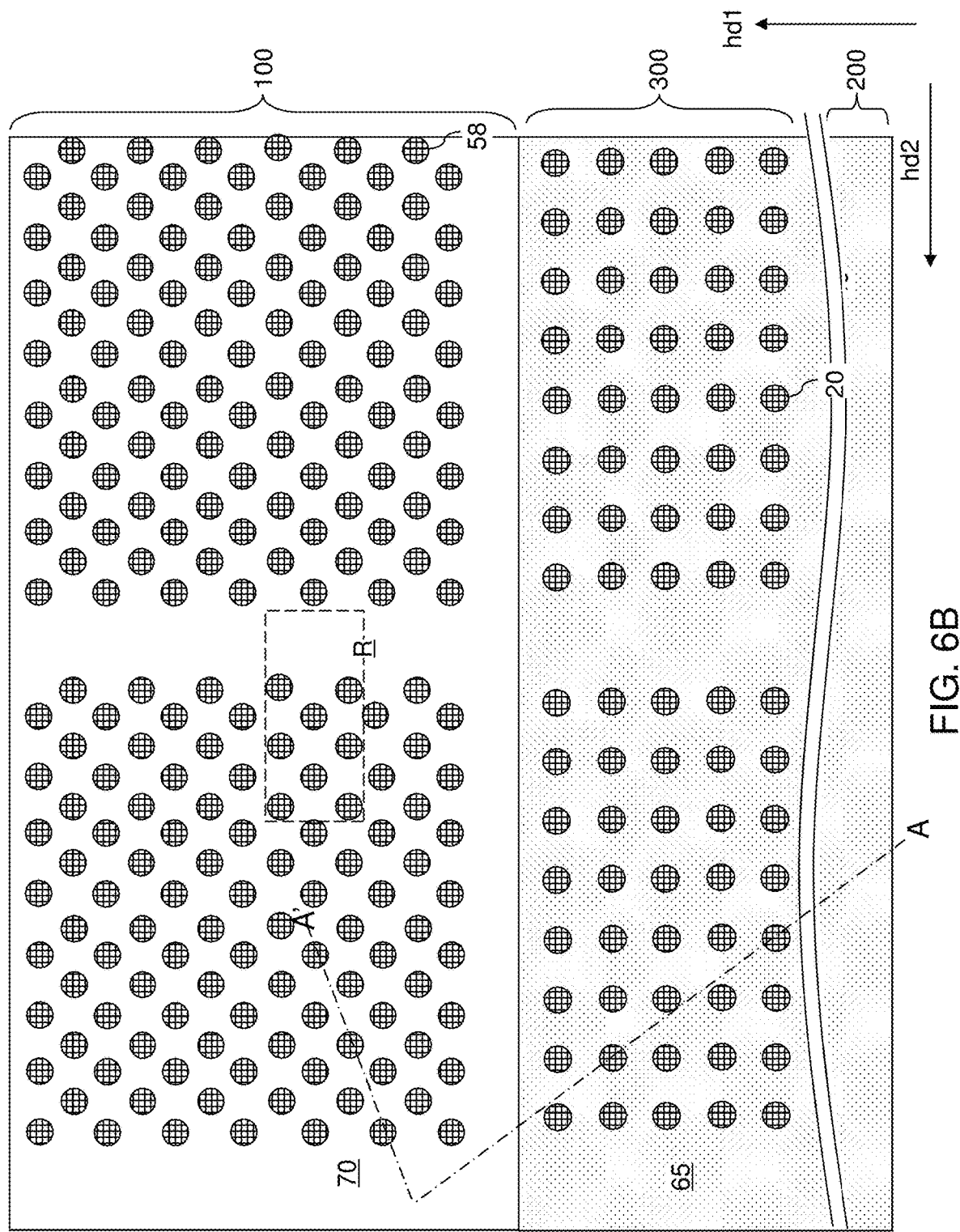
FIG. 6B is a top-down cross-sectional view of the exemplary structure of FIG. 6A. The horizontal plane A-A' is the plane of the horizontal cross-sectional view of FIG. 6A.

Referring to FIGS. 5D, 6A, and 6B, a sacrificial material portion 612 can be formed in the recess cavities by deposition of a sacrificial material. In one embodiment, the sacrificial material can be a semiconductor material having a doping of the first conductivity type, i.e., the conductivity type of the semiconductor channel material layer 611L. Excess portions of the sacrificial material and horizontal portions of the continuous memory film 50L can be removed from above the horizontal plane including the top surface of the insulating cap layer 70. Each remaining portion of the sacrificial material constitutes a sacrificial material portion 612. In one embodiment, the sacrificial material portions 612 can include polysilicon or amorphous silicon having a doping of the first conductivity type. Each remaining portion of the semiconductor channel material layer 611L located in a respective memory opening 49 or in a respective support opening 19 constitutes a memory-level semiconductor channel 611. Each remaining portion of the continuous memory film 50L located in a respective memory opening 49 or in a respective support opening 19 constitutes a memory film 50.

Each discrete remaining portion of the continuous blocking dielectric layer 52L constitutes a blocking dielectric layer 52. Each discrete remaining portion of the continuous charge storage layer 54L constitutes a charge storage layer 54. Each discrete remaining portion of the continuous tunneling dielectric layer 56L constitutes a tunneling dielectric layer 56. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each contiguous combination of a memory-level semiconductor channel 611 and a memory film 50 in a memory opening 49 constitutes a memory stack structure 55. Each memory stack structure 55 is formed through the alternating stack (32, 42). Each contiguous combination of a memory stack structure 55, a dielectric core 62, and a sacrificial material portion 612 fills a respective memory opening 49, and constitutes a memory opening fill structure 58. Each contiguous combination of a memory film 50, a memory-level semiconductor channel 611, a dielectric core 62, and a sacrificial material portion 612 that fills a support opening 19 constitutes a support opening fill structure 20. The memory stack structures 55 can be arranged in clusters. In one embodiment, the memory stack structures 55 in a cluster can be arranged as a two-dimensional hexagonal array having a two-dimensional periodicity.

Figure 7C:
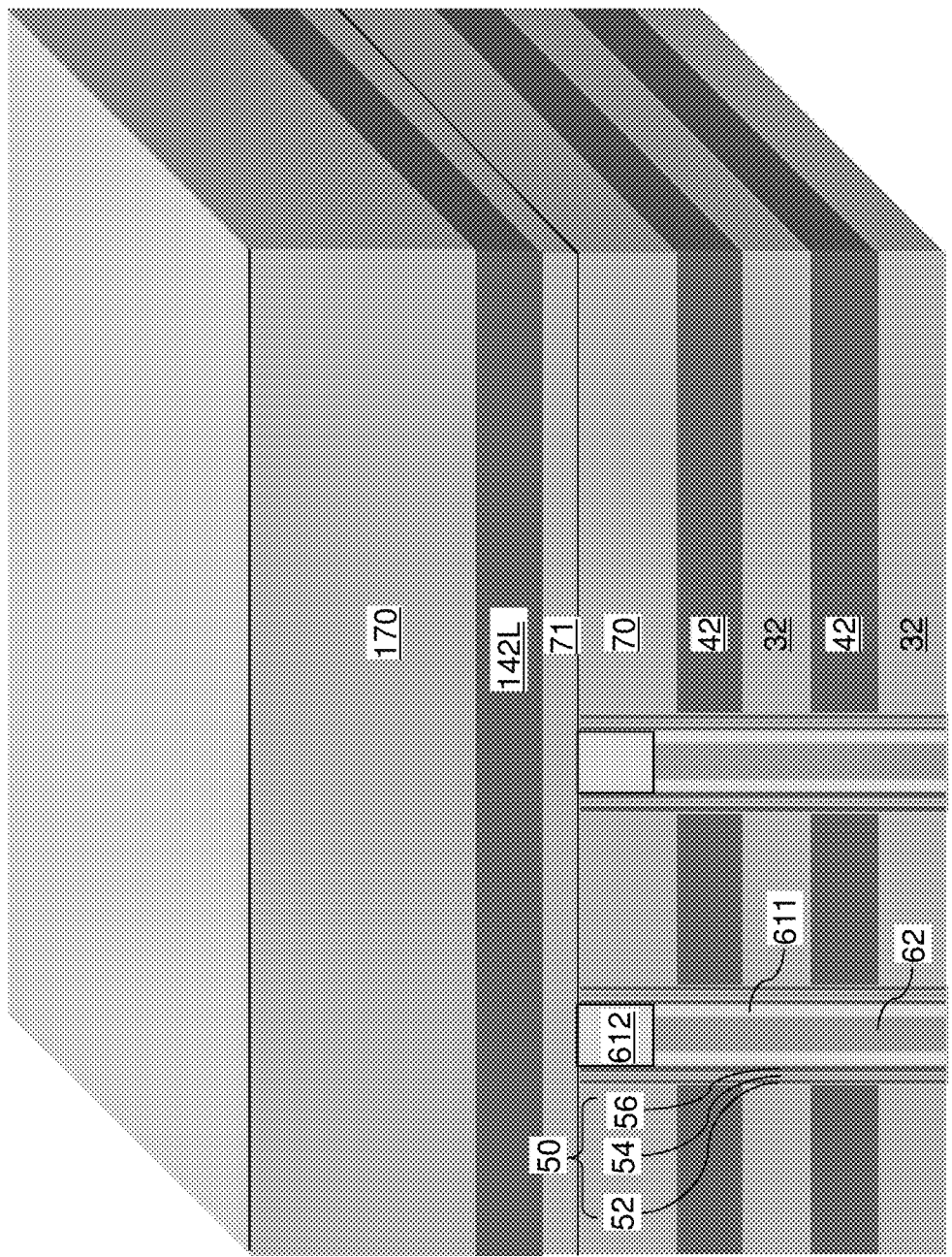
FIG. 7C is a perspective view of the region of FIGS. 7A and 7B.

Referring to FIGS. 7A-7C, a planar insulating spacer layer 71, a drain-select-level sacrificial material layer 142L, and a sacrificial matrix layer 170 are sequentially formed on the top surface of the insulating cap layer 70, the memory opening fill structures 58, and the support opening fill structures 20. FIG. 7A is a top-down view of a region corresponding to the region R of FIG. 6B.

The planar insulating spacer layer 71 is formed over the memory opening fill structures 58. The planar insulating spacer layer 71 has a homogeneous composition throughout, and is formed directly on top surfaces of the memory films 50. The planar insulating spacer layer 71 includes a dielectric material such as silicon oxide, and can have a thickness in a range from 20 nm to 200 nm, although lesser and greater thicknesses can also be employed.

The drain-select-level sacrificial material layer 142L is formed directly on a top surface of the planar insulating spacer layer 71. The drain-select-level sacrificial material layer 142L includes a dielectric material that is not a dielectric metal oxide material. In one embodiment, the drain-select-level sacrificial material layer 142L can include the same material as the sacrificial material layers 42. In one embodiment, the drain-select-level sacrificial material layer 142L can include silicon nitride. The thickness of the drain-select-level sacrificial material layer 142L can be in a range from 2 nm to 50 nm, although lesser and greater thicknesses can also be employed.

The sacrificial matrix layer 170 is formed over the planar insulating spacer layer 71. The sacrificial matrix layer 170 includes a material that is different from the material of the drain-select-level sacrificial material layer 142L. For example, the sacrificial matrix layer 170 can include silicon oxide. The thickness of the sacrificial matrix layer 170 can be in a range from 20 nm to 400 nm, such as from 40 nm to 200 nm, although lesser and greater thicknesses can also be employed.

Figure 8C:
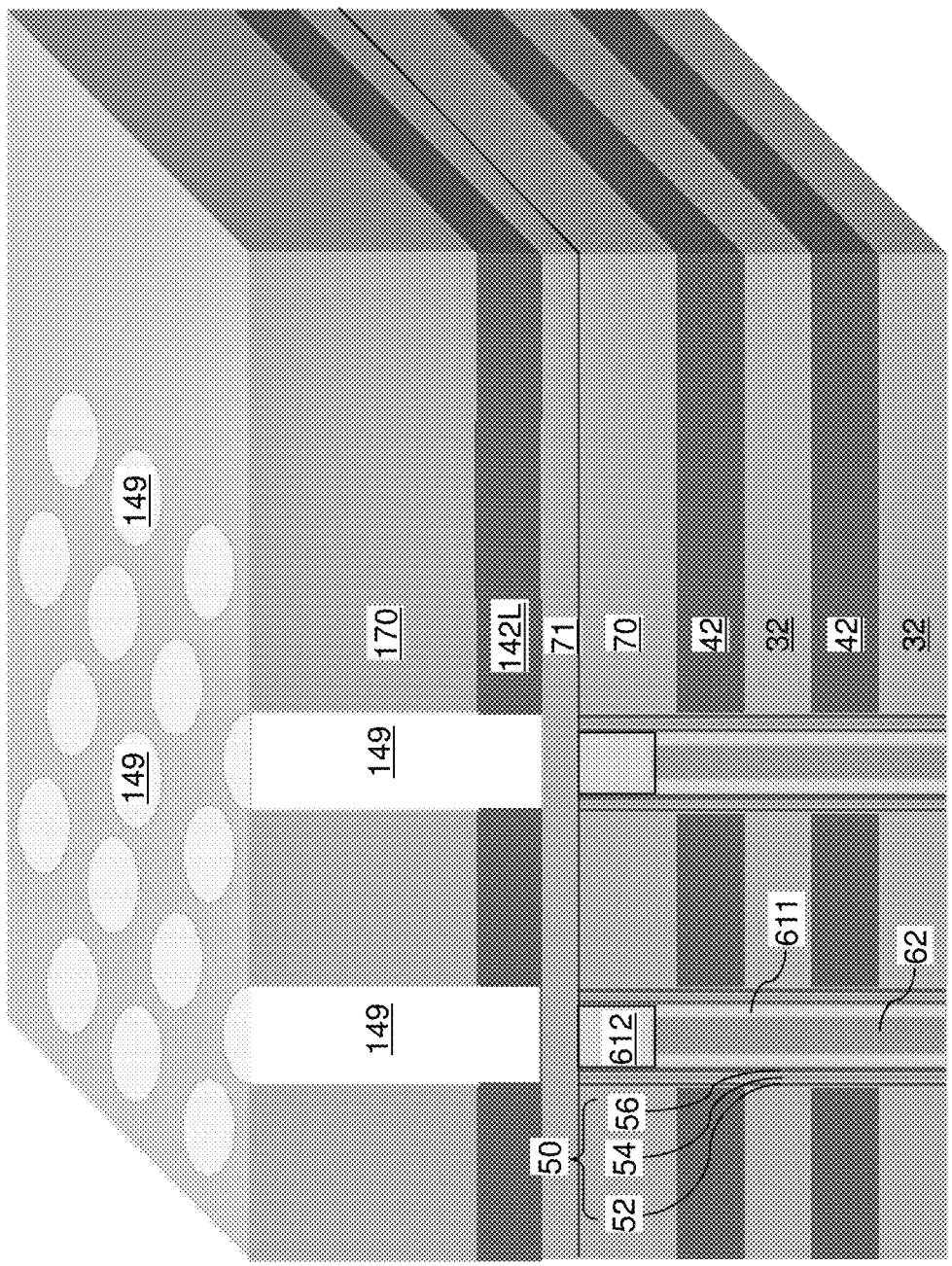
FIG. 8C is a perspective view of the region of FIGS. 8A and 8B.

Referring to FIGS. 8A-8C, drain-select-level openings 149 are formed through the sacrificial matrix layer 170 and the drain-select-level sacrificial material layer 142L. An anisotropic etch process is employed, which can include a first etch step that etches the material of the sacrificial matrix layer 170 selective to the material of the drain-select-level sacrificial material layer 142L (for example, by etching silicon oxide selective to silicon nitride), and a second etch step that etches the material of the drain-select-level sacrificial material layer 142L selective to the material of the planar insulating spacer layer 71 (for example, by etching silicon nitride selective to silicon oxide). The drain-select-level openings 149 can have the same pattern as the memory openings 49, and thus, can have the same pattern as the memory opening fill structures 58. In one embodiment, the drain-select-level openings 149 can have cylindrical shapes, in which case the drain-select-level opening 149 can be drain-select-level cylindrical openings.

In one embodiment, the drain-select-level openings 149 can be arranged in rows that extend along the first horizontal direction hd1, and a row-to-row pitch p can be the same for each neighboring pairs of rows of the drain-select-level openings 149. In one embodiment, the drain-select-level openings 149 are arranged as a two-dimensional hexagonal array, and the memory stack structures 55 are arranged as another two-dimensional hexagonal array having a same two-dimensional periodicity as the two-dimensional hexagonal array of the drain-select-level openings 149.

Figure 9C:
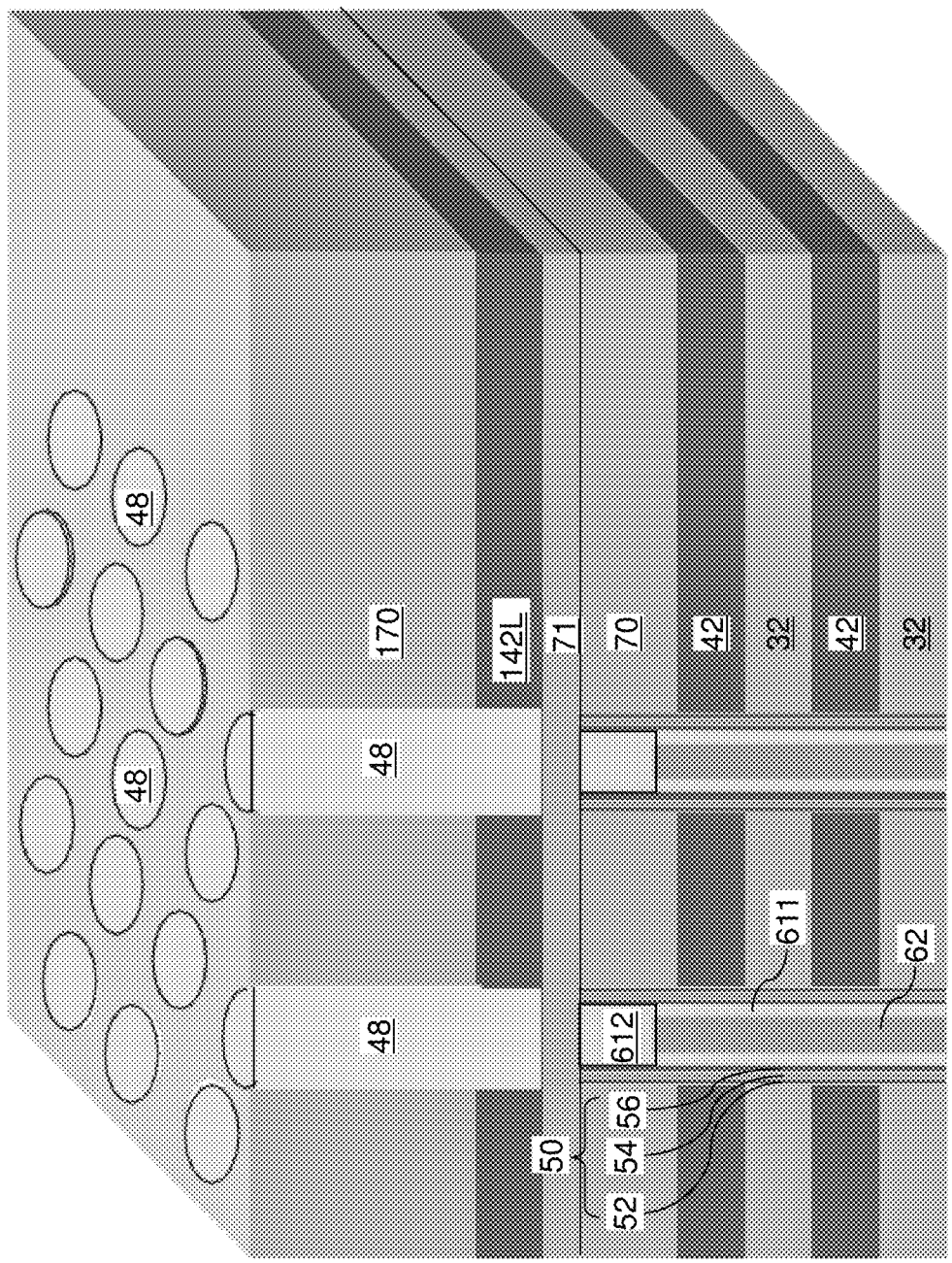
FIG. 9C is a perspective view of the region of FIGS. 9A and 9B.

Referring to FIGS. 9A-9C, sacrificial pillar structures 48 can be formed in the drain-select-level openings 149 by conformal deposition and etchback of a sacrificial fill material. The drain-select-level openings 149 can be filled with the sacrificial fill material during the conformal deposition process, and excess portions of the sacrificial fill material can be removed from above the sacrificial matrix layer 170 by a recess etch. The sacrificial fill material is a material that can be removed selective to the materials of the sacrificial matrix layer 170, the drain-select-level sacrificial material layer 142L, and the planar insulating spacer layer 71. In one embodiment, the sacrificial pillar structures 48 can include a semiconductor material such as amorphous silicon or polysilicon. The top surfaces of the sacrificial pillar structures 48 can be substantially coplanar with the top surface of the sacrificial matrix layer 170. The sacrificial pillar structures 48 are formed through the sacrificial matrix layer 170 and the drain-select-level sacrificial material layer 142L.

Figure 10C:
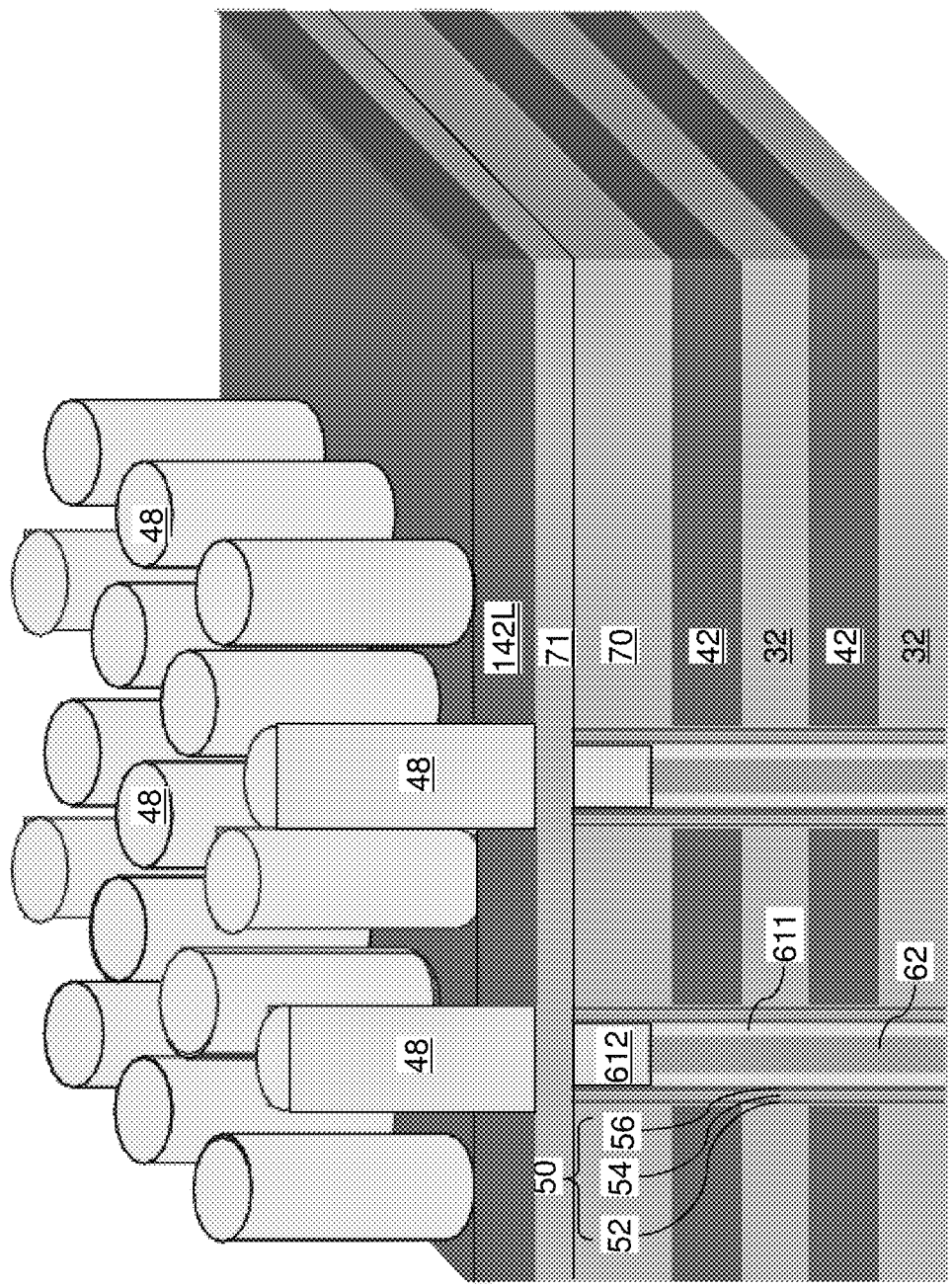
FIG. 10C is a perspective view of the region of FIGS. 10A and 10B.

Referring to FIGS. 10A-10C, the sacrificial matrix layer 170 can be removed selective to the sacrificial pillar structures 48 and the drain-select-level sacrificial material layer 142L. For example, if the sacrificial matrix layer 170 includes silicon oxide, the sacrificial pillar structures 48 include amorphous silicon, and the drain-select-level sacrificial material layer 142L include silicon nitride, a wet etch process employing hydrofluoric acid may be employed to remove the sacrificial matrix layer 170 selective to the sacrificial pillar structures 48 and the drain-select-level sacrificial material layer 142L.

Figure 11C:
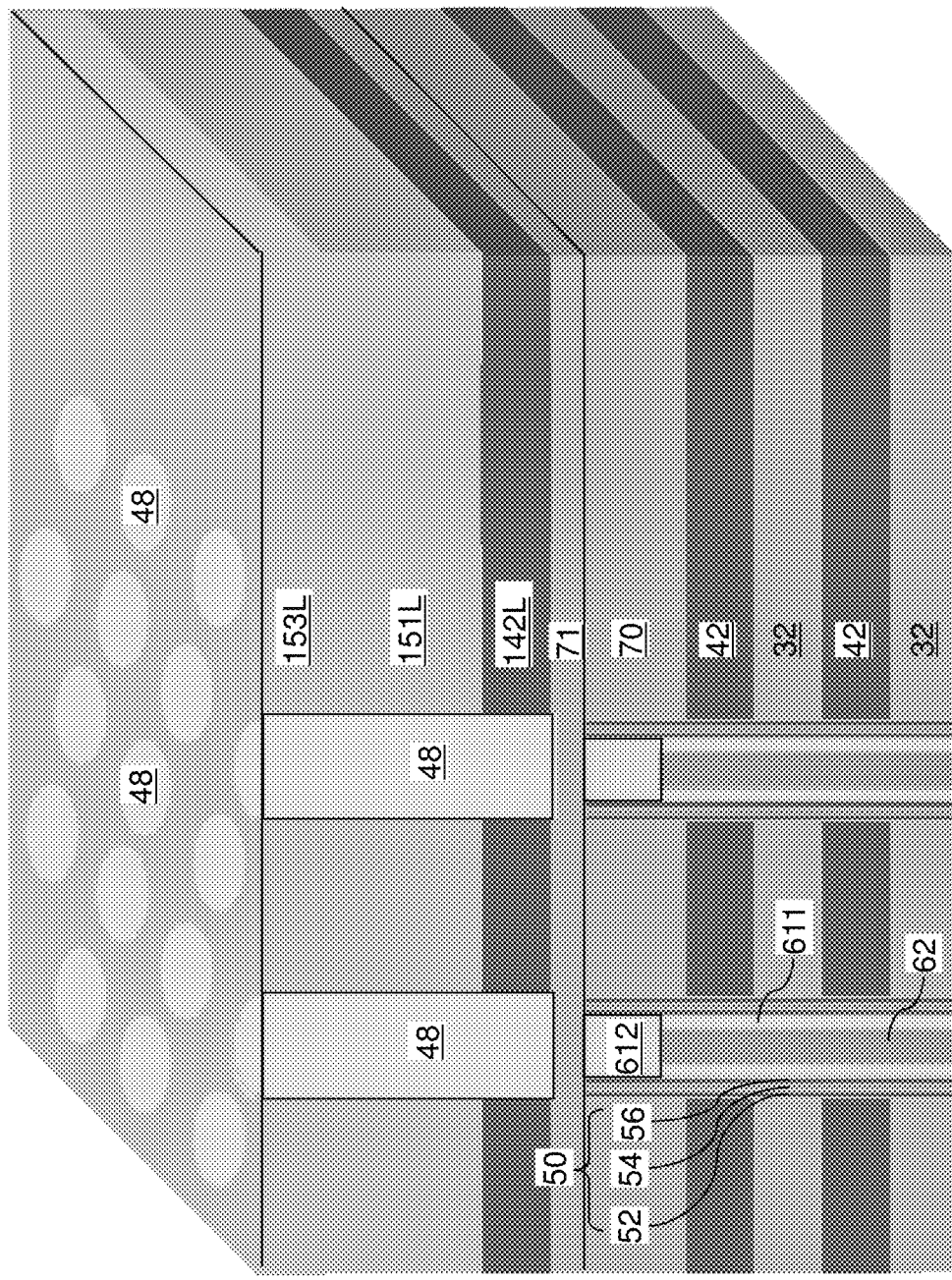
FIG. 11C is a perspective view of the region of FIGS. 11A and 11B.

Referring to FIGS. 11A-11C, at least one sacrificial template material layer (151L, 153L) is formed over the drain-select-level sacrificial material layer 142L. Thus, the sacrificial matrix layer 170 is replaced with the at least one sacrificial template material layer (151L, 153L). In one embodiment, each of the at least one sacrificial template material layer (151L, 153L) can include a respective self-planarizing material or a respective planarizable material that can be planarized by chemical mechanical planarization. In one embodiment, each of the at least one sacrificial template material layer (151L, 153L) can include a respective self-planarizing material that can be applied by spin coating. In one embodiment, the at least one sacrificial template material layer (151L, 153L) can include a first sacrificial template material layer 151L and a second sacrificial template material layer 153L. In one embodiment, the first sacrificial template material layer 151L can be formed by applying a spin-on-carbon (SOC) material. Upon curing, the first sacrificial template material layer 151L can include amorphous carbon. The second sacrificial template material layer 153L can be formed by applying a spin-on-glass (SOG) material. Upon curing, the second sacrificial template material layer 150 can include silicon oxide. The top surface of the second sacrificial template material layer 153L can be at, or below, the top surfaces of the sacrificial pillar structures 48. Thus, the top surfaces of the sacrificial pillar structures 48 can be physically exposed after formation of the second sacrificial template material layer 153L.

Figure 12C:
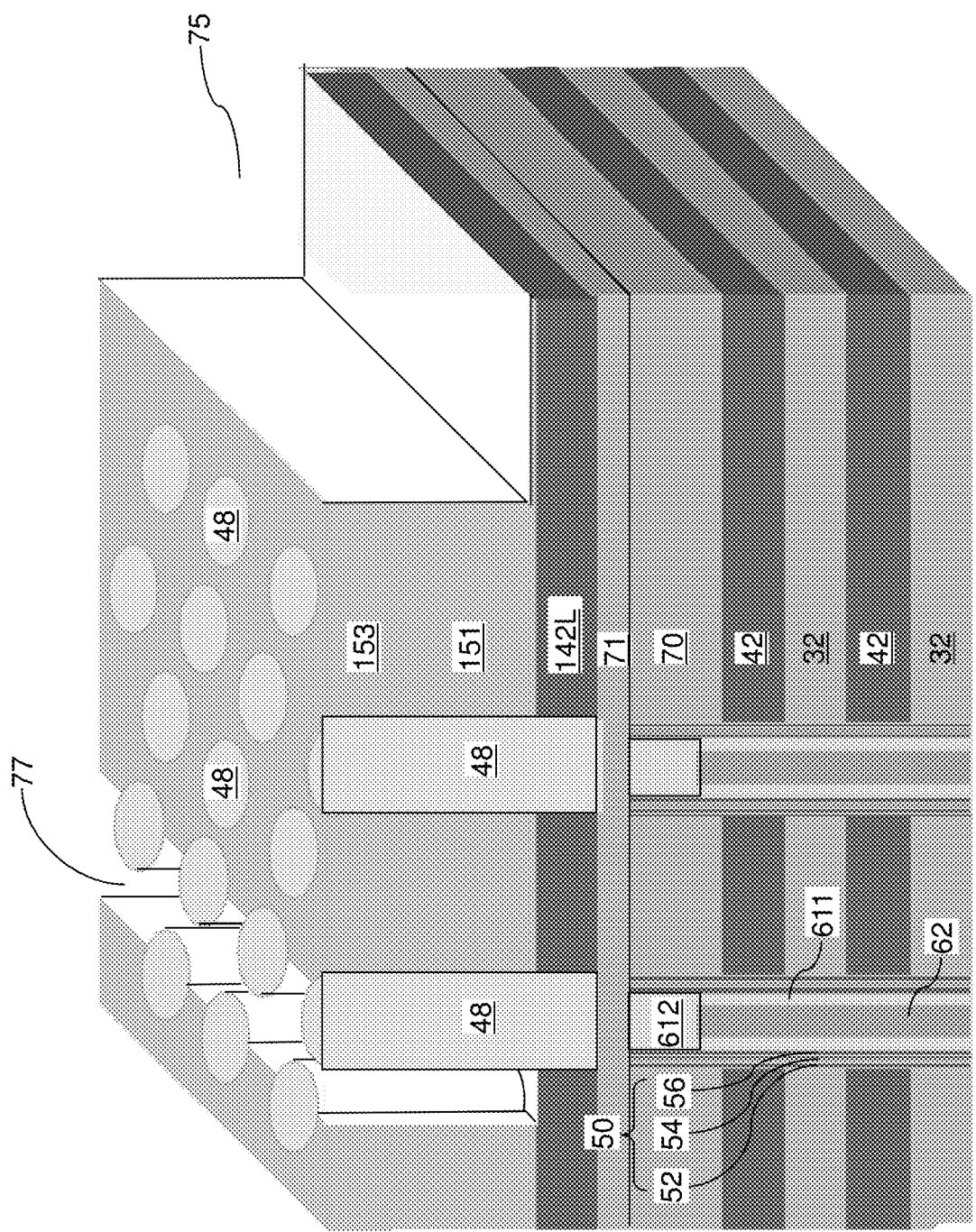
FIG. 12C is a perspective view of the region of FIGS. 12A and 12B.

Referring to FIGS. 12A-12C, a photoresist layer 217 can be applied over the exemplary structure and can be lithographically patterned to cover areas corresponding to areas of drain-select-level gate electrodes to be subsequently formed. The photoresist layer 217 is not shown in FIG. 12C for clarity. For example, a plurality of rectangular areas having a pair of lengthwise edges extending along the first horizontal direction hd1 can be covered by the patterned photoresist layer 217. The patterned photoresist layer 217 includes rectangular openings of a uniform width w and rectangular openings of a greater width. The uniform width w can be less than twice the row-to-row pitch p of rows of sacrificial pillar structures 48 that laterally extend along the first horizontal direction hd1. In one embodiment, the uniform width w can be about, or less than, the row-to-row pitch of rows of sacrificial pillar structures 48. The rectangular openings of the greater width can be located in areas located between clusters of memory stack structures 55 and subsequently employed to form backside trenches. Edges of the patterned photoresist layer 217 that are adjacent to the rectangular openings of the uniform width can overlie a subset of the sacrificial pillar structures 48. Edges of the patterned photoresist layer 217 that are adjacent to the rectangular openings of the greater width can be laterally offset from the sacrificial pillar structures 48.

Physically exposed portions of the at least one sacrificial template material layer (151L, 153L) can be anisotropically etched into the sacrificial template structures (151, 153) employing a combination of the patterned photoresist layer 217 and the sacrificial pillar structures 48 as an etch mask. Physically exposed portions of the at least one sacrificial template material layer (151L, 153L) can be anisotropically etched. An anisotropic etch process can be employed, which includes a first step that etches the material of the second sacrificial template material layer 153L and a seconds step that etches the material of the first sacrificial template material layer 151L. For example, the first etch step can include an etch chemistry that etches silicon oxide selective to the semiconductor material of the sacrificial pillar structures 48, and the second etch step can include an etch chemistry that etches carbon selective to the semiconductor material of the sacrificial pillar structures 48.

First laterally-extending trenches 77 are formed in the areas that underlie the openings of the uniform width w. Each first laterally-extending trench 77 includes a pair of lengthwise sidewalls that generally extend along the first horizontal direction hd1. Each lengthwise sidewall of the first laterally-extending trenches 77 can include a laterally alternating sequence of straight vertical sidewall segments and convex vertical sidewall segments. The straight vertical sidewall segments are vertical sidewall segments of a sacrificial template structure (151 153). Each sacrificial template structure (151, 153) can include an upper sacrificial template portion 153 that is a patterned portion of the second sacrificial template material layer 153L and a lower sacrificial template portion 151 that is a patterned portion of the first sacrificial template material layer 151L. The convex vertical sidewall segments are convex cylindrical sidewall segments of a row of sacrificial pillar structures 48. Second laterally-extending trenches 75 are formed in the areas that underlie the openings of the greater width. Each second laterally-extending trench 75 can include a pair of straight sidewalls that laterally extend along the first horizontal direction hd1. Each straight sidewall of the second laterally-extending trenches 75 can be a sidewall of a respective one of the sacrificial template structures (151, 153). The photoresist layer 217 can be subsequently removed, for example, by ashing.

Figure 13A:
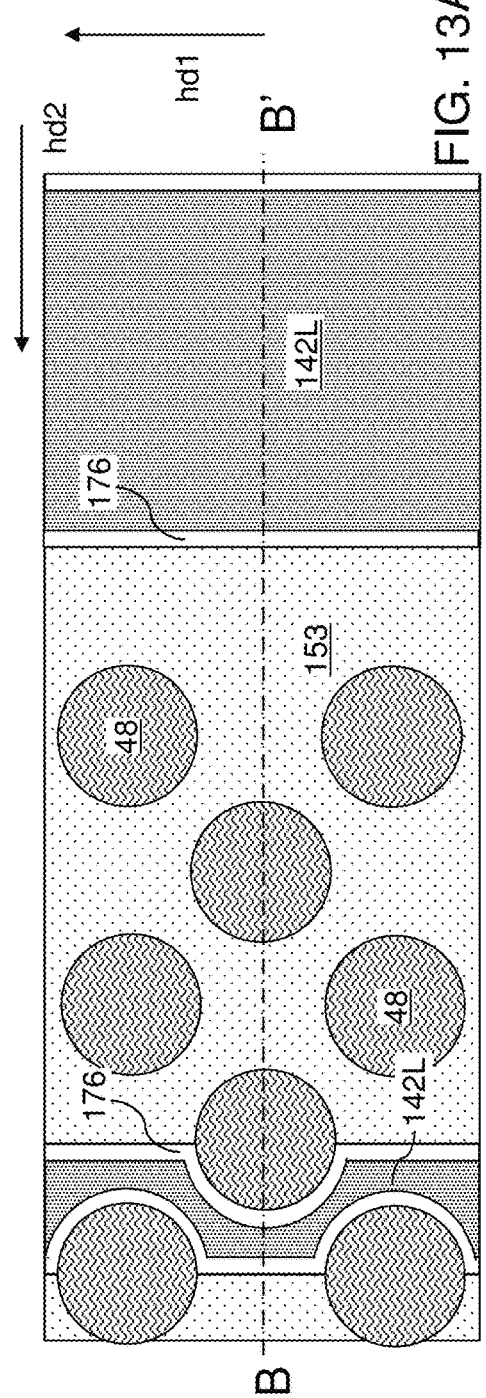
FIG. 13A is a top-down view of a region of the exemplary structure after formation of dielectric spacer liners according to an embodiment of the present disclosure.
Figure 13B:
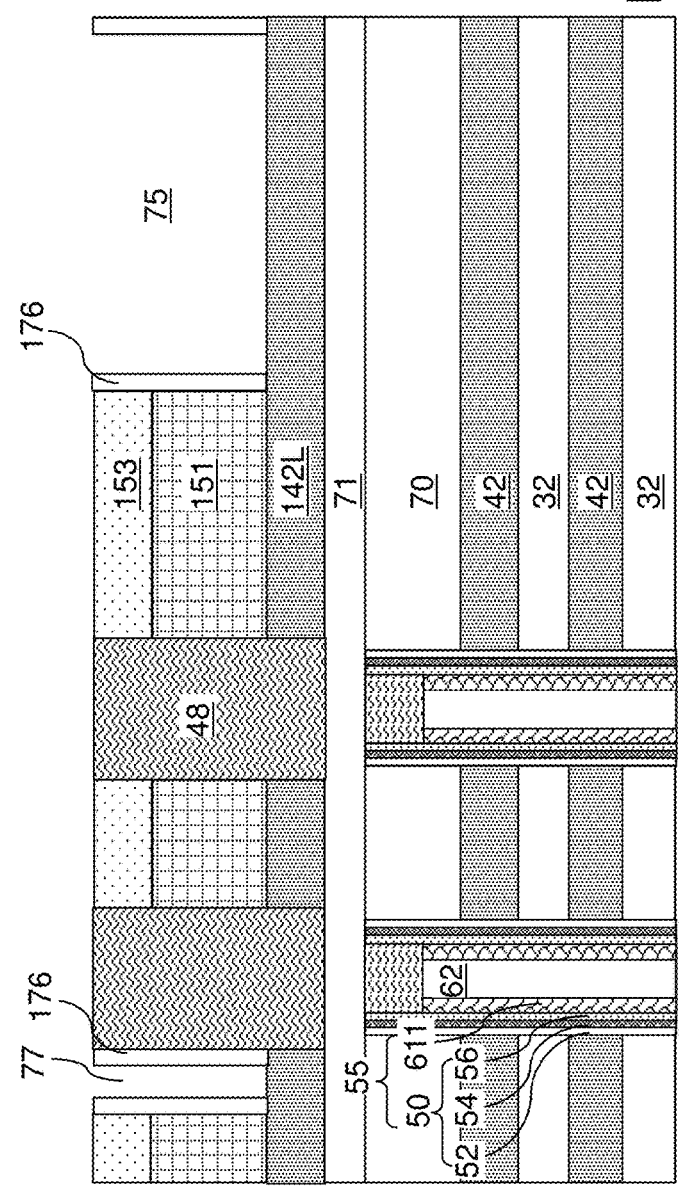
FIG. 13B is a vertical cross-sectional view along the vertical plane B-B' of FIG. 13A.

Referring to FIGS. 13A and 13B, a conformal dielectric spacer layer can be deposited in the laterally-extending trenches (77, 75), and can be anisotropically etched to form dielectric spacer liners 176. The dielectric spacer liners 176 includes a dielectric material such as silicon oxide. In one embodiment, the dielectric spacer liners 176 can include a silicon oxide material formed by thermal decomposition of tetraethylorthosilicate (TEOS). The thickness of the dielectric spacer liners 176 can be in a range from 1 nm to 10 nm, such as from 2 nm to 6 nm, although lesser and greater thicknesses can also be employed. Each of the laterally-extending trenches (77, 75) can be lined with a respective dielectric spacer liner 176. Each first laterally-extending trench 77 includes a pair of lengthwise sidewalls. Each lengthwise sidewall of the first laterally-extending trenches 77 includes a laterally alternating sequence of vertical sidewall segments and convex cylindrical sidewall segments of a respective dielectric spacer liner 176. Each lengthwise sidewall of the second laterally-extending trenches 75 includes a pair of lengthwise sidewalls of a respective dielectric spacer liner 176.

Figure 27A:
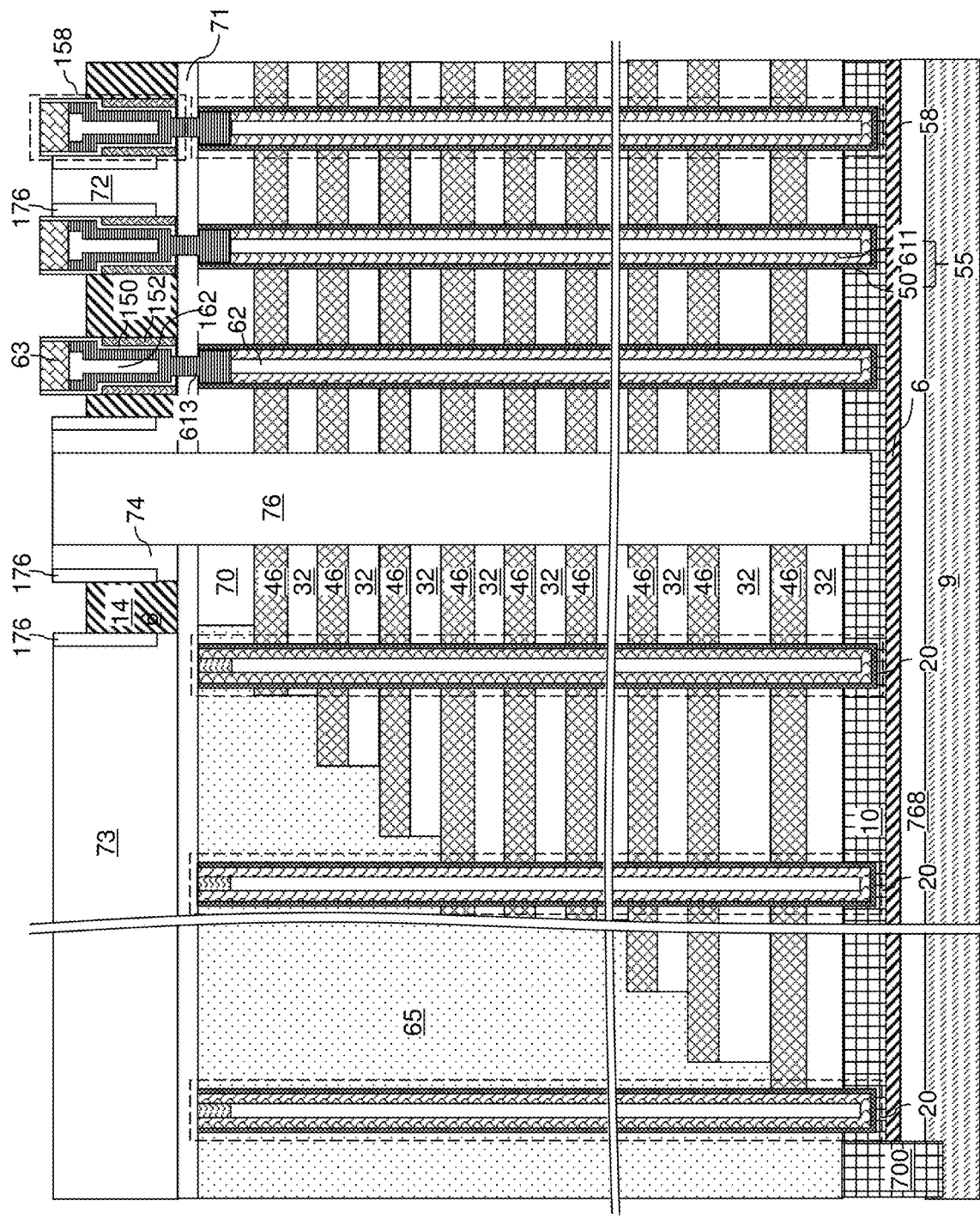
FIG. 27A is a top-down view of the exemplary structure after formation of drain-select-level gate electrodes according to an embodiment of the present disclosure.
Figure 27B:
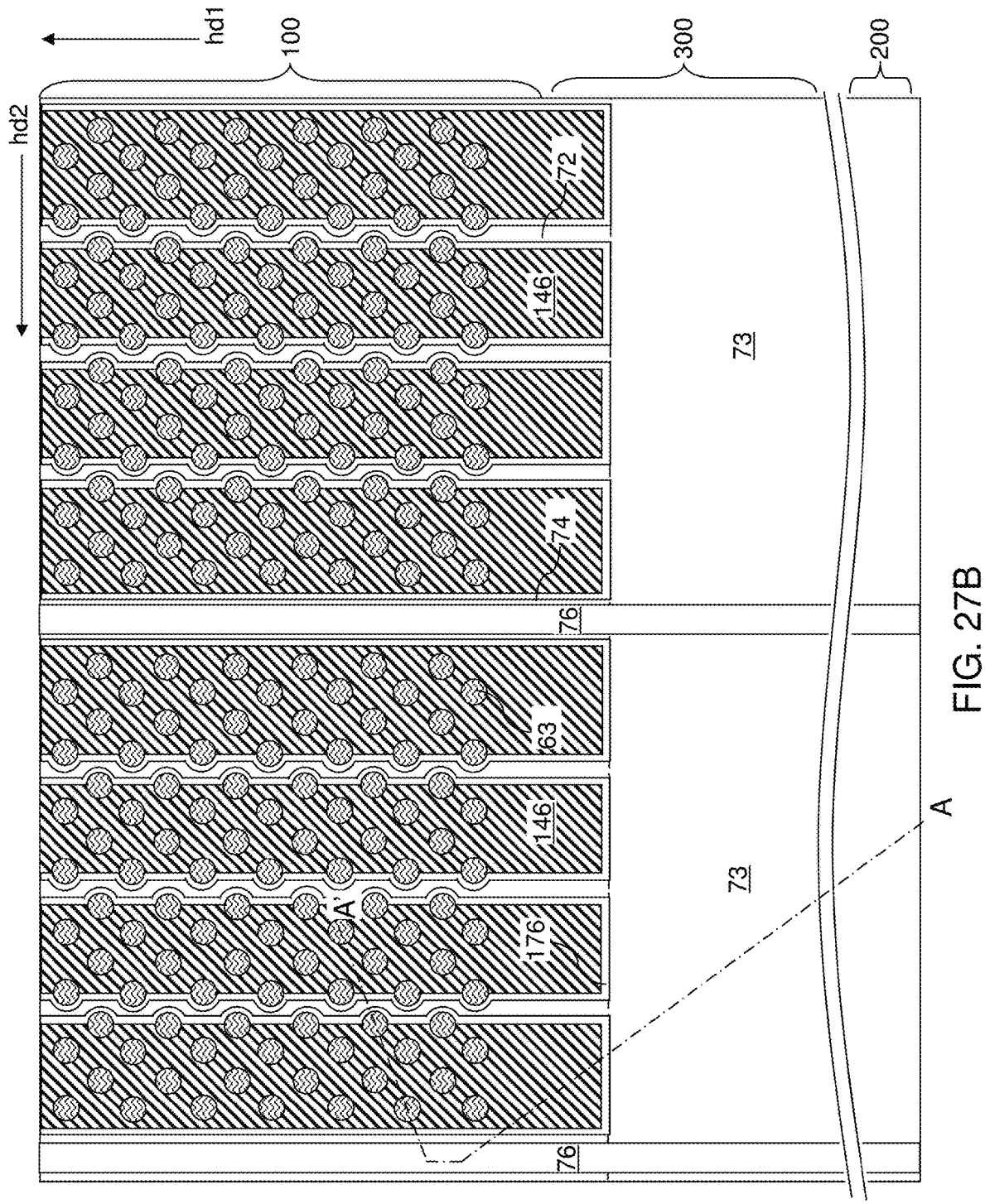
FIG. 27B is a top-down view of the exemplary structure of FIG. 27A. The hinged vertical cross-sectional plane A-A' is the plane of the vertical cross-sectional view of FIG. 27A.

Referring to FIGS. 14A and 14B, and anisotropic etch process can be performed to etch physically exposed portions of the drain-select-level sacrificial material layer 142L. A top surface of the planar insulating spacer layer 71 can be physically exposed at the bottom of each laterally-extending trench (77, 75). In one optional embodiment, portions of the drain-select-level sacrificial material layer 142L underlying the planar insulating spacer layer 71 may be laterally undercut by introducing an isotropic etch component to the anisotropic etch process, as shown in FIG. 14B. The undercut provides a straight sidewall for the drain-select-level gate electrodes 146 that are subsequently formed at the step shown in FIGS. 27A and 27B. Alternatively, the undercut may be omitted. The drain-select-level sacrificial material layer 142L is patterned into drain-select-level sacrificial material portions 142 by anisotropically etching portions of the drain-select-level sacrificial material layer 142L located outside areas of the sacrificial template structures (151, 153) and the sacrificial pillar structures 48.

Figure 15A:
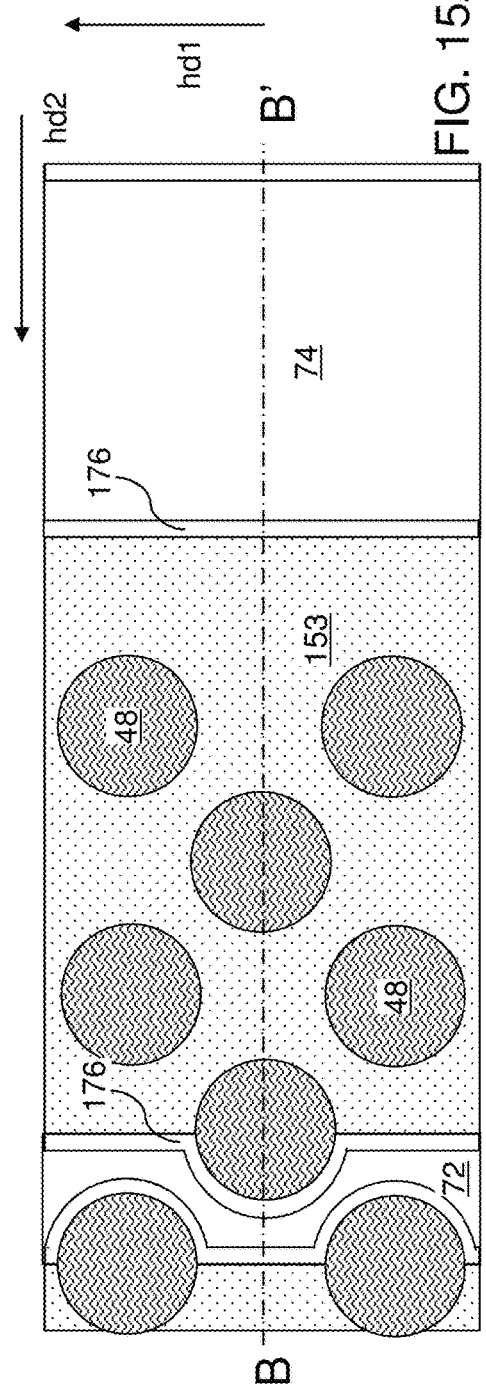
FIG. 15A is a top-down view of a region of the exemplary structure after formation of inter-block dielectric isolation structures and inter-string dielectric isolation structures according to an embodiment of the present disclosure.
Figure 15B:
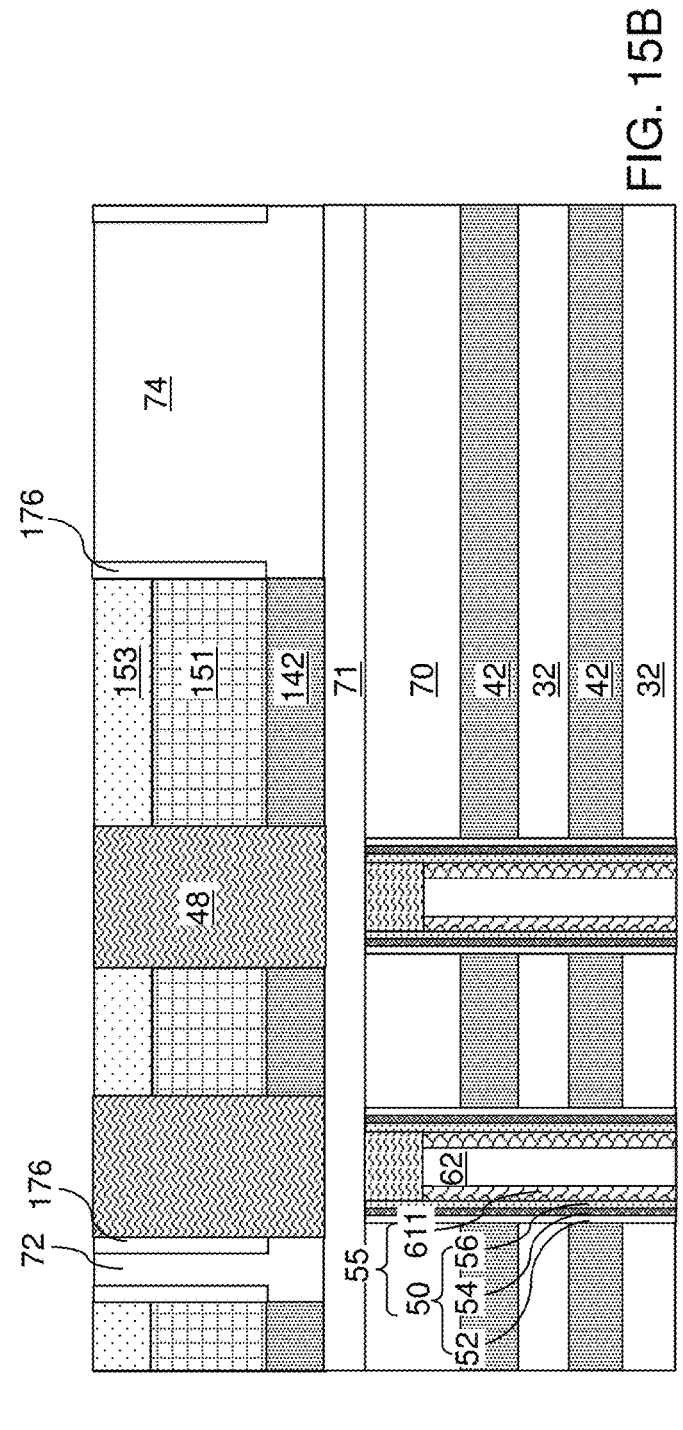
FIG. 15B is a vertical cross-sectional view along the vertical plane B-B' of FIG. 15A.

Referring to FIGS. 15A and 15B, dielectric isolation structures (72, 74) are formed in the laterally-extending trenches (77, 75) by depositing a dielectric material in the laterally-extending trenches (77, 75). The dielectric material can include doped silicate glass, undoped silicate glass, or organosilicate glass. Excess portions of the dielectric material deposited over the top surfaces of the sacrificial template structures (151, 153) can be removed by a planarization process, which can employ a recess etch or chemical mechanical planarization. The dielectric isolation structures deposited in the first laterally-extending trenches 77 laterally separate neighboring strings of memory stack structures 55, and are herein referred to as inter-string dielectric isolation structures 72. The dielectric isolation structures deposited in the second laterally-extending trenches 75 laterally separate blocks of memory stack structures 55, and are herein referred to as inter-block dielectric isolation structures 74. The inter-string dielectric isolation structures 72 and the inter-block dielectric isolation structures 74 can be formed between a respective neighboring pair of sacrificial template structures (151, 153).

Referring to FIGS. 16A and 16B, the sacrificial template structures (151, 153) are removed selective to the sacrificial pillar structures 48, the drain-select-level sacrificial material portions 142, the dielectric spacer liners 176, and the dielectric isolation structures (72, 74). For example, if the upper sacrificial template portions 153 include spin on glass, the upper sacrificial template portions 153 can be removed by a wet etch process that etches spin on glass selective to the material of the sacrificial pillar structures 48, such as amorphous silicon. For example, the etch process may use dilute hydrofluoric acid. If the selectively of the etch process of the spin on glass material of the upper sacrificial template portions 153 versus the silicon oxide material of elements is not high, then upper portions of other exposed silicon oxide elements, such as upper portions of the dielectric spacer liners 176 and the dielectric isolation structures (72, 74) can be optionally collaterally removed (i.e., recessed) during removal of the upper sacrificial template portions 153. Alternatively, if the etch selectivity is sufficiently high, then the recessing can be minimal, which results in the structure shown in FIG. 16B. If the lower sacrificial template portions 151 include carbon, an ashing process can be performed to remove the lower sacrificial template portions 151 selective to the materials of the sacrificial pillar structures 48, the drain-select-level sacrificial material portions 142, the dielectric spacer liners 176, and the dielectric isolation structures (72, 74). Recessed regions formed by removal of the sacrificial template structures (151, 153) are herein referred to as drain-select-level recesses 187. A first subset of the sacrificial pillar structures 48 includes sacrificial pillar structures 48 that contact a respective one of the dielectric spacer liners 176, and a second subset of the sacrificial pillar structures 48 includes sacrificial pillar structures 48 that are encircled by a respective one of the drain-select-level recesses 187.

Referring to FIGS. 17A and 17B, sacrificial fill material portions 181 can be formed within the drain-select-level recesses 187 by deposition and recessing of a sacrificial fill material. The sacrificial fill material can be deposited by a conformal or non-conformal deposition in the drain-select-level recesses 187, and can be optionally planarized. The sacrificial fill material is subsequently recessed such that remaining portions of the sacrificial fill material have top surfaces below the horizontal plane including the top surfaces of the dielectric isolation structures (72, 74). Each remaining portion of the sacrificial fill material constitutes a sacrificial fill material portion 181. The sacrificial fill material portions 181 includes a material that can be removed selective to the materials of the sacrificial pillar structures 48, the planar insulating spacer layer 71, the dielectric spacer liners 176, and the dielectric isolation structures (72, 74). For example, if the planar insulating spacer layer 71, the dielectric spacer liners 176, and the dielectric isolation structures (72, 74) include silicon oxide, the sacrificial fill material portions 181 can include silicon nitride. The drain-select-level sacrificial material portions 142 and the sacrificial fill material portions 181 may include the same material, or may include different materials.

Subsequently, sacrificial cap material portions 183 can be formed above the sacrificial fill material portions 181 by deposition and planarization of a dielectric material. The dielectric material is different from the materials of the sacrificial material layers 42. For example, if the sacrificial material layers 42 include silicon nitride, the dielectric material deposited to form the sacrificial cap material portions 183 can include silicon oxide. The dielectric material can be deposited in the unfilled volumes of the drain-select-level recesses 187, and excess portions of the dielectric material can be removed from above the horizontal plane including the top surfaces of the dielectric isolation structures (72, 74). Each remaining portions of the dielectric material constitutes a sacrificial cap material portion 183. If the upper portions of the dielectric spacer liners 176 and the dielectric isolation structures (72, 74) are recessed during the etching step of FIG. 16B, then the sacrificial cap material portion 183 can also be located on top of the upper portions of the dielectric spacer liners 176 and the dielectric isolation structures (72, 74). If the sacrificial cap material portion 183, the dielectric spacer liners 176 and the dielectric isolation structures (72, 74) all comprise silicon oxide having the same composition, then they can form a contiguous silicon oxide structure.

Referring to FIGS. 18A and 18B, the sacrificial pillar structures 48 can be removed selective to the sacrificial cap material portions 183, the sacrificial fill material portions 181, the dielectric isolation structures (72, 74), the planar insulating spacer layer 71, and the drain-select-level sacrificial material layer 142. For example, if the sacrificial pillar structures 48 include a semiconductor material, such as amorphous silicon, then the sacrificial pillar structures 48 can be removed by performing a wet etch process employing hot trimethyl-2 hydroxyethyl ammonium hydroxide ("hot TMY") or tetramethyl ammonium hydroxide (TMAH). Drain-select-level openings 149 are re-formed in volumes from which the sacrificial pillar structures 48 are removed.

Referring to FIGS. 19A and 19B, a conformal conductive material layer can be deposited in the drain-select-level openings 149 by a conformal deposition process. The conformal conductive material layer can be anisotropically etched employing an anisotropic etch process. Remaining cylindrical portions of the conformal conductive material layer constitute cylindrical gate electrodes 152. The cylindrical gate electrodes 152 may include a metallic material such as TiN, TaN, or WN, and/or may include a heavily doped semiconductor material such as heavily p-doped silicon or heavily n-doped silicon. In case a heavily doped semiconductor material is employed for the cylindrical gate electrodes 152, the heavily doped semiconductor material may be polycrystalline, or may be amorphous as deposited and may be subsequently converted into polysilicon. The lateral thickness of each vertical portion of the cylindrical gate electrodes 152 can be in a range from 2 nm to 20 nm, such as from 4 nm to 12 nm, although lesser and greater thicknesses can also be employed. An overetch may be performed during the anisotropic etch process that forms the cylindrical gate electrodes 152 to vertically trim the cylindrical gate electrodes 152.

Figure 20A:
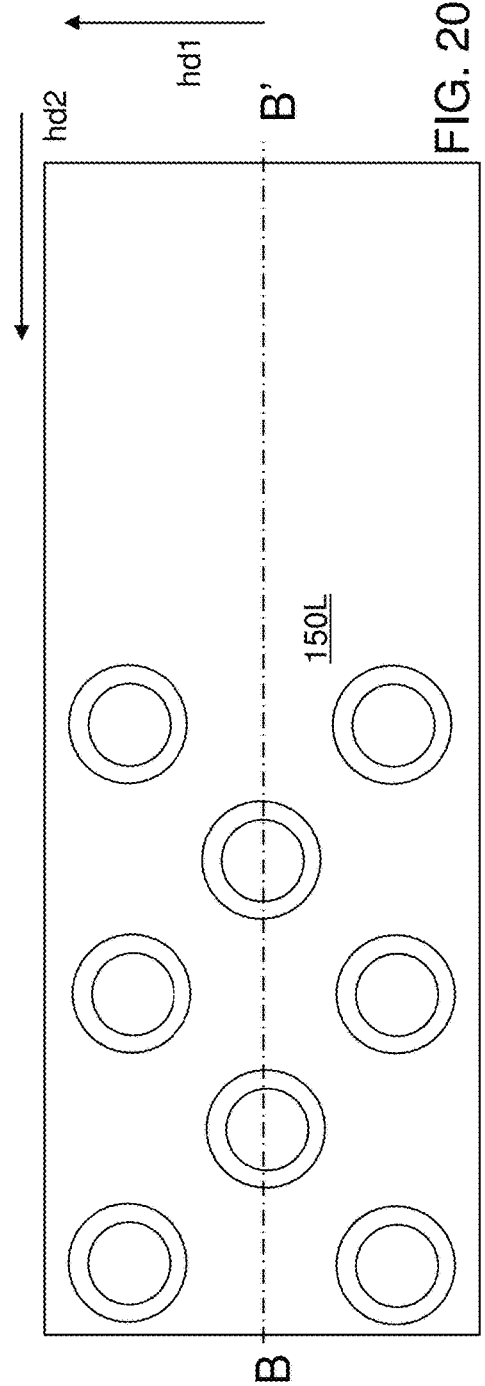
FIG. 20A is a top-down view of a region of the exemplary structure after formation of a gate dielectric layer according to an embodiment of the present disclosure.
Figure 20B:
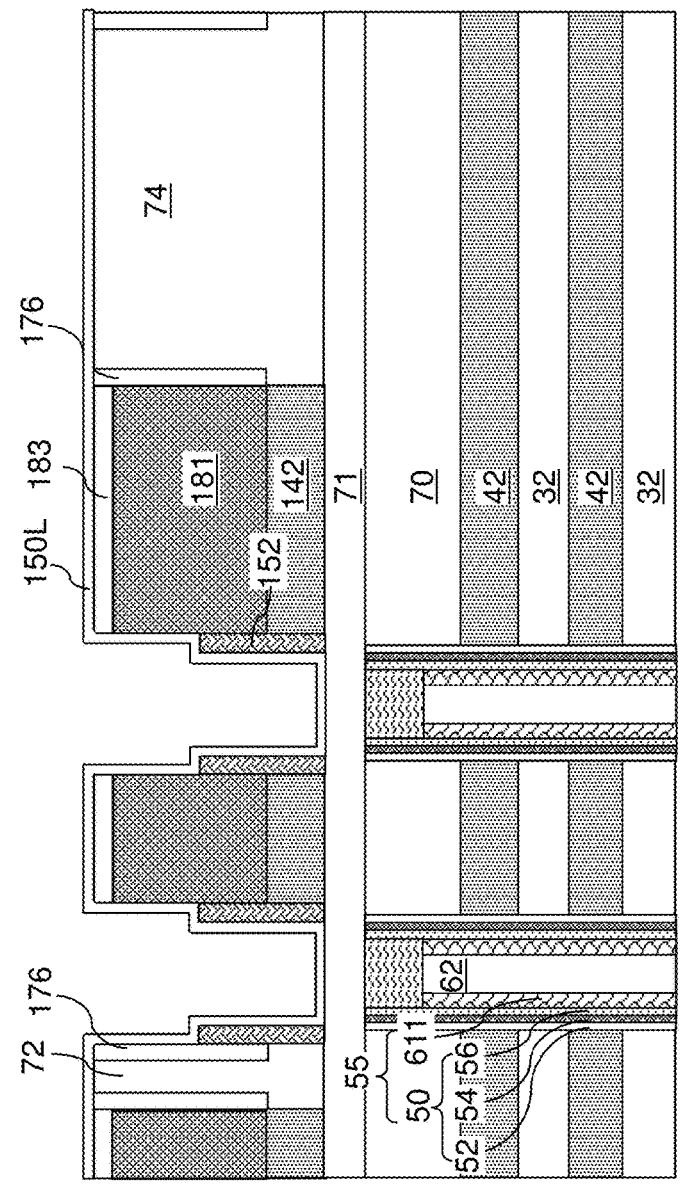
FIG. 20B is a vertical cross-sectional view along the vertical plane B-B' of FIG. 20A.

Referring to FIGS. 20A and 20B, a gate dielectric layer 150L can be deposited by a conformal deposition method. The gate dielectric layer 150L can include silicon oxide and/or a dielectric metal oxide such as aluminum oxide, hafnium oxide, or lanthanum oxide. The gate dielectric layer 150L can be formed by a chemical vapor deposition and/or atomic layer deposition. The thickness of the gate dielectric layer 150L can be in a range from 1 nm to 10 nm, such as from 1.5 nm to 6 nm, although lesser and greater thicknesses can also be employed.

Referring to FIGS. 21A and 21B, a cover material layer can be formed within each drain-select-level opening 149 by a conformal deposition of a cover material. The cover material layer can include, for example, amorphous carbon, diamond-like carbon, or an amorphous semiconductor material (e.g., amorphous silicon). An anisotropic etch process can be performed to sequentially remove horizontal portions of the cover material layer and horizontal portions of the gate dielectric layer 150L. Remaining cylindrical portions of the cover material layer constitute cover material spacers 148 having a generally cylindrical shape. Remaining portions of the gate dielectric layer 150L constitute gate dielectrics 150 having a respective cylindrical shape. The anisotropic etch process can be continued with suitable changes in the etch chemistry to etch through physically exposed portions of the planar insulating spacer layer 71 and at least partially through the sacrificial material portions 612. If sacrificial material portions 612 comprise semiconductor material portions, then they can be partially etched leaving the bottom part of these sacrificial material portions 612 in the device. If the sacrificial material portions 612 comprise an insulating material, then the entire sacrificial material portions 612 can be removed. The thickness of the sacrificial cap material portions 183 can be selected to ensure that bottom regions of the sacrificial cap material portions 183 are present over the sacrificial fill material portions 181 after the anisotropic etch process. A drain-select-level cavity 149A vertically extending through the sacrificial cap material portions 183, the sacrificial fill material portions 181, the drain-select-level sacrificial material portions 142, and the planar insulating spacer layer 71 can be formed above each dielectric core 62. Top surfaces and/or sidewall surfaces of the underlying memory-level semiconductor channels 611 can be physically exposed underneath each drain-select-level cavity 149A. Alternatively, if the sacrificial material portions 612 comprise semiconductor material portions, then part of the sacrificial material portions 612 may be exposed instead of or in addition to the memory-level semiconductor channels 611.

Thus, a cylindrical gate electrode 152 and a gate dielectric 150 are formed within each of the drain-select-level openings 149. Cover material spacers 148 are formed on the gate dielectrics 150. The drain-select-level cavities are formed by the anisotropic etch process that etches unmasked portions of the planar insulating spacer layer 71. Generally, the drain-select-level cavities 149A can be formed by removing the sacrificial pillar structures 48 and anisotropically etching the planar insulating spacer 71.

Figure 22A:
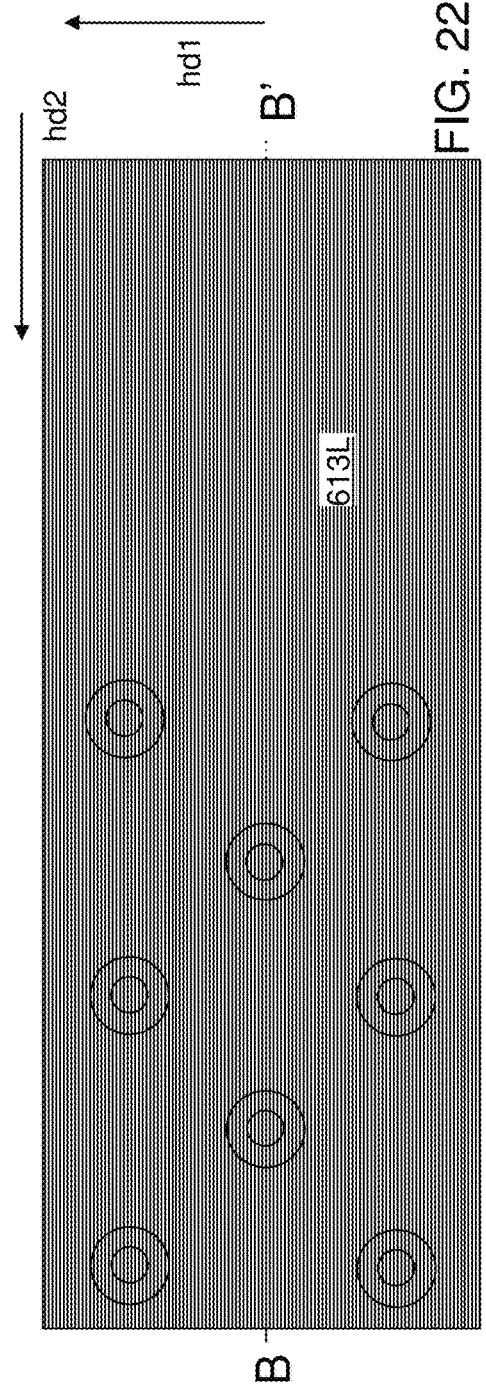
FIG. 22A is a top-down view of a region of the exemplary structure after formation of a drain-select-level semiconductor channel layer according to an embodiment of the present disclosure.
Figure 22B:
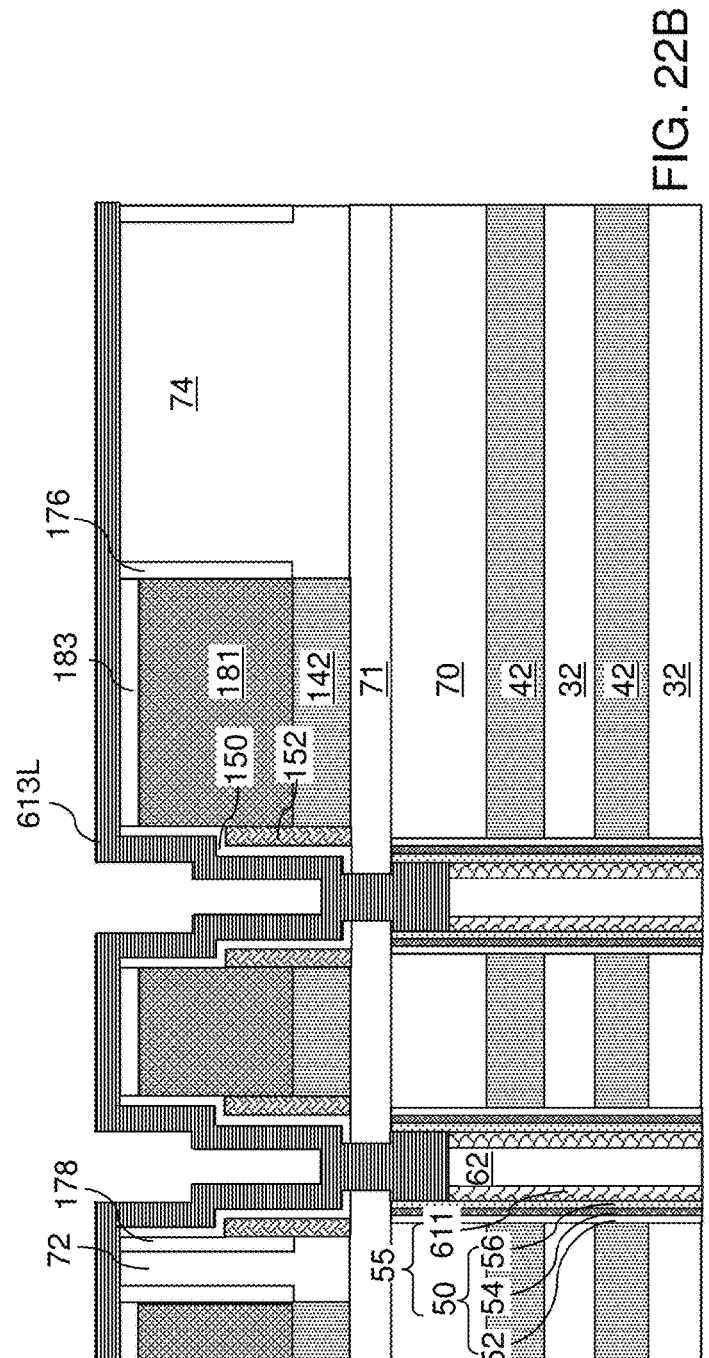
FIG. 22B is a vertical cross-sectional view along the vertical plane B-B' of FIG. 22A.
Figure 23A:
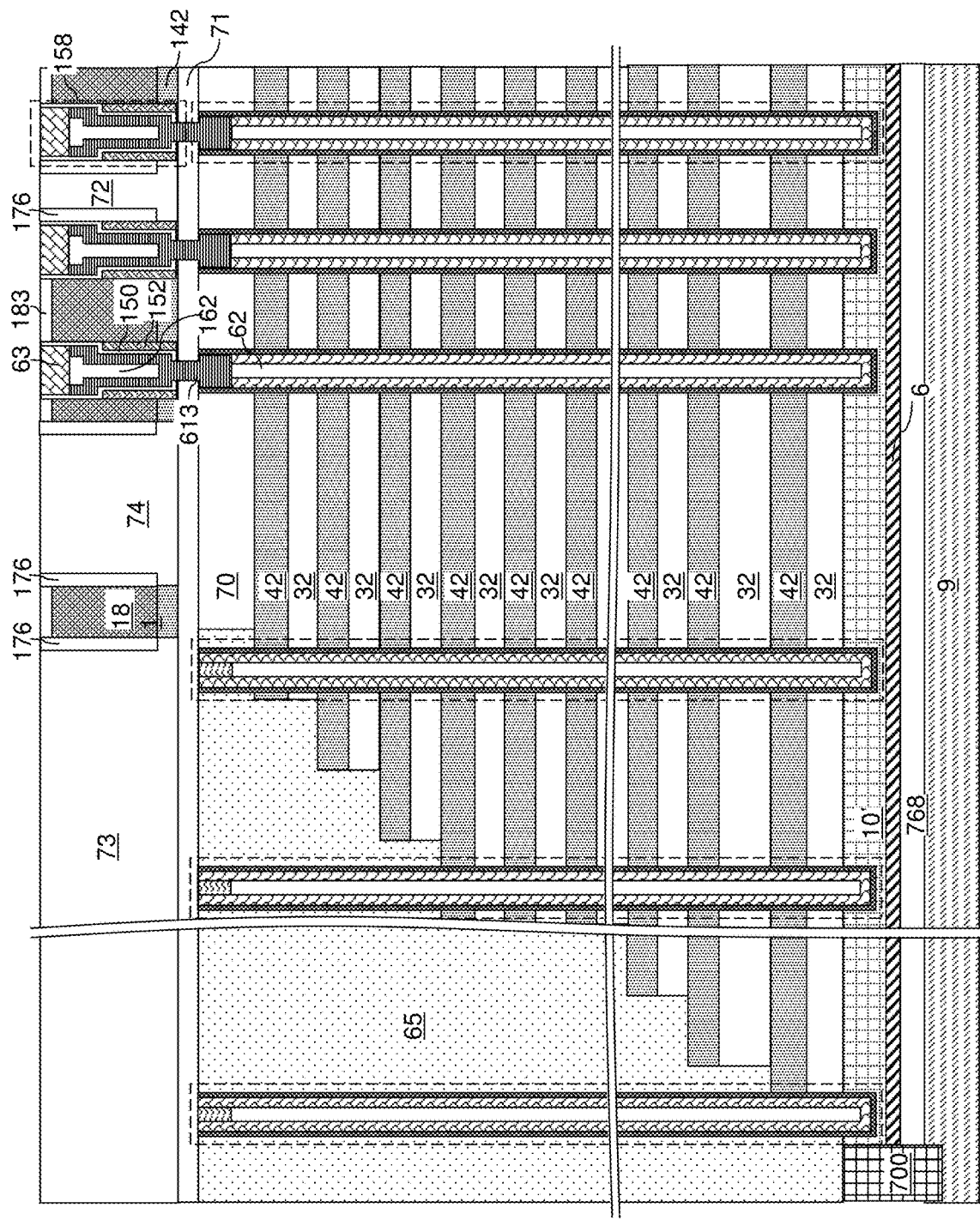
FIG. 23A is a top-down view of the exemplary structure after formation of drain-select-level pillar structures according to an embodiment of the present disclosure.
Figure 23B:
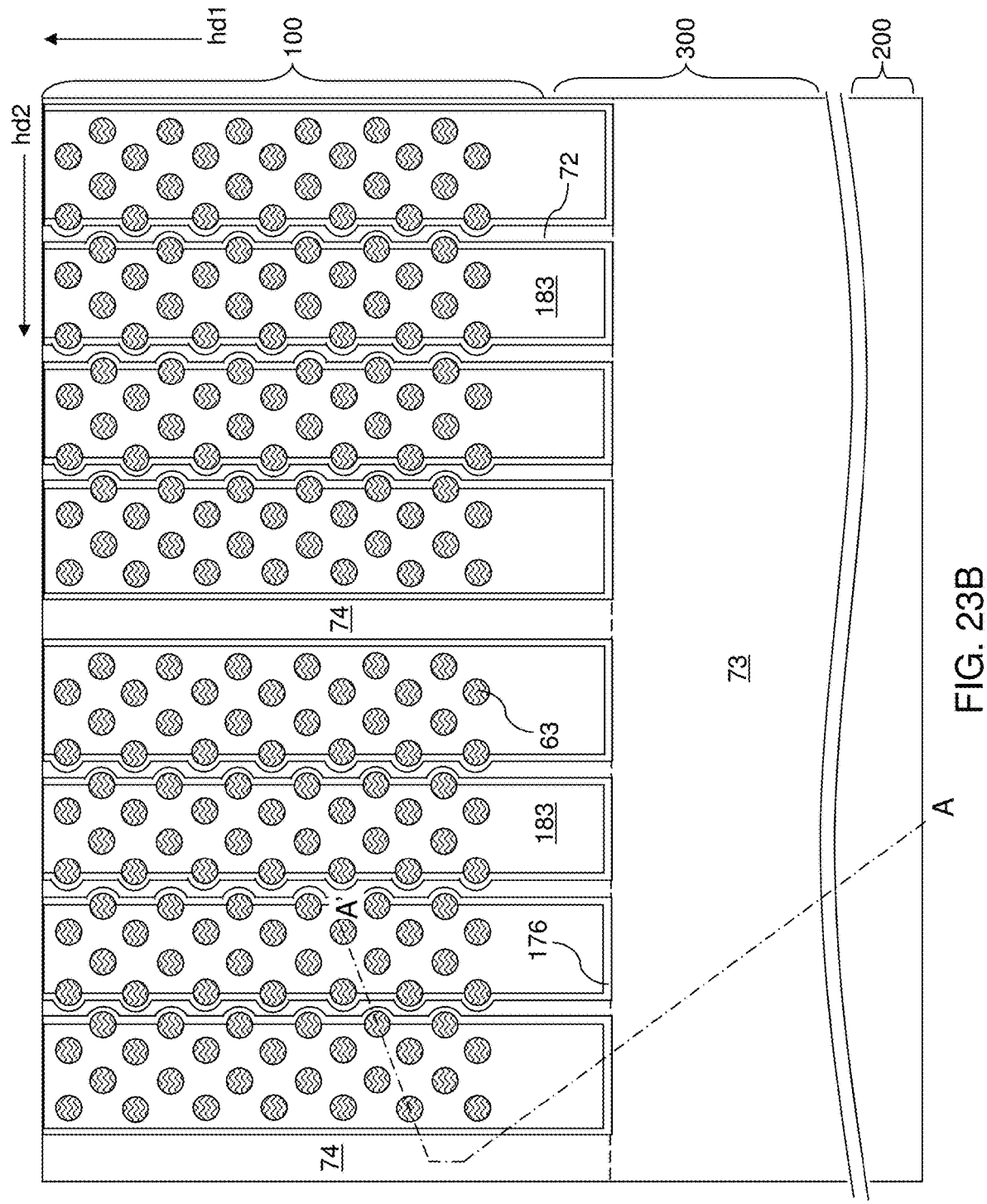
FIG. 23B is a top-down view of the exemplary structure of FIG. 23A. The hinged vertical cross-sectional plane A-A' is the plane of the vertical cross-sectional view of FIG. 23A.
Figure 23C:
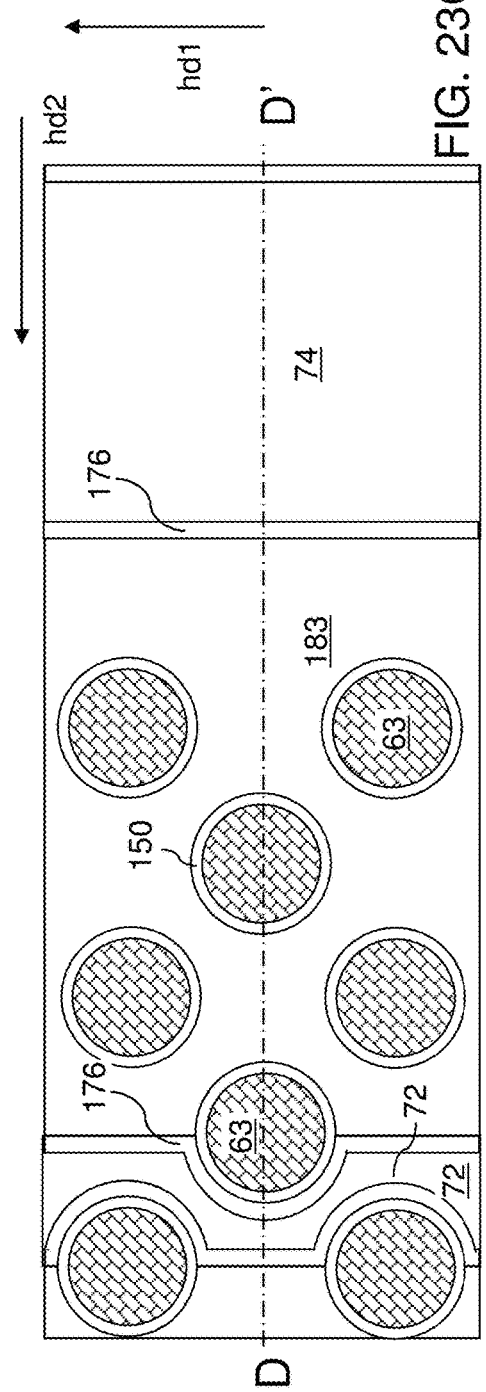
FIG. 23C is a top-down view of a region of the exemplary structure of FIGS. 23A and 23B
Figure 23D:
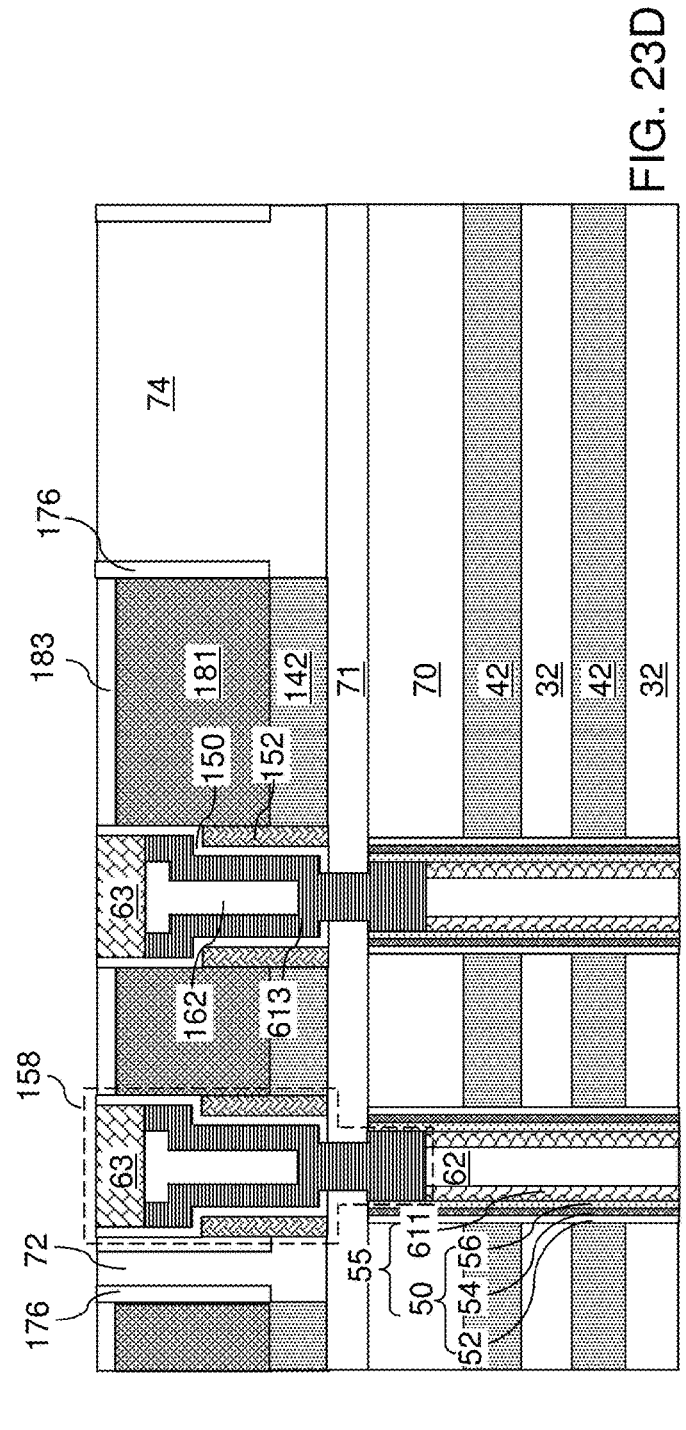
FIG. 23D is a vertical cross-sectional view along the vertical plane D-D' of FIG. 23C.

Referring to FIGS. 22A and 22B, the cover material spacers 148 can be optionally removed selective to the gate dielectrics 150. For example, if the cover material spacers 148 include a sacrificial material such as amorphous carbon, the cover material spacers 148 can be removed selective to the gate dielectrics 150. If the cover material spacers 148 include a semiconductor material such as amorphous silicon or polysilicon, the cover material spacers 148 may, or may not, be removed.

A drain-select-level semiconductor channel layer 613L can be deposited directly on physically exposed surfaces of the memory-level semiconductor channels, at peripheral regions of the drain-select-level cavities 149A, and over the sacrificial fill material layer 81. In case the cover material spacers 148 include a semiconductor material and remain on inner sidewalls of the gate dielectrics 150 at the time of deposition of the drain-select-level semiconductor channel layer 613L, the remaining portions of the cover material spacers 148 can be incorporated into the drain-select-level semiconductor channel layer 613L. The thickness of the vertical portions of the drain-select-level semiconductor channel layer 613L at the level of the gate dielectrics 150 can be in a range from 2 nm to 30 nm, such as from 4 nm to 20 nm, although lesser and greater thicknesses can also be employed. The drain-select-level semiconductor channel layer 613L may be in-situ doped with dopants of the first conductivity type, or may be doped with dopants of the first conductivity type in a subsequent processing step.

Referring to FIGS. 23A-23D, a dielectric material such as silicon oxide is deposited in remaining volumes of the drain-select-level cavities and over the drain-select-level semiconductor channel layer 613L by a conformal or non-conformal deposition process. The deposited dielectric material is recessed below the horizontal plane including the top surface of the sacrificial fill material layer 81 by a recess etch process. Each remaining portion of the dielectric material laterally surrounded by the drain-select-level semiconductor channel layer 613L is herein referred to as a drain-select-level dielectric core 162.

Portions of the drain-select-level semiconductor channel layer 613L overlying the top surfaces of the drain-select-level dielectric cores 162 can be removed by an etch back process, which can include an anisotropic etch process or an isotropic etch process. Each remaining portion of the drain-select-level semiconductor channel layer 613L constitutes a drain-select-level semiconductor channel 613. The drain-select-level semiconductor channel 613 may optionally incorporate any remaining part of the sacrificial material portion 612 if the sacrificial material portion 612 comprises a semiconductor material and any part (e.g., bottom part) of the sacrificial material portion 612 remains after the etching step shown in FIG. 21B. Each drain-select-level semiconductor channel 613 is electrically connected to and optionally directly contacts an underlying one of the memory-level semiconductor channels 611. Optionally, dopants of the first conductivity type can be implanted into the drain-select-level semiconductor channels 613 to improve transistor characteristics of each vertical transistor including a series connection of a memory-level semiconductor channel 611 and a drain-select-level semiconductor channel 613.

A doped semiconductor material having a doping of the second conductivity type (which is the opposite of the first conductivity type) can be deposited in cavities overlying a respective drain-select-level semiconductor channel 613. Portions of the deposited doped semiconductor material overlying the horizontal plane including the top surfaces of the sacrificial cap material portions 183 can be removed by a planarization process, which can include a recess etch and/or chemical mechanical planarization. Remaining portions of the doped semiconductor material constitute drain regions 63. Atomic concentration of dopants of the second conductivity type in the drain regions 63 can be in a range from $5.0 \times 10^{19}/cm^3$ to $2.0 \times 10^{21}/cm^3$, although lesser and greater atomic concentrations can also be employed.

Each contiguous combination of a cylindrical gate electrode 152, a gate dielectric 150, a drain-select-level semiconductor channel 613, a drain-select-level dielectric core 162, and a drain region 63 constitutes a drain-select-level pillar structure 158 (i.e., a vertical drain select gate transistor). Each drain-select-level pillar structure 158 is formed within a respective one of the drain-select-level openings 149. Thus, each drain-select-level pillar structure 158 comprises a cylindrical gate dielectric 150 laterally surrounding a respective one of the drain-select-level semiconductor channels 613 and a cylindrical gate electrode 152 laterally surrounding the cylindrical gate dielectric 150. Each drain-select-level pillar structure 158 is formed over, and directly on, a respective memory stack structure 55. Specifically, each of the drain-select-level pillar structures 158 comprises a drain-select-level semiconductor channel 613 contacting an underlying one of the memory opening fill structures 58.

In one embodiment, the drain-select-level pillar structures 158 are arranged in rows that extend along the first horizontal direction hd1, and a row-to-row pitch p is the same for each neighboring pairs of rows of the drain-select-level pillar structures 158. In one embodiment, the drain-select-level pillar structures 158 are arranged as a first two-dimensional hexagonal array, and the memory stack structures 55 are arranged as a second two-dimensional hexagonal array having a same two-dimensional periodicity as the first two-dimensional hexagonal array.

Figure 24A:
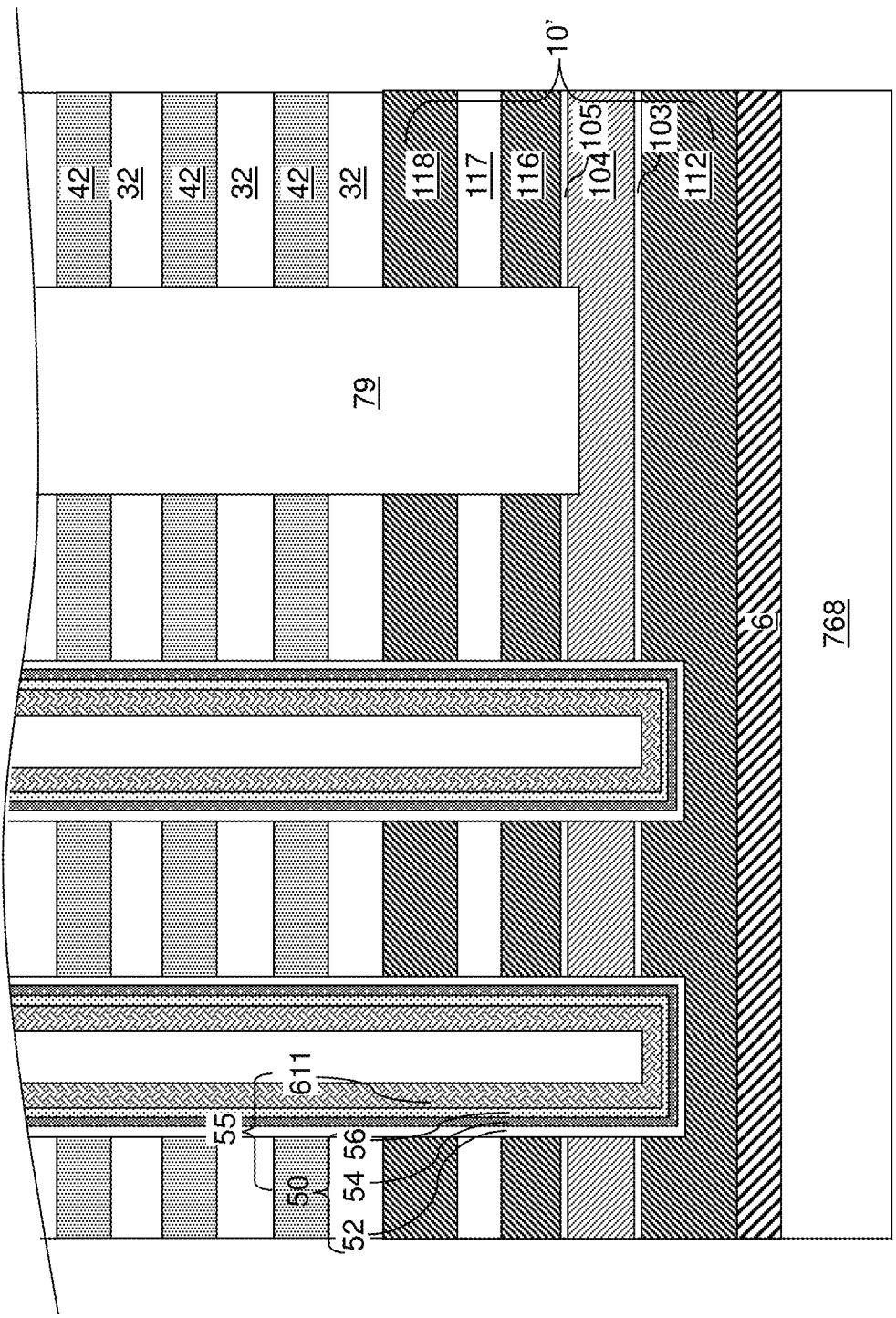
FIGS. 24A-24I are sequential vertical cross-sectional views of a region of the exemplary structure during replacement of the in-process source-level material layers with source-level material layers and replacement of the sacrificial material layers with electrically conductive layers according to an embodiment of the present disclosure.

Referring to FIG. 24A, backside trenches 79 vertically extending from the top surface of the sacrificial cap material portions 183 to the source-level sacrificial layer 104 can be formed, for example, by applying and patterning a photoresist layer to form line trench patterns therein, and by transferring the pattern in the photoresist layer through various material portions of the exemplary structure down to the source-level sacrificial layer 104. The photoresist layer is subsequently removed, for example, by ashing.

The backside trenches 79 can laterally extend along the first horizontal direction hd1, and can be formed entirely within the area of the inter-block dielectric isolation structures 74. In this case, the sacrificial fill material portions 181 and the drain-select-level sacrificial material portions 142 can be laterally spaced from the backside trenches 79 by remaining portions of the inter-block dielectric isolation structures 74. The remaining portions of the inter-block dielectric isolation structures 74 protect the sacrificial fill material portions 181 and the drain-select-level sacrificial material portions 142 during a subsequent processing step in which the sacrificial material layers 42 are removed.

Figure 24B:
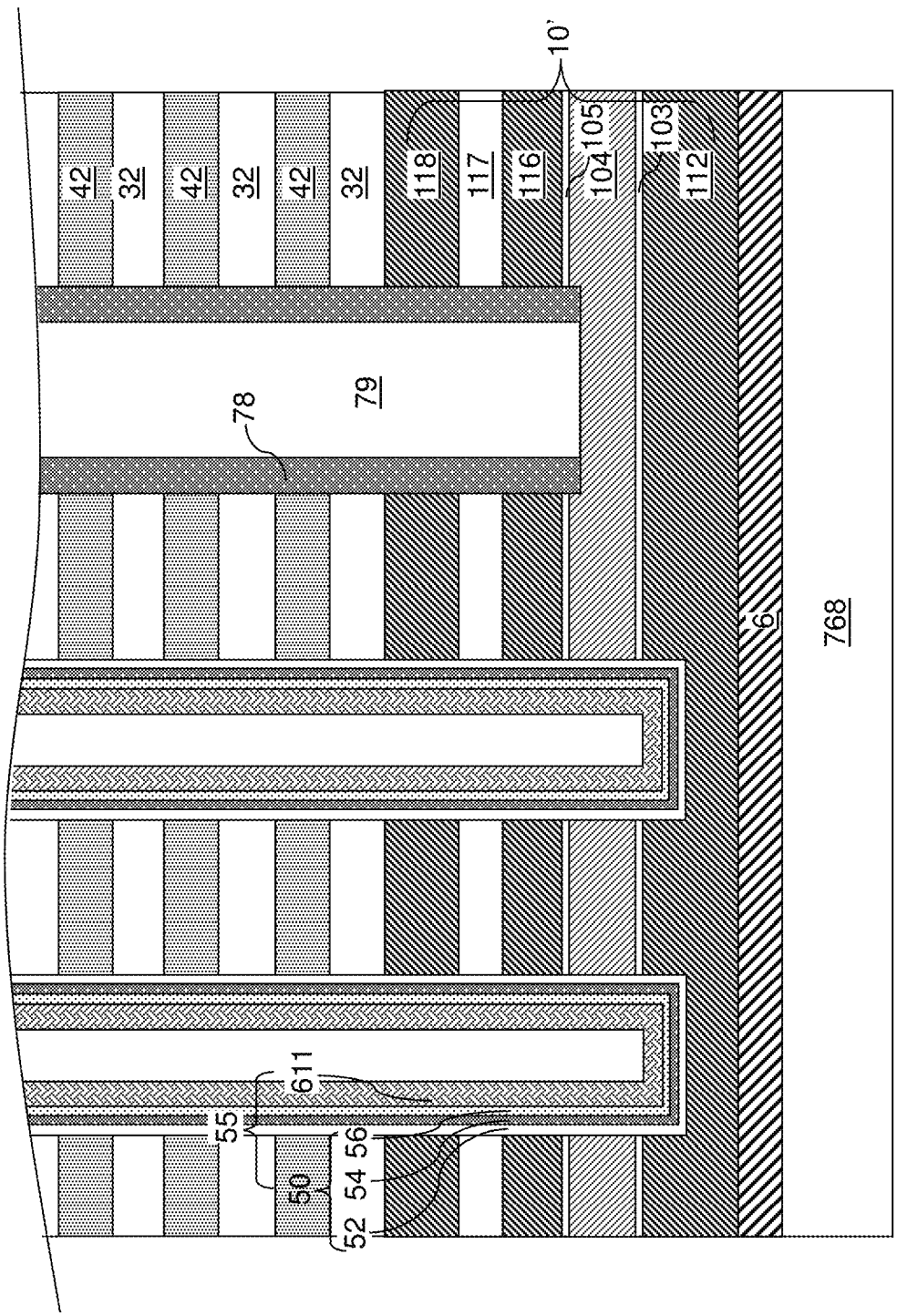

Referring to FIG. 24B, a spacer material can be conformally deposited and anisotropically etched to form a backside trench spacer 78 within each backside trench 79. The backside trench spacers 78 are sacrificial spacers that protect the alternating stack (32, 42) during replacement of the in-process source-level material layers 10' with source-level material layers 10. In one embodiment, the backside trench spacers 78 include silicon nitride. The thickness of the backside trench spacers 78 can be in a range from 2 nm to 20 nm, such as from 3 nm to 10 nm, although lesser and greater thicknesses can also be employed.

Figure 24C:
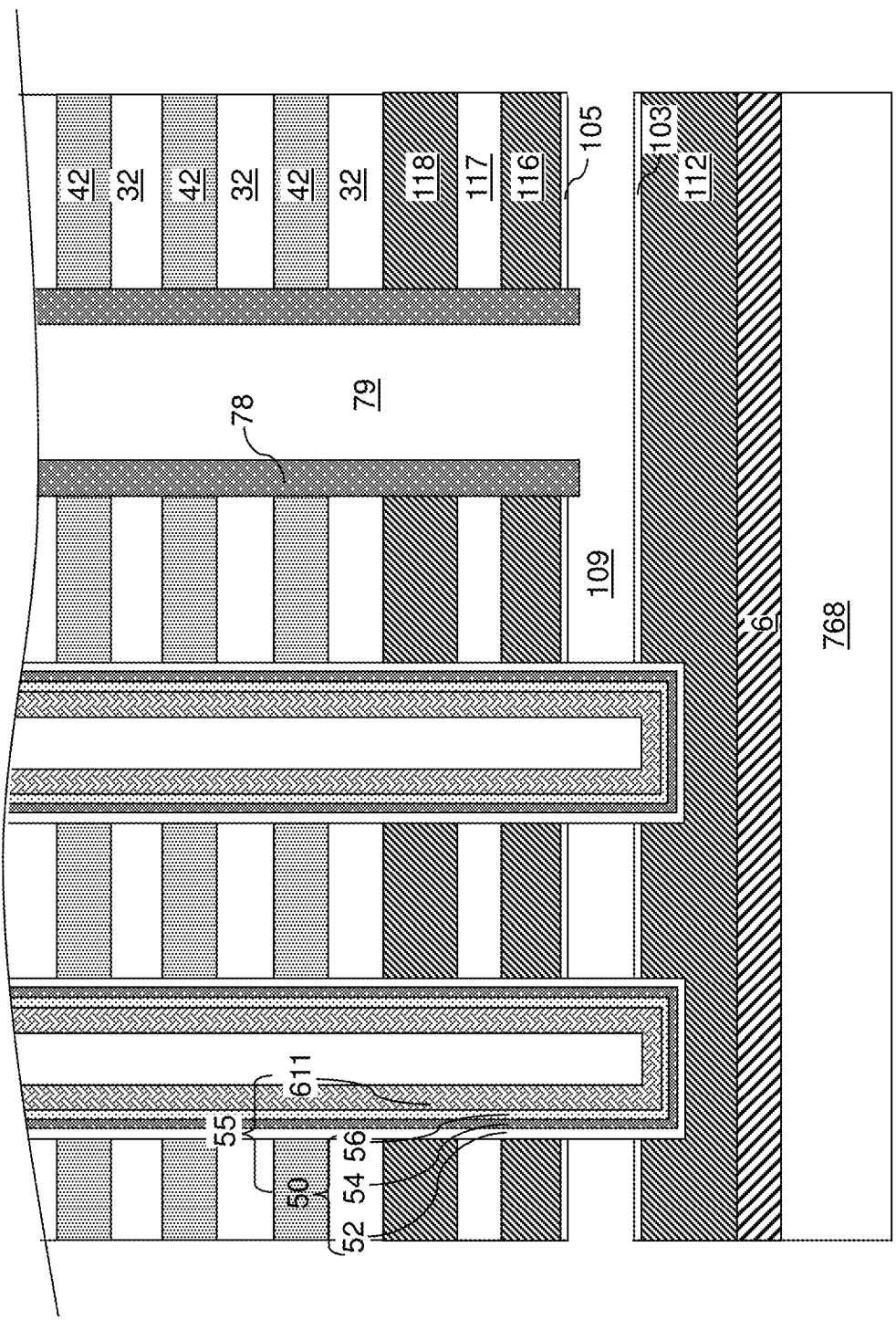

Referring to FIG. 24C, an etchant that etches the material of the source-level sacrificial layer 104 selective to the materials of the alternating stack (32, 42), the backside trench spacers 78, the insulating cap layer 70, the planar insulating spacer layer 71, the dielectric isolation structures (72, 74), and the sacrificial cap material portions 183 can be introduced into the backside trenches 79 in an isotropic etch process. For example, if the source-level sacrificial layer 104 includes undoped amorphous silicon or an undoped amorphous silicon-germanium alloy, the backside trench spacers 78 include silicon nitride, and the upper and lower sacrificial liners (105, 103) include silicon oxide, a wet etch process employing hot trimethyl-2 hydroxyethyl ammonium hydroxide ("hot TMY") or tetramethyl ammonium hydroxide (TMAH) can be employed to remove the source-level sacrificial layer 104 selective to the backside trench spacers 78 and the upper and lower sacrificial liners (105, 103). A source cavity 109 is formed in the volume from which the source-level sacrificial layer 104 is removed.

Figure 24D:
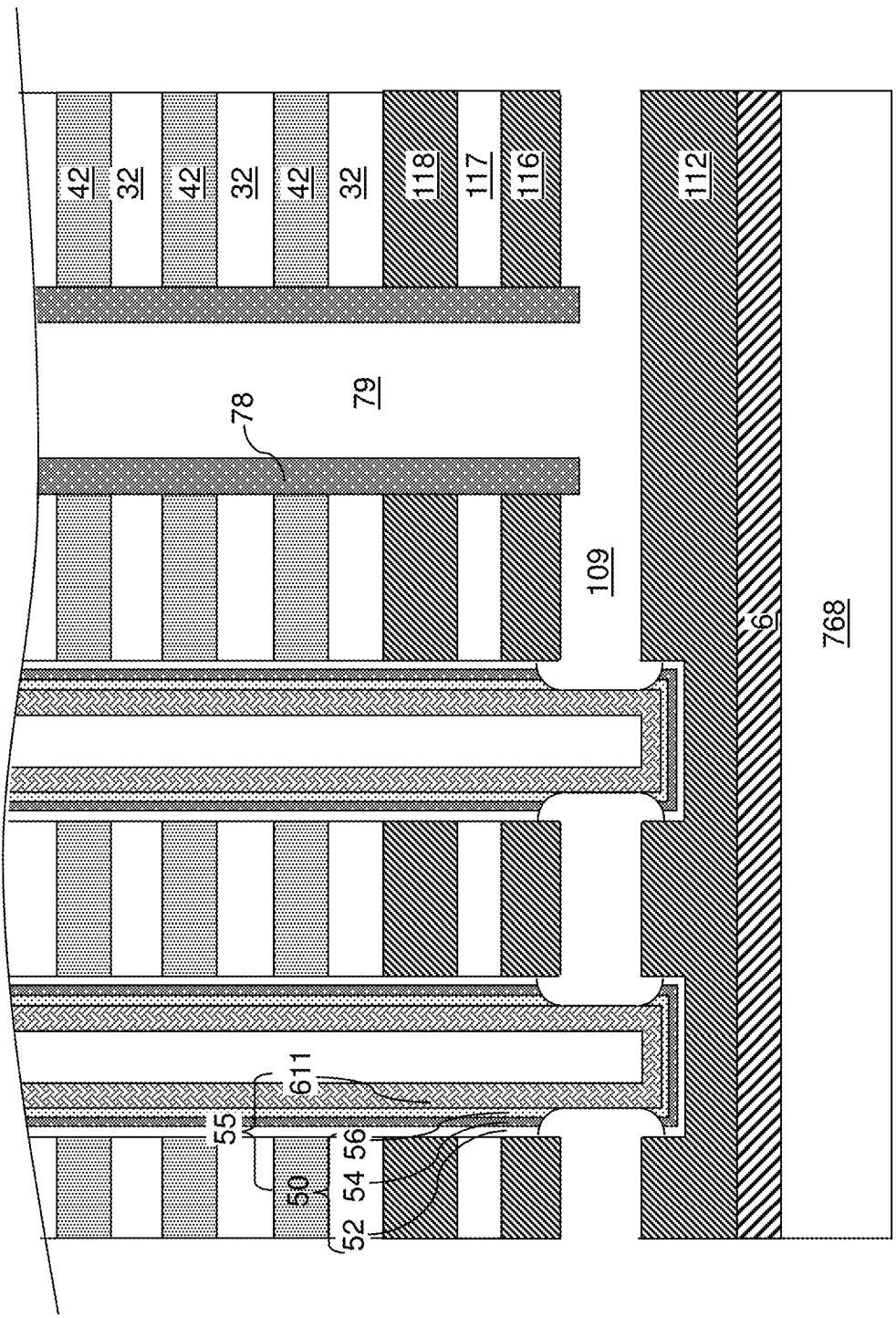

Referring to FIG. 24D, a sequence of isotropic etchants, such as wet etchants, can be applied to the physically exposed portions of the memory films 50 to sequentially etch the various component layers of the memory films 50 from outside to inside, and to physically expose cylindrical surfaces of the memory-level semiconductor channels 611 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the lower source layer 112 and a bottom surface of the upper source layer 116 can be physically exposed to the source cavity 109.

Figure 24E:
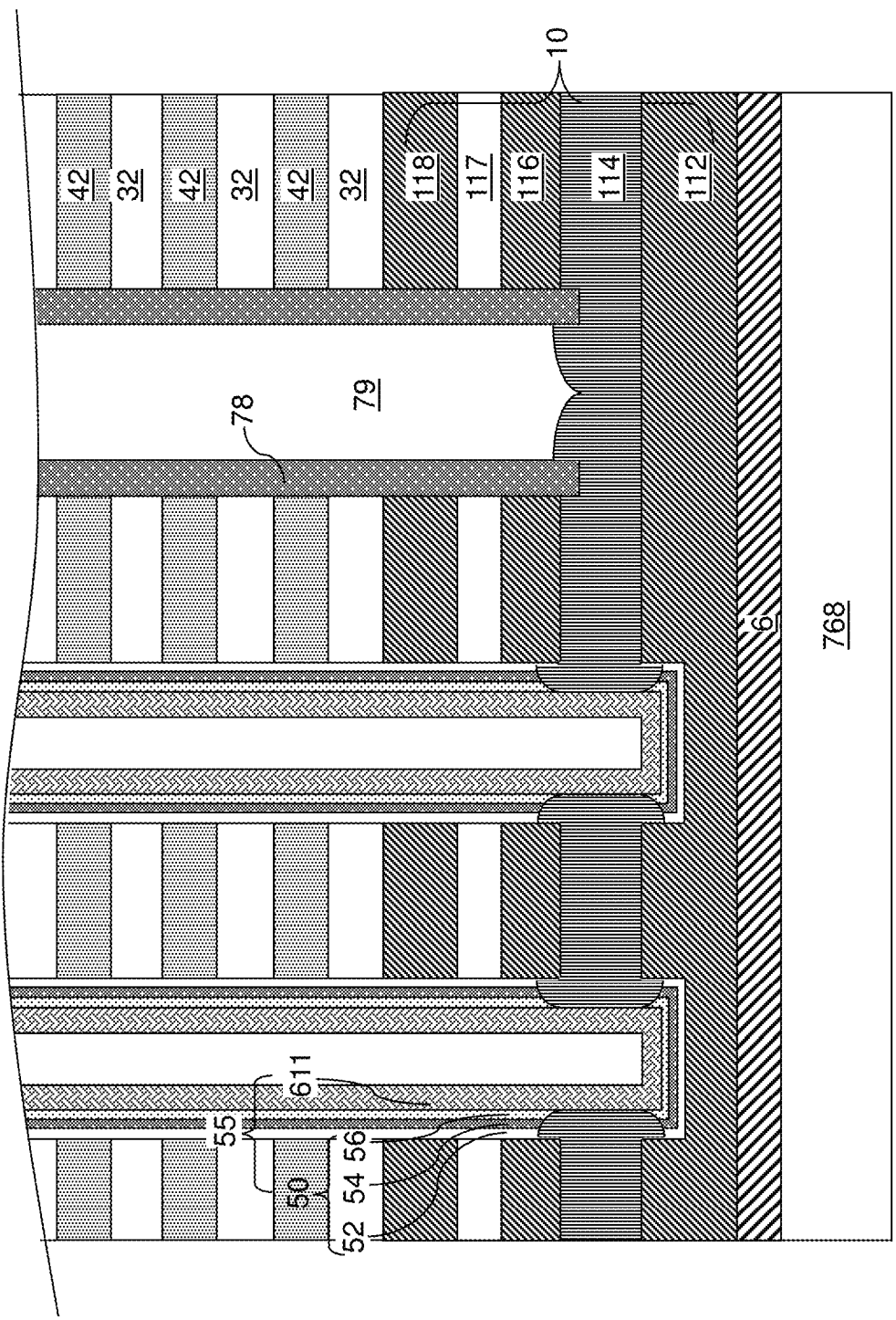

Referring to FIG. 24E, a doped semiconductor material having a doping of the second conductivity type can be deposited by a selective semiconductor deposition process. A semiconductor precursor gas, an etchant, and a dopant precursor gas can be flowed concurrently into a process chamber including the exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine. The deposited doped semiconductor material forms a source contact layer 114, which can contact sidewalls of the memory-level semiconductor channels 611. The duration of the selective semiconductor deposition process can be selected such that the source cavity 109 is filled with the source contact layer 114, and the source contact layer 114 contacts bottom end portions of inner sidewalls of the backside trench spacers 78. Thus, the source contact layer 114 can be formed by selectively depositing a doped semiconductor material from semiconductor surfaces around the source cavity 109. In one embodiment, the doped semiconductor material can include doped polysilicon.

The layer stack including the lower source layer 112, the source contact layer 114, and the upper source layer 116 constitutes a buried source layer (112, 114, 116), which functions as a common source region that is connected each of the memory-level semiconductor channels 611 and has a doping of the second conductivity type. The average dopant concentration in the buried source layer (112, 114, 116) can be in a range from $5.0 \times 10^{19}/cm^3$ to $2.0 \times 10^{21}/cm^3$, although lesser and greater dopant concentrations can also be employed. The set of layers including the buried source layer (112, 114, 116), the source-level insulating layer 117, and the optional source-select-level conductive layer 118 constitutes source-level material layers 10, which replaces the in-process source-level material layers 10'.

Figure 24F:
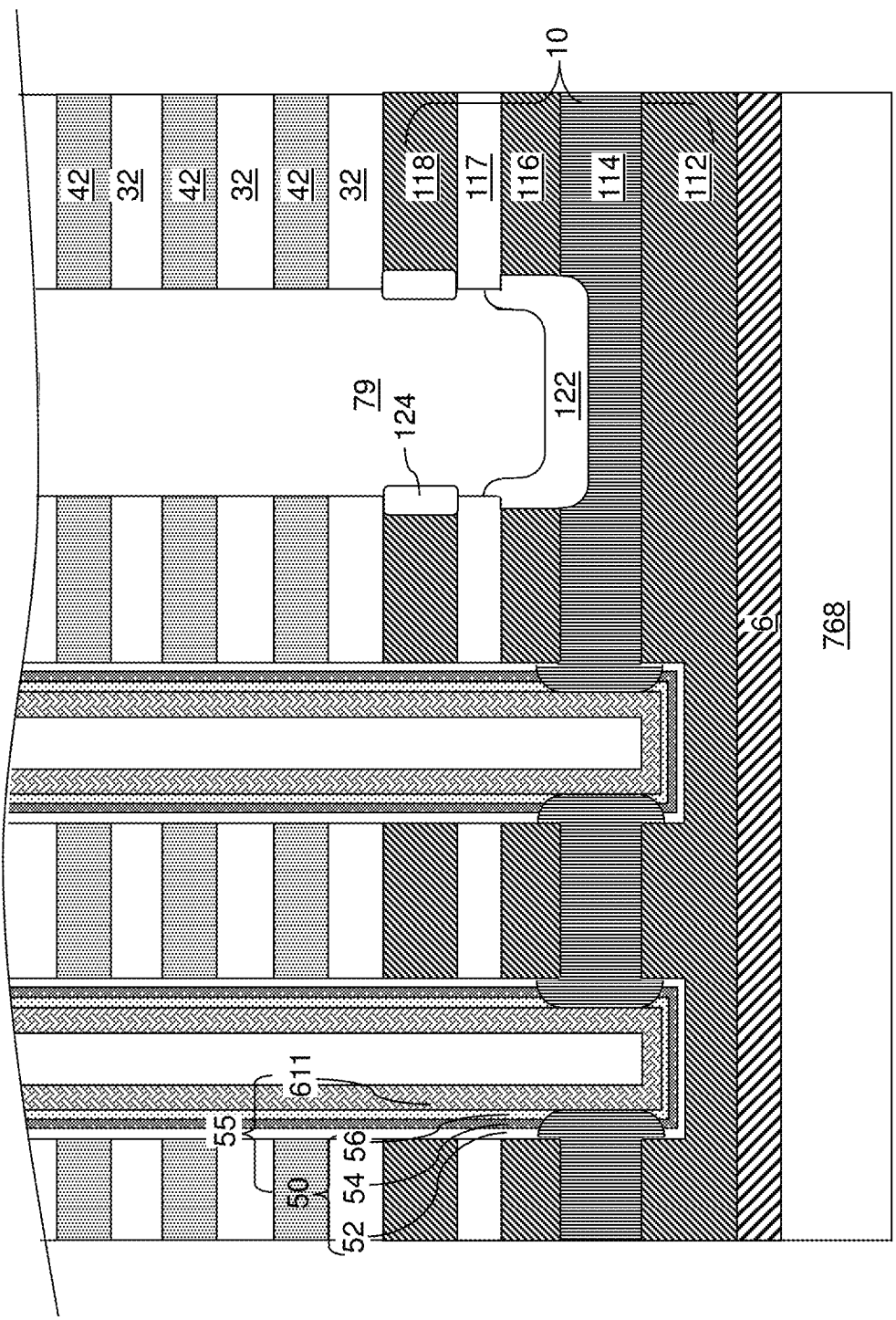

Referring to FIG. 24F, the backside trench spacers 78 can be removed selective to the insulating layers 32, the insulating cap layer 70, and the source contact layer 114 employing an isotropic etch process. For example, if the backside trench spacers 78 include silicon nitride, a wet etch process employing hot phosphoric acid can be performed to remove the backside trench spacers 78. In one embodiment, the isotropic etch process that removes the backside trench spacers 78 can be combined with a subsequent isotropic etch process that etches the sacrificial material layers 42 selective to the insulating layers 32, the insulating cap layer 70, and the source contact layer 114.

An oxidation process can be performed to convert physically exposed surface portions of semiconductor materials into dielectric semiconductor oxide portions. For example, surfaces portions of the source contact layer 114 and the upper source-level material layer 116 can be converted into dielectric semiconductor oxide (e.g., silicon oxide) plates 122, and surface portions of the optional source-select-level conductive layer 118 can be converted into annular dielectric semiconductor oxide (e.g., silicon oxide) spacers 124.

Figure 24G:
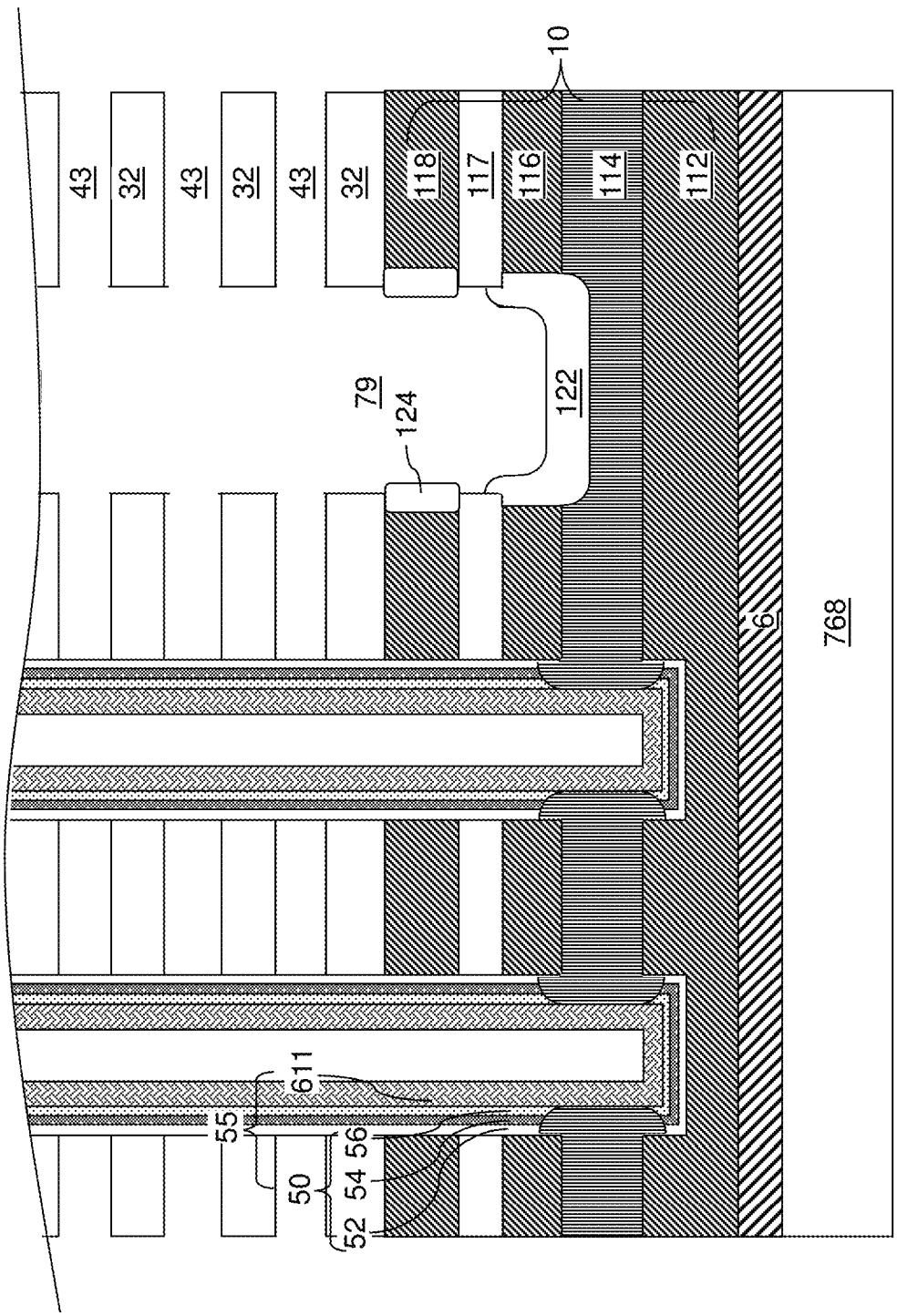

Referring to FIG. 24G, the sacrificial material layers 42 are can be removed selective to the insulating layers 32, the insulating cap layer 70, the source contact layer 114, the dielectric semiconductor oxide plates 122, the annular dielectric semiconductor oxide spacers 124, the planar insulating spacer layer 71, the dielectric isolation structures (72, 74), and the sacrificial cap material portions 183. For example, an etchant that selectively etches the materials of the sacrificial material layers 42 with respect to the materials of the insulating layers 32, the insulating cap layer 70, the retro-stepped dielectric material portion 65 (illustrated in FIG. 22A), and the material of the outermost layer of the memory films 50 can be introduced into the backside openings 79, for example, employing an isotropic etch process. For example, the sacrificial material layers 42 can include silicon nitride, the materials of the insulating layers 32, the insulating cap layer 70, the retro-stepped dielectric material portion 65, and the outermost layer of the memory films 50 can include silicon oxide materials.

The isotropic etch process can be a wet etch process employing a wet etch solution, or can be a gas phase (dry) etch process in which the etchant is introduced in a vapor phase into the backside opening 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art.

Each of the backside recesses 43 can be a laterally extending cavity having a lateral dimension that is greater than the vertical extent of the cavity. In other words, the lateral dimension of each of the backside recesses 43 can be greater than the height of the respective backside recess 43. A plurality of backside recesses 43 can be formed in the volumes from which the material of the sacrificial material layers 42 is removed. Each of the backside recesses 43 can extend substantially parallel to the top surface of the substrate semiconductor layer 9. A backside recess 43 can be vertically bounded by a top surface of an underlying insulating layer 32 and a bottom surface of an overlying insulating layer 32. In one embodiment, each of the backside recesses 43 can have a uniform height throughout.

Figure 24H:
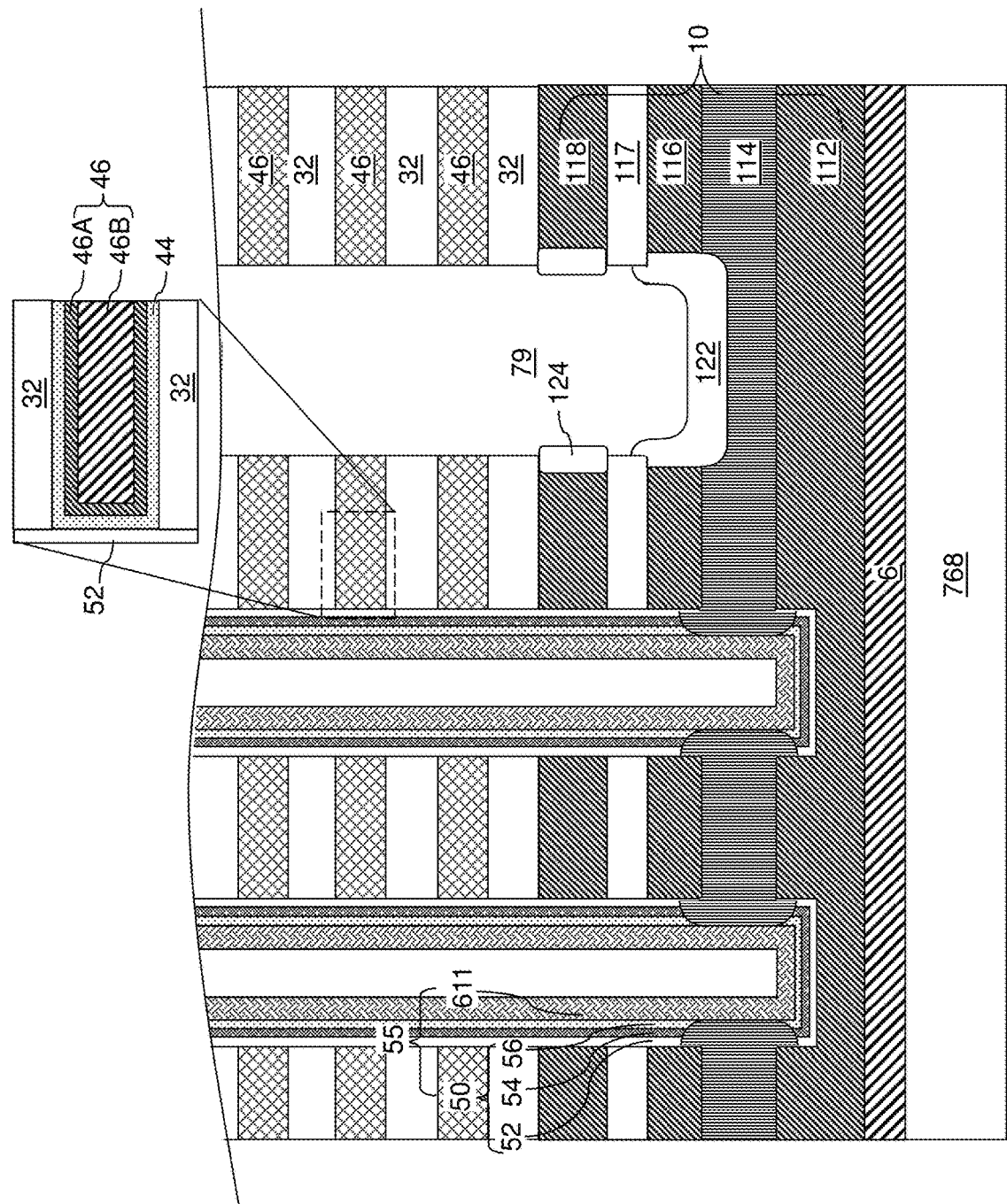
Figure 24I:
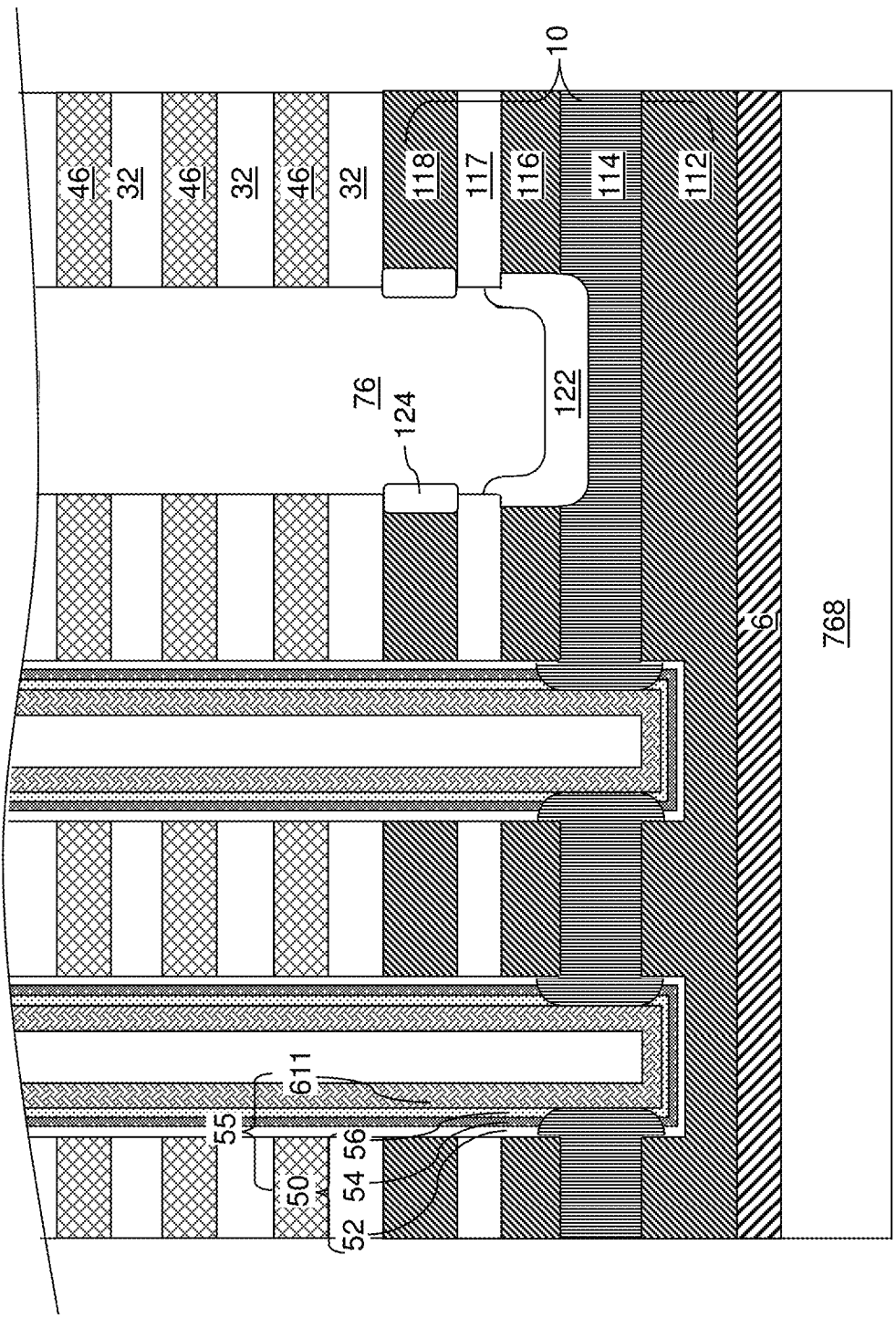
Figure 25A:
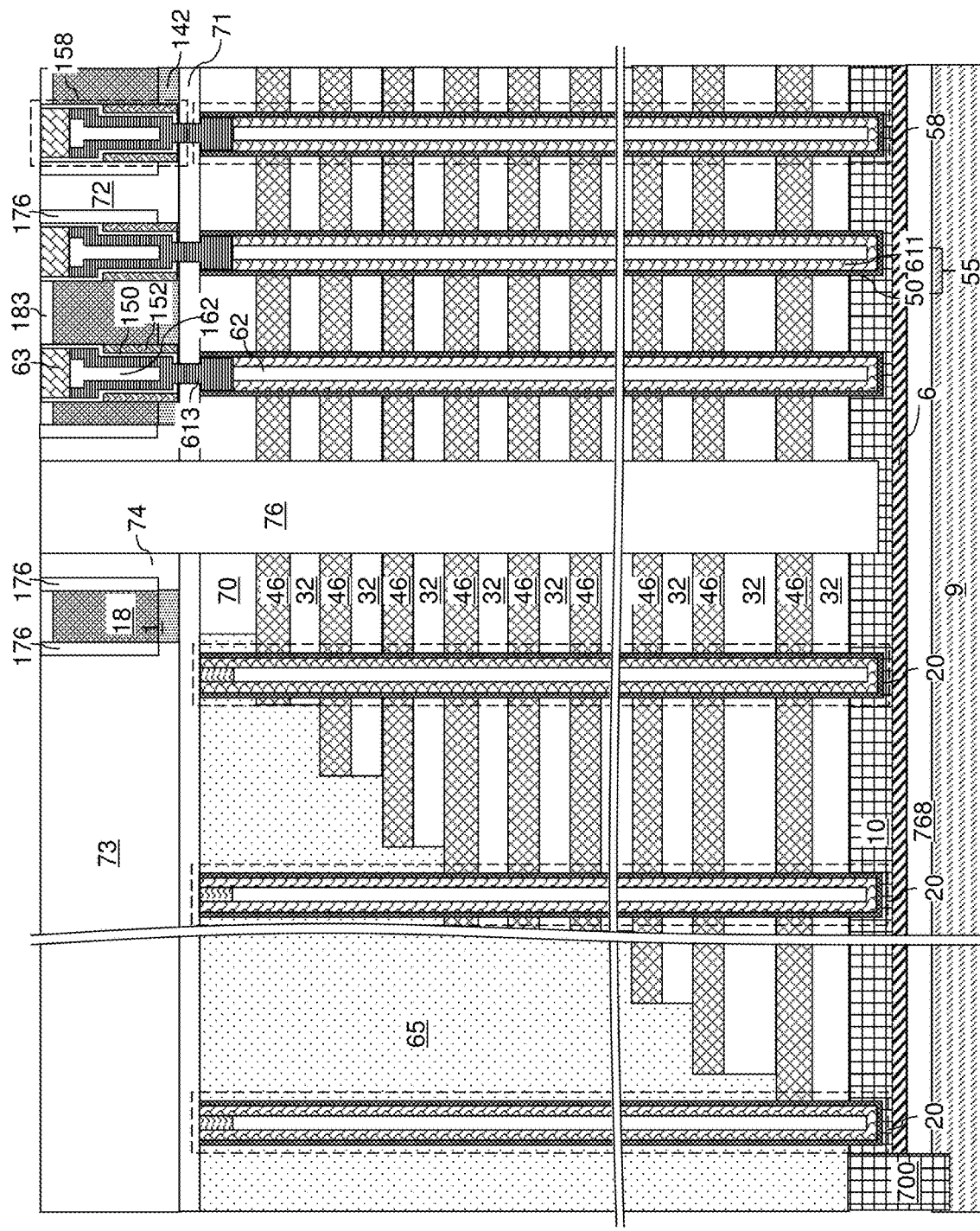
FIG. 25A is a top-down view of the exemplary structure after formation of dielectric wall structures according to an embodiment of the present disclosure.
Figure 25B:
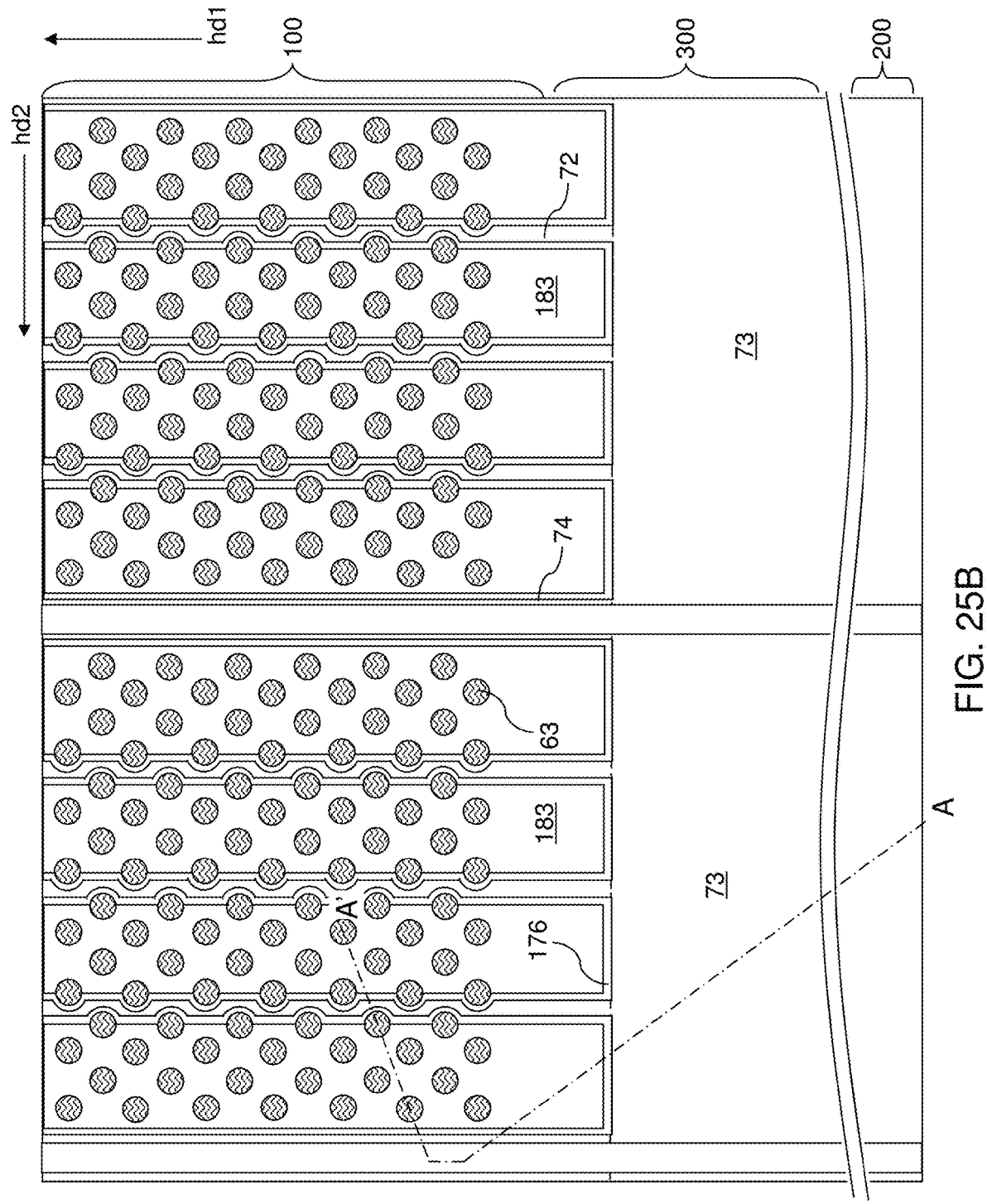
FIG. 25B is a top-down view of the exemplary structure of FIG. 25A. The hinged vertical cross-sectional plane A-A' is the plane of the vertical cross-sectional view of FIG. 25A.

Referring to FIG. 24H, a backside blocking dielectric layer 44 can be subsequently formed in the backside recesses 43. The backside blocking dielectric layer 44 can include at least one dielectric material that is subsequently employed to prevent charge tunneling between the charge storage layers 54 and electrically conductive layers to be subsequently formed in the backside recesses 43. For example, the backside blocking dielectric layer 44 can include silicon oxide and/or a dielectric metal oxide such as aluminum oxide. The backside blocking dielectric layer 44 can be formed by a conformal deposition process such as chemical vapor deposition or atomic layer deposition. The thickness of the backside blocking dielectric layer 44 can be in a range from 1 nm to 6 nm, such as 2 nm to 4 nm, although lesser and greater thicknesses can also be employed.

At least one metallic material can be subsequently deposited in the backside recesses 43 and at peripheral portions of the backside trenches 79. For example, a metallic barrier layer 46A can be conformally deposited in the backside recesses 43, for example, by chemical vapor deposition. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Subsequently, a metal fill material is deposited in the plurality of backside recesses 43, on the sidewalls of the at least one the backside trench 79, and over the top surface of the insulating cap layer 70 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. Alternatively, the metallic fill material layer 46B can include a different metallic material such as cobalt, ruthenium, and/or molybdenum. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer can be formed on the sidewalls of each backside trench 79 and over the insulating cap layer 70. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer includes a continuous portion of the metallic barrier layer 46A and a continuous portion of the metallic fill material layer 46B that are located in the backside trenches 79 or above the insulating cap layer 70.

The deposited metallic material of the continuous electrically conductive material layer is etched back from the sidewalls of each backside trench 79 and from above the insulating cap layer 70, for example, by an isotropic wet etch, an anisotropic dry etch, or a combination thereof. Each remaining portion of the deposited metallic material in the backside recesses 43 constitutes a electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode, or a select gate electrode, for the plurality of vertical memory devices.

Referring to FIGS. 24I and 25A-25D, a dielectric material is deposited in the backside trenches 79 to form dielectric wall structures 76. Each of the dielectric wall structures 76 can laterally extend along the first horizontal direction hd1 and can vertically extend through each layer of an alternating stack of the insulating layers 32 and the electrically conductive layers 46. Each dielectric wall structure 76 can contact sidewalls of the insulating cap layer 70.

Referring to FIGS. 26A and 26B, the sacrificial cap material portions 183 can be removed by an etch process, which can employ an isotropic etch or an anisotropic etch. For example, if the sacrificial cap material portions 183 include silicon oxide, a wet etch process employing dilute hydrofluoric acid can be performed to remove the sacrificial cap material portions 183. Top portions of the dielectric wall structures 76, the dielectric isolation structures (72, 74), and the dielectric spacer liners 176 can be collaterally recessed vertically during removal of the sacrificial cap material portions 183.

Subsequently, the sacrificial fill material portions 181 and the drain-select-level sacrificial material portions 142 can be removed selective to the materials of the planar insulating spacer layer 71, the dielectric isolation structures (72, 74), the dielectric spacer liners 176, the dielectric wall structures 76, the gate dielectrics 150, and the drain regions 63. For example, if the sacrificial fill material portions 181 and the drain-select-level sacrificial material portions 142 include silicon nitride, a wet etch employing hot phosphoric acid can be performed to remove the sacrificial fill material portions 181 and the drain-select-level sacrificial material portions 142. Drain-select-level recess regions 243 can be formed in volumes from which the sacrificial fill material portions 181 and the drain-select-level sacrificial material portions 142 are removed.

Referring to FIGS. 27A-27D, drain-select-level gate electrodes 146 are formed in the drain-select-level recess regions 243 by deposition of at least one conductive material. For example, at least one conductive material can include a combination of a metallic barrier layer and a metal fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN. The metal fill material can be deposited on the metallic barrier layer to fill remaining volumes of the drain-select-level recess regions 243. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal.

A recess etch can be performed to recess the at least one conductive material such that top surfaces of the recessed portions of the at least one conductive material are formed below the horizontal plane including the top surfaces of the drain regions 63. Each recessed discrete portion of the recessed conductive material constitutes a drain-select-level gate electrode 146. The drain-select-level gate electrodes 146 are formed in volumes from which the sacrificial fill material portions 181 removed. The drain-select-level gate electrodes 146 are formed over the alternating stack (32, 46) and between neighboring pairs of the dielectric isolation structures (72, 74).

Each drain-select-level gate electrode 146 contacts outer sidewalls of a respective set of cylindrical gate electrodes 152. Each cylindrical gate electrode 152 contacts a respective one of the drain-select-level gate electrodes 146. The cylindrical gate electrodes 152 include first cylindrical gate electrodes 152 that contact a respective one of the dielectric spacer liners 176 on one side and contact a respective one of the drain-select-level gate electrodes 146 on another side, and second cylindrical gate electrodes 152 that do not contact any of the dielectric spacer liners 176 and is laterally surrounded, i.e., encircled, by a respective one of the drain-select-level gate electrodes 146. In one embodiment, each of the cylindrical gate electrodes 152 comprises a doped semiconductor material, and each of the drain-select-level gate electrodes 146 comprises at least one metallic material. Thus, the sacrificial template structures (151, 153) are replaced with drain-select-level gate electrodes 146. The drain-select-level gate electrodes 146 are formed directly on portions of a top surface of the planar insulating spacer layer 71.

Figure 28A:
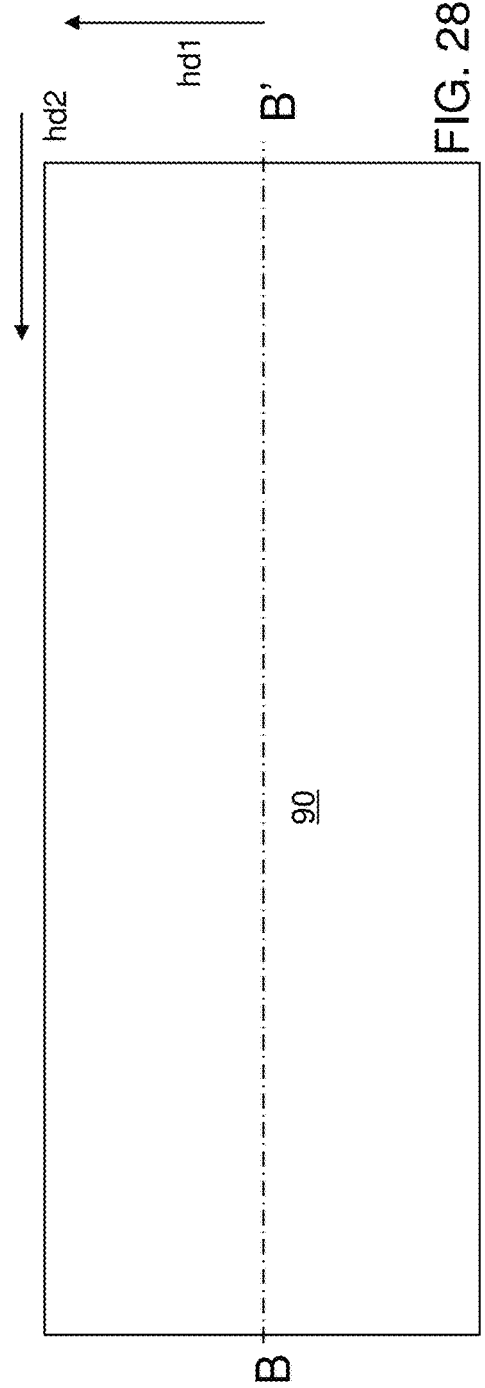
FIG. 28A is a top-down view of a region of the exemplary structure after formation of a dielectric cap layer according to an embodiment of the present disclosure.
Figure 28B:
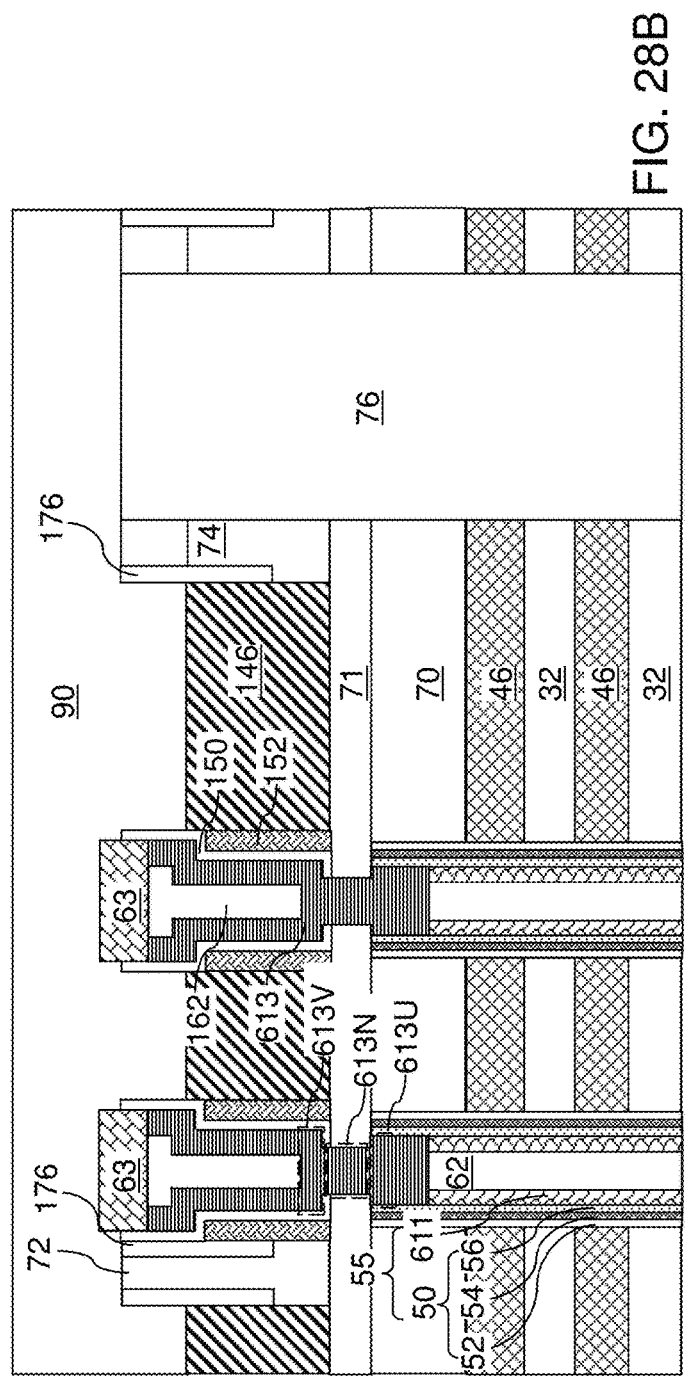
FIG. 28B is a vertical cross-sectional view along the vertical plane B-B' of FIG. 28A.

Referring to FIGS. 28A and 28B, a dielectric material such as silicon oxide or organosilicate glass can be deposited over the drain-select-level gate electrodes 146 the dielectric isolation structures 72 and a dielectric matrix structure 73 to form a dielectric cap layer 90. For example, plasma enhanced chemical vapor deposition (PECVD) or atmospheric pressure chemical vapor deposition (APCVD) can be employed to deposit the dielectric material.

Figure 29A:
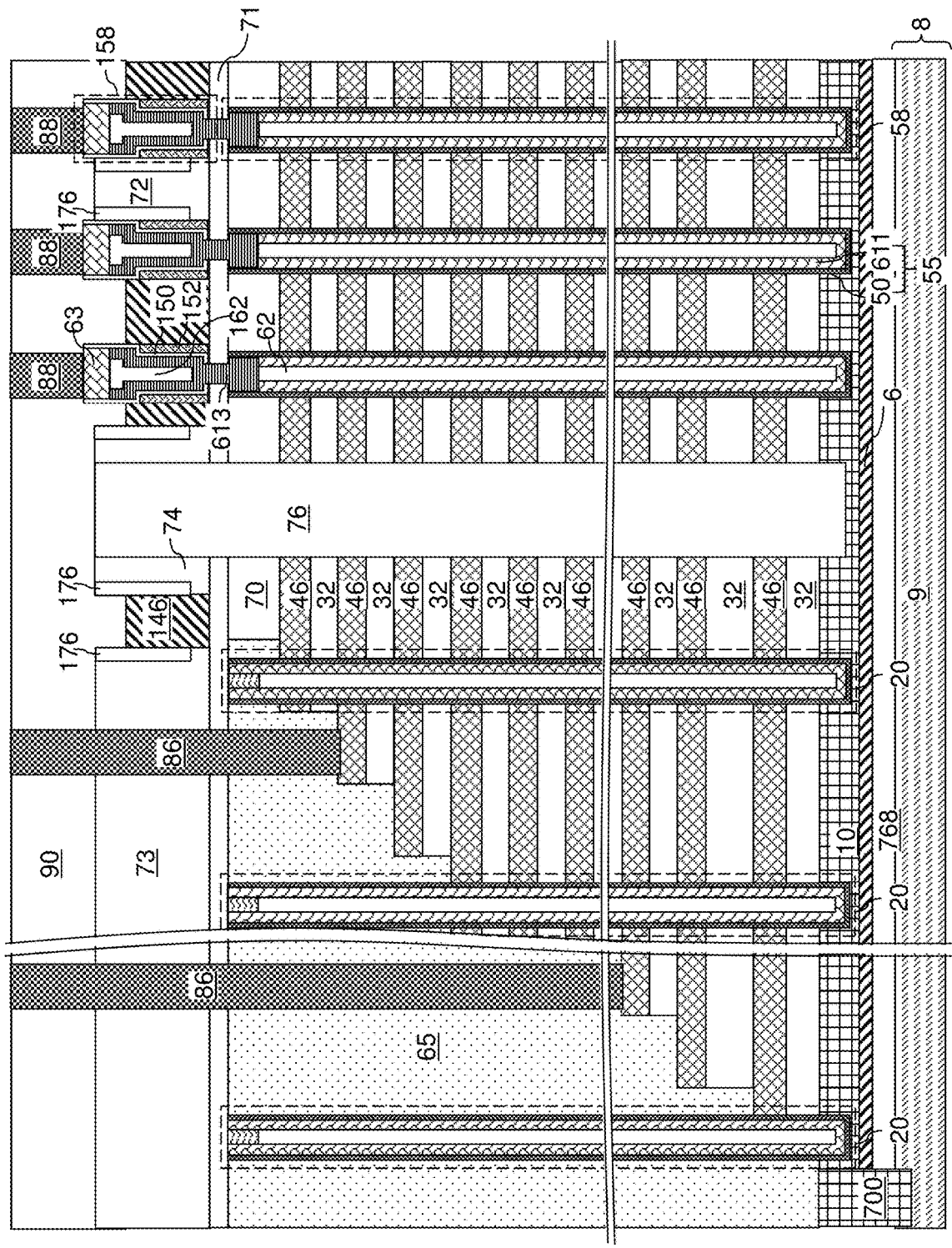
FIG. 29A is a top-down view of the exemplary structure after formation of various contact via structures according to an embodiment of the present disclosure.
Figure 29B:
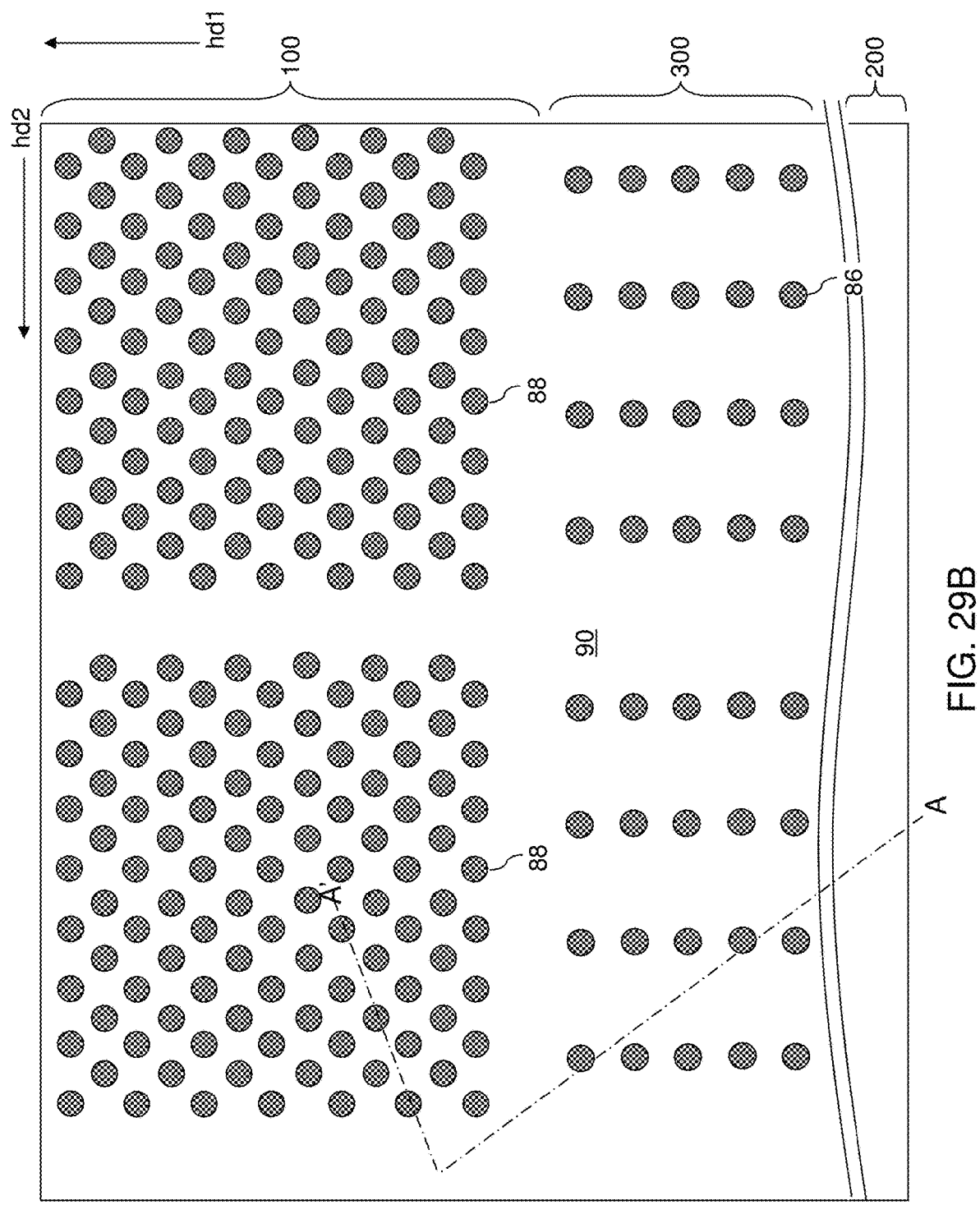
FIG. 29B is a top-down view of the exemplary structure of FIG. 29A. The hinged vertical cross-sectional plane A-A' is the plane of the vertical cross-sectional view of FIG. 29A.

Referring to FIGS. 29A and 29B, drain contact via structures 88 and conductive layer contact via structures 86 can be formed through the dielectric cap layer 90. The drain contact via structures 88 can be formed on a respective one of the drain regions 63. The conductive layer contact via structures 86 can be formed on a respective one of the electrically conductive layers (e.g., word lines) 46 within the contact region 300 containing the stepped surfaces. Additional metal contact structures can be formed to provide electrical wiring among the various nodes of the exemplary device.

Referring to all drawings and according to various embodiments of the present disclosure, a three-dimensional memory device is provided, which comprises: an alternating stack of insulating layers 32 and electrically conductive layers 46 located over a substrate 8; memory openings 49 vertically extending through the alternating stack (32, 46); memory opening fill structures 58 located in the memory openings 49 and including a respective memory-level semiconductor channel 611 and a respective memory film 50; drain-select-level gate electrodes 146 overlying the alternating stack (32, 46) and laterally spaced apart from each other; drain-select-level pillar structures 158 extending through a respective one of the drain-select-level gate electrodes 146 and including a respective drain-select-level semiconductor channel 613 that is electrically connected to and optionally physically contacts an underlying one of the memory-level semiconductor channels 611; and a planar insulating spacer layer 71 having a homogeneous composition throughout and directly contacting top surfaces of the memory films 50 and bottom surfaces of the drain-select-level gate electrodes 146.

In one non-limiting embodiment, a metal oxide (e.g., aluminum oxide) etch stop layer can be omitted by providing the planar insulating spacer layer 71 which directly contacts top surfaces of the memory films 50 and bottom surfaces of the drain-select-level gate electrodes 146. This simplifies the etching and reduces the number of processing steps. Furthermore, by employing only an insulating cap layer 70 and the planar insulating spacer 71 as intermediate dielectric layers between a topmost electrically conductive layer 46 (e.g., word lines) and the drain-select-level gate electrodes 146, a vertical separation distance between the topmost electrically conductive layer 46 (e.g., word lines) and the drain-select-level gate electrodes 146 can be minimized. Channel current can be thereby increased.

In one embodiment, the planar insulating spacer layer 71 consists essentially of a silicon-oxide based dielectric material such doped silicate glass, undoped silicate glass, or organosilicate glass. In one embodiment, each of the drain-select-level semiconductor channels 613 includes a sidewall that contacts the planar insulating spacer layer 71 and contacts a respective one of the memory-level semiconductor channels 611 (e.g., in the embodiment where the channels 613 include the remaining parts of the sacrificial material portions 612).

In one embodiment, the three-dimensional memory device comprises cylindrical gate electrodes 152 that laterally surround a respective one of the drain-select-level semiconductor channels 613 and contact a respective one of the drain-select-level gate electrodes 146. In one embodiment, the three-dimensional memory device comprises dielectric isolation structures (72, 74) located between laterally neighboring pairs of drain-select-level gate electrodes 146 among the drain-select-level gate electrodes 146 and contacting portions of a top surface of the planar insulating spacer layer 71.

In one embodiment, dielectric spacer liners 176 laterally surround a respective one of the dielectric isolation structures (72, 74). A horizontal plane including bottom surfaces of the dielectric spacer liners 176 is located above a horizontal plane including bottom surface of the drain-select-level gate electrodes 146. In one embodiment, the drain-select-level semiconductor channels 613 are laterally surrounded by a respective one of gate dielectrics 150; a first subset of the gate dielectrics 150 contacts a respective one of the dielectric spacer liners 176; and a second subset of the gate dielectrics 150 is laterally spaced from the dielectric spacer liners 176 by a respective one of the drain-select-level gate electrodes 146.

In one embodiment, each of the gate dielectrics 150 is laterally surrounded by a cylindrical gate electrode 152 that contacts a respective one of the drain-select-level gate electrodes 146. In one embodiment, each of the gate dielectrics 150 contacts an annular top surface of an underlying one of the cylindrical gate electrodes 152 and has a cylindrical outer sidewall that is vertically coincident with a cylindrical outer sidewall of the underlying one of the cylindrical gate electrodes 152.

In one embodiment, one of the dielectric isolation structures 72 comprises a pair of sidewalls; and each sidewall within the pair of sidewalls includes an alternating sequence of planar vertical sidewall segments and concave cylindrical sidewall segments, wherein the planar vertical sidewall segments of each sidewall is located within a respective planar vertical plane.

In one embodiment shown in FIG. 28B, each of the drain-select-level semiconductor channels 613 includes a neck portion 613N laterally surrounded by the planar insulating spacer layer 71, wherein the neck portion 613N has a lateral extent (i.e., width in the horizontal direction) that is less than a lateral extent of an overlying portion 613V of a respective the drain-select-level semiconductor channel 613 and is less than a lateral extent of an underlying portion 613U of the respective drain-select-level semiconductor channel 613 (e.g., in the embodiment where the channel 613 includes the remaining part of the sacrificial material portion 612).

In one embodiment shown in FIG. 28B, each of the memory films 50 comprises a layer stack including a blocking dielectric layer 52, a charge storage layer 54, and a tunneling dielectric layer 56 that contacts a respective one of the memory-level semiconductor channels 611 and a respective one of the drain-select-level semiconductor channels 613 (e.g., in the embodiment where the channels 613 include the remaining parts of the sacrificial material portion 612).

The exemplary structure can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate 8 can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate 8, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (611, 613), wherein at least one end portion of each of the plurality of semiconductor channels (611, 613) extends substantially perpendicular to a top surface of the substrate 8 and comprising a respective one of the memory-level semiconductor channels 611; and a plurality of charge storage elements (as embodied as portions of the memory films 50, i.e., portions of the charge storage layer 54). Each charge storage element can be located adjacent to a respective one of the plurality of semiconductor channels (611, 613).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise.

Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate;
memory openings vertically extending through the alternating stack;
memory opening fill structures located in the memory openings and including a respective memory-level semiconductor channel and a respective memory film;
drain-select-level gate electrodes overlying the alternating stack and laterally spaced apart from each other;
drain-select-level pillar structures extending through a respective one of the drain-select-level gate electrodes and including a respective drain-select-level semiconductor channel that is electrically connected to an underlying one of the memory-level semiconductor channels; and
a planar insulating spacer layer having a homogeneous composition throughout and directly contacting top surfaces of the memory films and bottom surfaces of the drain-select-level gate electrodes.

2. The three-dimensional memory device of claim 1, wherein the planar insulating spacer layer consists essentially of a silicon-oxide based dielectric material.

3. The three-dimensional memory device of claim 1, wherein each of the drain-select-level semiconductor channels includes a sidewall that contacts the planar insulating spacer layer and contacts a respective one of the memory-level semiconductor channels.

4. The three-dimensional memory device of claim 1, further comprising cylindrical gate electrodes that laterally surround a respective one of the drain-select-level semiconductor channels and contact a respective one of the drain-select-level gate electrodes.

5. The three-dimensional memory device of claim 1, further comprising dielectric isolation structures located between laterally neighboring pairs of drain-select-level gate electrodes among the drain-select-level gate electrodes and contacting portions of a top surface of the planar insulating spacer layer.

6. The three-dimensional memory device of claim 5, further comprising dielectric spacer liners laterally surrounding a respective one of the dielectric isolation structures, wherein a horizontal plane including bottom surfaces of the dielectric spacer liners is located above a horizontal plane including bottom surface of the drain-select-level gate electrodes.

7. The three-dimensional memory device of claim 6, wherein:
the drain-select-level semiconductor channels are laterally surrounded by a respective one of gate dielectrics;
a first subset of the gate dielectrics contacts a respective one of the dielectric spacer liners; and
a second subset of the gate dielectrics is laterally spaced from the dielectric spacer liners by a respective one of the drain-select-level gate electrodes.

8. The three-dimensional memory device of claim 7, wherein each of the gate dielectrics is laterally surrounded by a cylindrical gate electrode that contacts a respective one of the drain-select-level gate electrodes.

9. The three-dimensional memory device of claim 8, wherein each of the gate dielectrics contacts an annular top surface of an underlying one of the cylindrical gate electrodes and has a cylindrical outer sidewall that is vertically coincident with a cylindrical outer sidewall of the underlying one of the cylindrical gate electrodes.

10. The three-dimensional memory device of claim 5, wherein:
one of the dielectric isolation structures comprises a pair of sidewalls; and
each sidewall within the pair of sidewalls includes an alternating sequence of planar vertical sidewall segments and concave cylindrical sidewall segments, wherein the planar vertical sidewall segments of each sidewall is located within a respective planar vertical plane.

11. The three-dimensional memory device of claim 1, wherein each of the drain-select-level semiconductor channels includes a neck portion laterally surrounded by the planar insulating spacer layer, wherein the neck portion has a lateral extent that is less than a lateral extent of an overlying portion of a respective the drain-select-level semiconductor channel and is less than a lateral extent of an underlying portion of the respective drain-select-level semiconductor channel.

12. The three-dimensional memory device of claim 1, wherein each of the memory films comprises a layer stack including a blocking dielectric layer, a charge storage layer, and a tunneling dielectric layer that contacts a respective one of the memory-level semiconductor channels and a respective one of the drain-select-level semiconductor channels.

* * * * *